United States Patent
Obayashi

(10) Patent No.: US 8,558,343 B2
(45) Date of Patent: Oct. 15, 2013

(54) SEMICONDUCTOR DEVICE HAVING A FUSE ELEMENT

(75) Inventor: Shigeki Obayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 341 days.

(21) Appl. No.: 12/718,593

(22) Filed: Mar. 5, 2010

(65) Prior Publication Data

US 2010/0230780 A1    Sep. 16, 2010

(30) Foreign Application Priority Data

Mar. 10, 2009    (JP) ................. 2009-056761

(51) Int. Cl.
*H01L 23/52*    (2006.01)

(52) U.S. Cl.
USPC .................. 257/529; 257/E23.149

(58) Field of Classification Search
USPC .......................... 257/529, E23.149
See application file for complete search history.

(56) References Cited

U.S. PATENT DOCUMENTS

2007/0210414 A1*   9/2007   Iwamoto et al. ............. 257/529
2007/0280012 A1   12/2007   Obayashi et al.

FOREIGN PATENT DOCUMENTS

JP    2007-317882    12/2007

* cited by examiner

*Primary Examiner* — Daniel Luke
(74) *Attorney, Agent, or Firm* — McDermott Will & Emery LLP

(57) ABSTRACT

The present invention provides a semiconductor device realizing reliable cutting of a fuse without enlarging layout area of a fuse element and the reduced number of wiring layers of a preventing wall that prevents diffusion of fuse copper atoms. A fuse is formed by using a wire in a metal wiring layer as an upper layer in a plurality of metal wiring layers. Wires are disposed just above and just below a fuse each with a gap of at least two wiring layers. In an upper layer, a power wire that transmits power supply voltage is used as a part covering a preventing wall structure just above the fuse.

10 Claims, 59 Drawing Sheets

SEMICONDUCTOR DEVICE HAVING A FUSE ELEMENT

CROSS-REFERENCE TO RELATED APPLICATIONS

The disclosure of Japanese Patent Application No. 2009-56761 filed on Mar. 10, 2009 including the specification, drawings and abstract is incorporated herein by reference in its entirety.

BACKGROUND OF THE INVENTION

The present invention relates to a semiconductor device and, particularly, to a semiconductor device having a fuse program circuit including a fuse element that stores fixed information. More specifically, the invention relates to a configuration for realizing a fuse program circuit capable of reliably cutting a fuse element with low power consumption and smaller occupation area and performing a cut state determination.

In a semiconductor integrated circuit device (semiconductor device), a fuse program circuit is used for various applications. A state of an output signal of the fuse program circuit is fixedly set according to whether a fuse element is cut or not. For example, to finely adjust the constant of an analog circuit (trimming), such a fuse element is used. Concretely, the fuse element is programmed (cut or not) in order to perform adjustment of current drive force of a transistor element, adjustment of a supply current amount of a reference current source, and/or adjustment of a reference voltage level generated by a reference voltage supply. Such a fuse program circuit is used also for finely adjusting a resistance value of a resistive element.

Adjustment similar to such adjustment of an analog value is also performed in a digital circuit. In a semiconductor memory, it is necessary to program an address for specifying a defective cell in order to replace a defective cell with a redundant cell. To store such an address, a fuse program circuit is used. By using such a fuse program circuit, optimization of the circuit operation characteristics is realized regardless of an analog circuit and a digital circuit, and the yield is improved by repairing a defective cell in a semiconductor memory.

The configuration of a fuse program circuit including a line cutting type electric fuse element for cutting a fuse element by current in such a fuse program is disclosed in patent document 1 (Japanese Patent Application Laid-Open Publication No. 2007-317882). In the configuration described in the patent document 1, a fuse is formed by using a wire in an upper layer in a multilayer metal wiring layer, and a preventing wall is formed so as to surround the fuse. The fuse is made by a copper (Cu) wire, and occurrence of poor cutting due to diffusion of copper after the cutting is suppressed by a preventing wall structure. Just above a fuse element, a wire configuring a node coupled to a transistor that passes current for cutting the fuse element is disposed. A power supply wire for supplying a power supply voltage is disposed in a layer above the wire configuring the node.

SUMMARY OF THE INVENTION

In the patent document 1, the fuse is surrounded by the so-called preventing wall for preventing diffusion of copper (Cu) atoms. In the case of the configuration, thermal diffusion of copper atoms configuring the fuse can be suppressed by the wall structure. However, the wire configuring the node coupled to the transistor that passing fusing current to the fuse is disposed in the wiring layer disposed above the fuse, and the preventing wall is covered. The power supply wire is formed above the wire for the cover. The distance between the fuse and the preventing wall has to be set longer than the diffusion distance of the copper atoms to prevent occurrence of poor cutting caused by poor insulation due to the copper diffusion. Therefore, in the cover wiring structure, the distance between the two wiring layers has to be set longer, and the number of wiring layers required increases.

If the number of wiring layers in the multilayer metal wire in a semiconductor integrated circuit device (semiconductor device) in which the fuse program circuit is disposed is sufficiently large, there is no problem. However, in the case where the number of wiring layers is limited, the power supply wire in the uppermost layer has to be extended near to a fuse formation region and, after that, the power supply wire of the fuse program circuit has to be disposed to a place above the fuse. Consequently, a problem occurs that wiring resources are consumed more than necessary, and there is still room for improvement in reduction in the wiring resources.

For fuse cutting, a voltage which is the same as the operation power supply voltage of an internal circuit in a semiconductor integrated circuit device is used. Therefore, also in the operation of the internal circuit, the power supply voltage is always supplied to one end of a fuse. Consequently, there is the possibility that when a fuse is in a not-cut state, leak current flows in a transistor for supplying fusing current. A complicated circuit control configuration for suppressing the leak current is required. There is also room for improvement in reduction in the leak current.

Further, the cover provided on the fuse has a structure which covers most of the fuse in plan view. Consequently, the cover is wide and there is a problem such that, at the time of manufacturing a cover is excessively dent by dishing of CMP (Chemical Mechanical Polishing).

As the cover provided above the fuse, one cover is provided for one fuse. Since a plurality of sets of a fuse and a cover exist, a large cover covering the plurality of covers also exists. Due to the existence of the very large cover, in the case of manufacturing the large cover, a problem occurs such that the large cover is excessively dent by the dishing of the CMP.

An object of the present invention is therefore to provide a semiconductor device including a fuse program circuit having small layout area, which can reliably set a fuse to a cut state with a simple circuit configuration.

Another object of the present invention is to provide a semiconductor device capable of easily reducing leak current flowing in a fuse element in a not-cut state.

A semiconductor device according to a first aspect of the present invention has a fuse element formed by using a wire in a metal wiring layer upper than a first metal wiring layer as a lowest layer in a multilayer metal wiring layer. The fuse element includes: a fuse formed by using a copper wire in a specific wiring layer in the upper metal wiring layer; a diffusion preventing wall formed so as to surround the fuse; and a power supply wire disposed above the fuse so as to overlap the fuse in plan view. The power supply voltage is transmitted to the power supply wire. A wire in a wiring layer between the power supply wire and the fuse is disposed in a region other than a region overlapping the fuse in plan view.

A semiconductor device according to a second aspect of the present invention includes: a fuse circuit having a copper electric fuse and a first transistor coupled in series to the copper electric fuse and, when conducted, passing fusing current to the copper electric fuse; a cut control circuit controlling conduction of the first transistor; and a determination circuit determining cut of the electric fuse. The cut control circuit and the determination circuit receive first power supply voltage supplied via a first pad as an operation power supply voltage. The fuse circuit receives, by a fuse circuit power supply node, second power supply voltage supplied via a second pad provided separately from the first pad. The second power supply voltage is set to a ground voltage level in a normal operation mode and set to a voltage level different from that of the first power supply voltage in a cutting mode of cutting the electric fuse, and the first pad receives the first power supply voltage in the normal operation mode and the cutting mode.

By using the power supply wire as a prevention cover wire just above the fuse, the number of wiring layers necessary for a fuse element can be reduced, and the occupation area of the fuse element can be also reduced.

By setting the second power supply voltage to the ground voltage in the normal operation mode, diffusion of copper atoms at the time of cutting a fuse can be prevented, and occurrence of adverse influence on a periphery circuit can be prevented.

DETAILED DESCRIPTION OF THE PREFERRED EMBODIMENTS

First Embodiment

Figure 1:
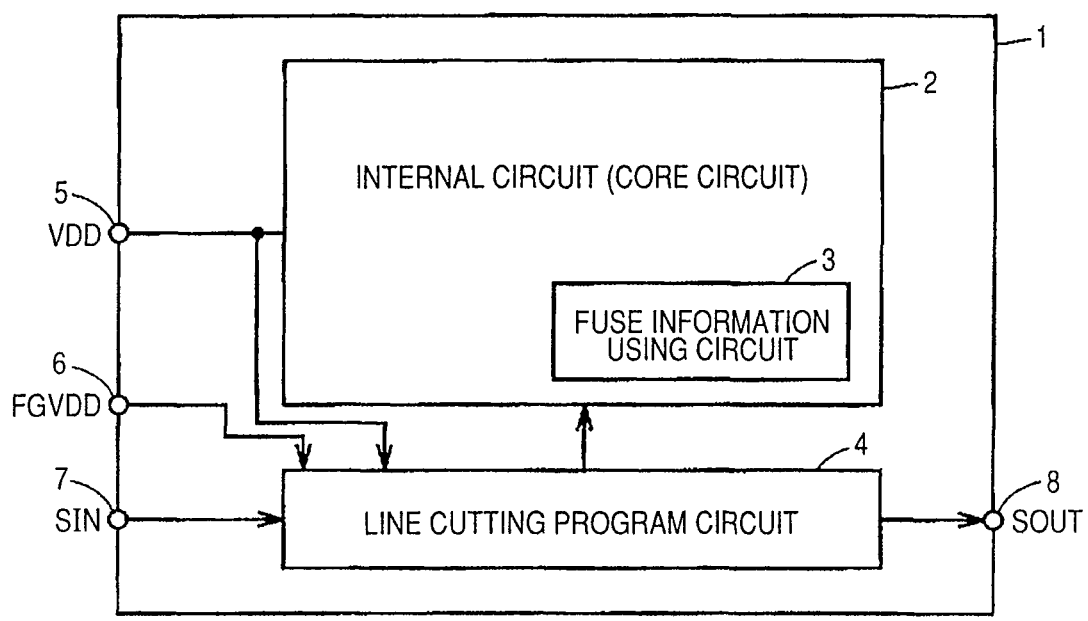
FIG. 1 is a diagram schematically showing the configuration of an entire semiconductor device according to a first embodiment of the present invention.

FIG. 1 is a diagram schematically showing the configuration of an entire semiconductor device according to a first embodiment of the present invention. In FIG. 1, a semiconductor device 1 includes an internal circuit (core circuit) 2 realizing a predetermined function and a line cutting program circuit 4 that fixedly storing information specifying an operation state or an operation mode of the internal circuit 2 (information related to the internal circuit).

The semiconductor device 1 may be formed on a single semiconductor chip or may be integrated on a chip together with a function block of another processor, memory, or the like. The semiconductor device is equivalent to a semiconductor integrated circuit device.

The internal circuit 2 receives a power supply voltage VDD applied from the outside via a power supply node (pad) 5 as an operation power voltage and realizes the predetermined function. The internal circuit 2 is a core circuit of the semiconductor device (semiconductor integrated circuit device) 1 and may be, for example, a memory circuit including a memory cell array or a processing apparatus such as a processor. In the internal circuit 2, it is sufficient to dispose and wire an internal wire by using a multilayer wire made of copper (Cu).

The internal circuit 2 includes a fuse information using circuit 3, and the operation state or operation mode of the fuse information using circuit 3 is specified according to program information (fuse information) sent from the line cutting program circuit 4.

For example, in the case where the internal circuit 2 is a memory circuit, the fuse information using circuit 3 includes a redundancy decoder for repairing a defective cell, and the redundancy decoder selectively performs redundantly replacement in accordance with the information stored in the line cutting program circuit 4 to repair the defective cell. In the fuse information using circuit 3, an analog amount such as a voltage level, a current, a resistance value, or the like generated according to progressive information (fuse information) from the line cutting program circuit 4 may be set.

The line cutting program circuit 4 includes a plurality of fuse elements and fixedly stores information according to whether the fuse elements are cut or not. A fuse in a fuse element FS is formed by a wire Mi in an i-th wire in a multilayer interconnection.

The line cutting program circuit 4 realizes a fuse element by using the same wire as that of the internal circuit and a metal wire in the upper layer in the metal wire (copper (Cu)) wire). The line cutting program circuit 4 receives the power supply voltage VDD from the power supply node 5 and a fuse gate power supply voltage FGVDD applied from the outside via a fuse power supply node (pad) 6. The fuse gate power supply voltage FGVDD is used as a control voltage for passing a current for cutting at the time of a fuse element program. By applying the fuse gate power supply voltage FGVDD from the outside, a cut current amount supplied to a fuse at the time of cutting a fuse is set to an optimum value.

In the line cutting program circuit 4, as will be described later, a plurality of fuse elements are disposed in parallel, and a scan path for selectively programming whether those fuse elements are cut or not is provided. The scan path is provided with a flip flop in correspondence with a fuse element. A serial input SIN from the input node 7 is transferred via the scan path configured by a flip flop sequence, fuse program information is set in the flip flops corresponding to the fuse elements, and storage information of the flip flops is output from the output node 8 as a serial output SOUT. The application of the serial output SOUT will be described later.

Figure 2:
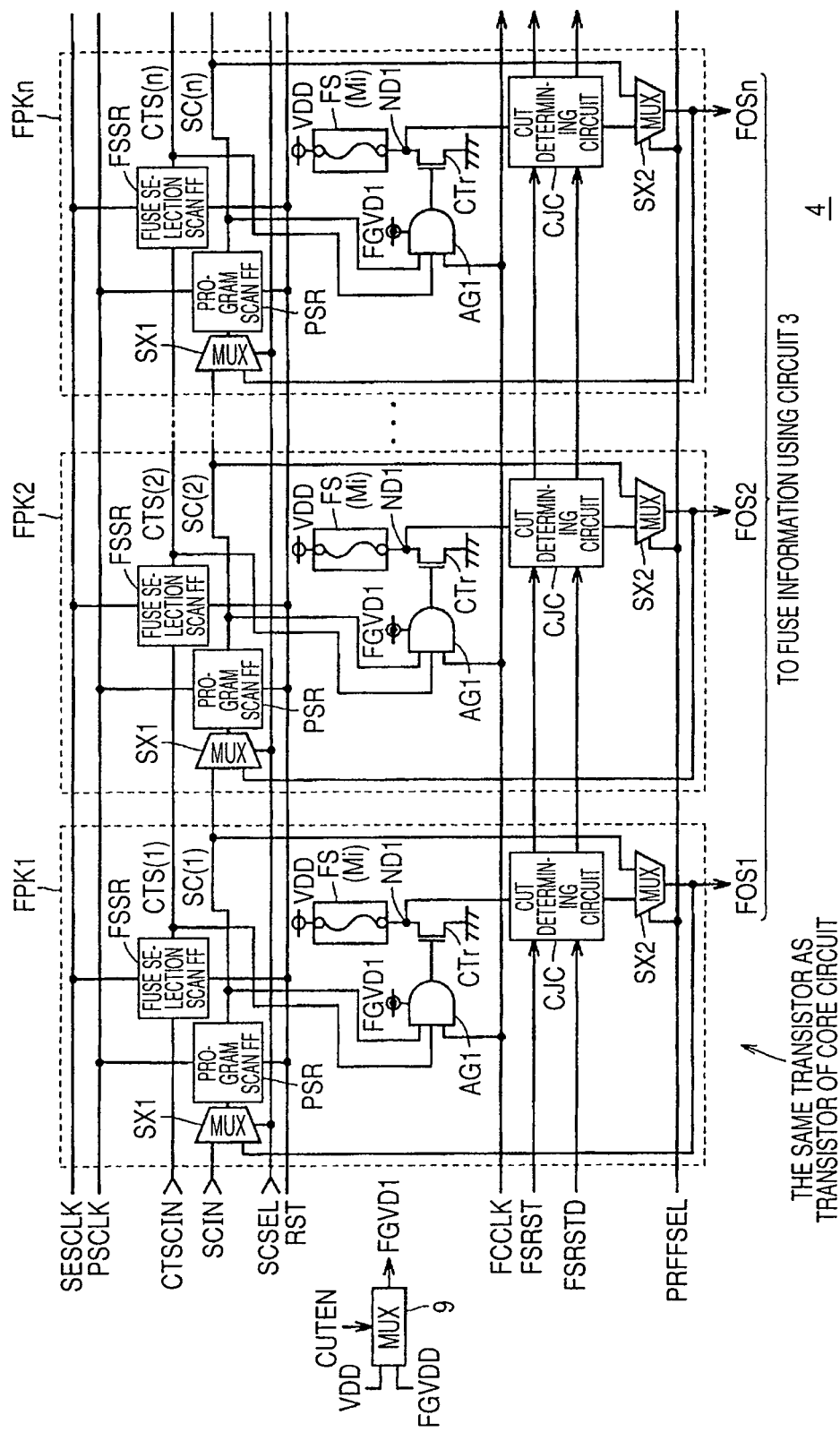
FIG. 2 is a diagram schematically showing the configuration of a line cutting program circuit illustrated in FIG. 1.

FIG. 2 is a diagram showing an example of a concrete configuration of the line cutting program circuit 4. In FIG. 2, the line cutting program circuit 4 includes a plurality of fuse program circuits FPK1 to FPKn each including a fuse circuit, which are cascaded. The number of the fuse program circuits FPK1 to FPKn is arbitrary. Since the fuse program circuits FPK1 to FPKn have the same configuration, in FIG. 2, the same reference numerals are designated to the same or corresponding parts in the fuse program circuits FPK1 to FPKn.

Each of the fuse program circuits FPK2 to FPKn includes a fuse element FS coupled between a node for supplying the power supply voltage (fuse power supply node) and an internal node ND1, a fusing current supply transistor CTr coupled between the internal node ND1 and the ground node, and a 3-input AND circuit AG1 for controlling conduction of the fusing current supply transistor CTr. The AND circuit AG1 receives an internal fuse gate power supply voltage FGVD1 as an operation power supply voltage.

The fuse gate power supply voltage FGVD1 is given from a voltage selection circuit 9 which selects one of the power supply voltage VDD and an external fuse gate power supply voltage FGVDD in accordance with a cut enable signal CUTEN. The cut enable signal CUTEN is activated at the time of cutting the fuse element FS.

Each of the fuse program circuits FPK1 to FPKn is provided with a program scan flip flop (FF) PSR and an FS selection scan flip flop (FF) FSSR. By the flip flops PSR and FSSR, program information that specifies whether the fuse element FS is cut or not is transferred and set.

The AND circuit AG1 receives an output signal of the corresponding FS selection scan flip flop FSSR, an output signal of the corresponding program scan flip flop PSR, and a fuse cut clock signal FCCLK.

The FS selection scan flip flop FSSR fetches output data of the FS selection scan flip flop FSSR of the fuse program circuit of the ante stage in accordance with a fuse selection scan clock signal SESCLK and transfers it to the next stage. The program scan flip flop PSR fetches data given via a multiplexer (MUX) SX1 disposed in an input part in accordance with a program scan clock signal PSCLK and transfers it to the next stage. Therefore, the FS selection scan flip flop FSSR serves as a component of a scan path for transferring data by performing shifting operation in accordance with the fuse selection scan clock signal SESCLK. The program scan flip flop PSR also serves as a component of a scan path for transferring data by sequentially performing shifting operation in accordance with the program scan clock signal PSCLK.

By providing the set of the flip flops FSSR and PSR in correspondence with each fuse circuit (configured by the fuse element FS and the cutting current supply transistor CTr), programming (cut or not-cut process) of the fuse element FS of the fuse circuit can be executed selectively and sequentially on a fuse element unit basis. By using small number of pads, program information of the fuse elements can be transferred to the fuse elements.

Each of the fuse program circuits FPK2 to FPKn further includes: a cut determining circuit CJC that determines a cut state of the fuse element FS in accordance with the voltage level of the node ND1; and a multiplexer SX2 for selecting and outputting one of an output signal of the program scan flip flop PSR and an output signal of the cut determining circuit CJC. An output signal of the multiplexer SX2 is given to the multiplexer SX1 provided in the corresponding same fuse program circuit. The multiplexer SX1 selects one of an output signal of the program scan flip flop PSR on the ante stage and the output signal of the corresponding multiplexer SX2 in accordance with the scan selection signal SCSEL. It is assumed that the expressions "cutting" and "fusing" have the same meaning.

By using the two multiplexers SX1 and SX2 in one fuse program circuit and switching the data transfer path, the following effects can be obtained. An output signal of the multiplexer SX2 is selected by the multiplexer SX1 and transmitted to the program scan flip flop PSR. In test operation, the multiplexer SX2 selects an output signal of the cut determining circuit CJC in accordance with the program flip flop selection signal PREFFSEL. According to the coupling mode, the output signal of the cut determining circuit CJC is transferred via the sequential program scan flip flop PSR, and the state of the corresponding fuse element FS can be read to the outside as a serial output SOUT. By the output, whether the cut of the fuse element FS is bad or not can be determined on the outside.

The multiplexer SX2 selects an output signal of the program scan flip flop PSR, and the multiplexer SX1 selects an output signal of the multiplexer SX2 in accordance with the scan selection signal SCSEL. In the coupling mode, in each of the fuse program circuits FPK1 to FPKn, data retained in the program scan flip flop PSR can be fed back and transferred in a loop state. Therefore, the program scan clock signal PSCLK can be set in a self-propelled state (data retained in the flip flop PSR of each of the fuse program circuits FPK1 to FPKn is maintained), and flexibility of control and design of the clock signal increases (the control related to timings is simplified, and the flexibility related to the timings increases).

From the multiplexer SX2, program information FOS1 to FOSn according to whether the fuse element FS is cut or not is output. An output signal of the multiplexer SX2 is selected by the multiplexer SX1 and stored in the corresponding program scan flip flop PSR. After that, a state of selecting an output signal of the flip flop PSR in the ante stage of the multiplexer SX1 is set and the stored data is sequentially transferred via the sequence of the program scan flip flops PSR. The transfer data is compared with write information by an external tester or a BIST (built-in self test circuit). In such a manner, whether or not the multiplexer SX2 normally performs switching operation in accordance with the program flip flop selection signal PREFSEL can be tested.

The fuse program circuit FPK1 in the first stage has the same configuration as that of the fuse program circuits FPK2 to FPKn in the second and subsequent stages except for the following point. Specifically, to the FS scan flip flop FSSR and the program scan flip flop PSR, in place of the output signal of the fuse program circuit in the ante stage, cut control information CTSCIN and scan input SCIN for the fuse program from the BIST (Built-in self test circuit) is supplied.

The output signals FOS1 to FOSn of the fuse program circuits FPK1 to FPKn are supplied to a circuit that sets the internal state of the corresponding fuse information using circuit 3.

The fuse information using circuit 3 may be a redundant decoder for performing redundant cell replacement in the memory circuit as described above, or a circuit that determines constant of an analog circuit, that is, trims a resistance value of a resistive element in the analog circuit or adjusts the drive current amount of the transistor element or adjusts reference voltage level. Therefore, in the fuse information using circuit 3, it is sufficient to set the operation mode or the operation state in accordance with the program information of the fuse program circuits FPK1 to FPKn. The information stored in the line cutting program circuit may be any information as long as it relates to the internal state of the internal circuit (core circuit) 2.

According to the data stored in the FF selection scan flip flop FSSR, the cycle of cutting the corresponding fuse element FS in each of the fuse program circuits is specified. In the fuse program circuits FPK1 to FPKn, sequentially, fusing current is selectively supplied in accordance with the data stored in the program scan flip flop PSR and the fuse cut clock signal FCCLK, and the fuse element FS is selectively cut in accordance with write information.

To the fuse element FS, in the first embodiment, the power supply voltage VDD from the power supply node to the internal circuit (core circuit) is supplied. In the case of the configuration, the number of pads dedicated to fusing and provided for the fuse program circuits FPK1 to FPKn can be reduced.

The fuse program circuits FPK1 to FPKn use, as a transistor of a control circuit which is not shown in FIG. 2, a transistor having the same structure (the same film thickness and the same material as those of the gate insulating film) as that used in the internal circuit (core circuit) 2 shown in FIG. 1 is used. With the configuration, enlargement in the occupation area of the line cutting program circuit 4 and increase in the manufacturing process are suppressed.

Usually, the current (fusing current) necessary for cutting the fuse element FS is relatively large as 20 mA to 40 mA. However, as will be described later, in the fuse program circuits FPK1 to FPKn, the program (fusing) on the fuse elements is executed selectively and sequentially in accordance with the information stored in the FS selection scan flip flop FSSR, the current consumption can be made small, the power supply can be shared with the internal circuit (core circuit), and the number of pads can be reduced.

To the AND gate AG1, the fuse gate power supply voltage FGVD1 is applied as operation power supply voltage. At the time of fuse cutting, as the fuse gate power supply voltage FGVD1, the fuse gate power supply voltage FGVDD from the outside is selected. In this case, it is simply requested to drive the gate of the fusing current supply transistor CTr. The current consumption of the AND circuit AG1 is small even alternate current (AC) is included. Therefore, also in the case where a number of fuse elements FS are provided, it is just requested to provide one pad (the node 6 in FIG. 1) for supplying the fuse gate power supply voltage FGVDD, and the layout area of the line cutting program circuit 4 can be reduced.

Further, one of the data stored in the program scan flip flop PSR and the output signal of the cut determining circuit CJC is selected and output by using the multiplexer SX2. Therefore, before cutting the fuse element FS, the state of a target circuit (the fuse information using circuit 3) such as a redundancy decoder can be set according to the program information, and a test can be conducted. For example, in a memory circuit or the like, in the case where the target circuit of the fuse information using circuit is the redundant decoder, redundant addresses are sequentially supplied from the outside to select a redundant cell row/column, and a test to see whether the redundant decoder and the redundant cells are normal or not can be conducted. Consequently, when a defect occurs, fusing defect of a fuse element and a defect in a redundant cell can be discriminated from each other.

As the configuration of the scan flip flops PSR and FSSR included in each of the fuse program circuits FPK1 to FPKn shown in FIG. 2, it is sufficient to use latch circuits in two stages repeating a hold state and a through state in accordance with a two-phase clock signal. The configuration may be arbitrary.

Figure 3:
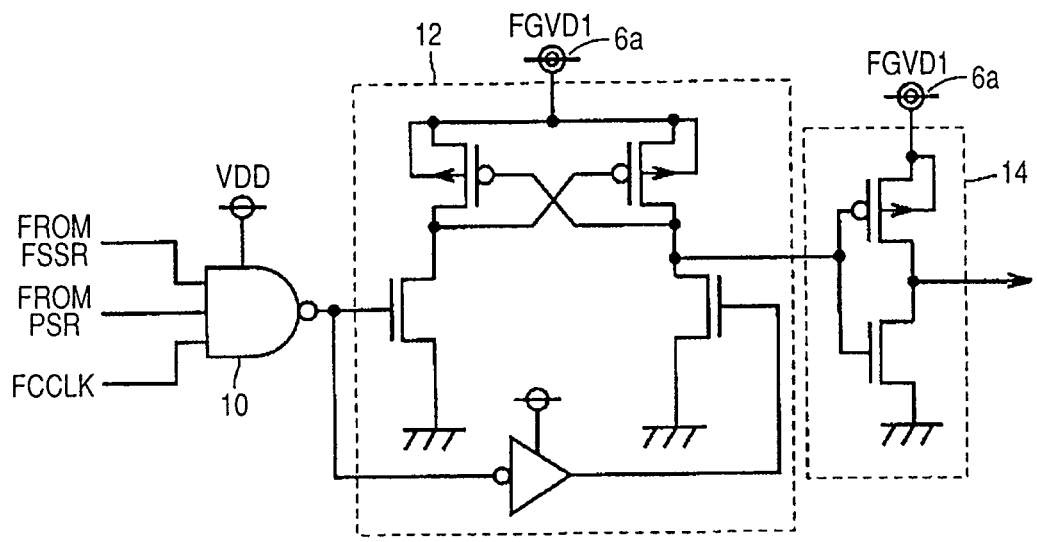
FIG. 3 is a diagram showing an example of the configuration of an AND circuit illustrated in FIG. 1.

FIG. 3 is a diagram showing an example of the configuration of the AND circuit AG1 illustrated in FIG. 2. In FIG. 3, the AND circuit AG1 includes: a 3-input NAND gate 10 receiving the power supply voltage VDD of the internal circuit (core circuit) 2 as the operation power supply voltage; a level shifter 12 for shifting the amplitude of the output signal of the 3-input NAND gate 10 to the level of the internal fuse gate power supply voltage FGVD1 level; and an inverter 14 for inverting an output signal of the level shifter 12. An output signal of the inverter 14 is supplied to the gate of a fusing current supply transistor CT 12r shown in FIG. 2, and the gate voltage of the fusing current supply transistor CTr is controlled.

In the AND circuit AG1, output signals from the program scan flip flop PSR and the FS selection scan flip flop FSSR and the fuse cut clock signal FCCLK are supplied. The amplitude of each of those signals is the level of the power supply voltage VDD of the internal circuit (core circuit). The NAND gate 10 generates a signal of the amplitude of the power supply voltage in accordance with the given signals, and outputs a signal of the L level when all of the input signals are at the H level.

The level shifter 12 and the inverter 14 receive the internal fuse gate power supply voltage FGVD1 as the operation power supply voltage at a power supply node 6a, and convert the amplitude of the output signal of the NAND gate 10 to the level of the internal fuse gate power supply voltage FGVD1.

The level shifter 12 includes cross-linked P-channel MOS transistors and N-channel MOS transistors coupled between the P-channel MOS transistors and the ground node and receiving an output signal of the NAND gate 10 and an inversion signal of the output signal. When the output signal of the NAND gate 10 is at the H level, in the level shifter 12, the output signal to the inverter 14 becomes the H level. Accordingly, a signal of the level of the fuse gate power supply voltage FGVD1 is output from the inverter 14. On the other hand, when the output signal of the NAND gate 10 is at the L level, in the level shifter 12, the output signal to the inverter 14 becomes the L level, and the output signal of the inverter 14 becomes the level of the fuse gate power supply voltage FGVD1.

The inverter 14 inverts an output signal of the level shifter 12 and outputs a signal of a logic value opposite to that of the output signal of the NAND gate 10. Therefore, when all of data from the flip flops FSSR and PSR and the fuse cut clock signal FCCLK are at the H level, the output signal of the inverter 14 becomes the H level, the fusing current supply transistor CTr becomes the on state, and a corresponding fuse element is cut.

The fuse gate power supply nodes 6a of the level shifter 12 and the inverter 14 are coupled to the fuse gate power supply node 6 illustrated in FIG. 1 via the fuse gate voltage selection circuit 9. At the time of cutting a fuse, the fuse gate power supply voltage FGVDD from the outside is selected and transmitted to an internal fuse gate power supply line. Therefore, by adjusting the voltage level of the voltage FGVDD from the fuse gate power supply node 6, the gate voltage of the fusing current supply transistor CTr illustrated in FIG. 2 can be adjusted. Accordingly, the fusing current of the fuse element FS can be adjusted, and the fusing current at the time of programming the fuse element FS can be optimized.

When the signal from the fuse selection scan flip flop FSSR becomes the H level, it is indicated that a corresponding fuse program circuit is selected. According to the H level/L level of the signal from the program scan flip flop FSR, whether the corresponding fuse element is cut or not is set. To be specific, when the signal from the program scan flip flop PSR is at the H level, it is designated to cut the corresponding fuse element.

The fuse cut clock signal FCCLK is given with a predetermined pulse width. Therefore, by adjusting the pulse width of the fuse cut clock signal FCCLK and the number of application times, the current pulse width and the number of application times of the current pulse necessary for cutting the fuse element can be realized.

When the power supply voltage VDD is applied, the fuse gate power supply voltage FGVDD is selected as the internal fuse gate power supply voltage FGVD1. When the internal circuit power supply voltage VDD is stabilized, for example, according to a power-on reset signal, a reset signal RST is generated in the form of a one-shot pulse. When the reset signal RST is activated, the internal nodes of the program scan flip flop PSR and the FS selection scan flip flop FSSR in each of the fuse program circuits FPK1 to FPKn are set to the L level. All of output signals CTS(1) to CTS(n) and SC(1) to SC(n) of the flip flops are fixed to the L level. Accordingly, an output signal from the AND circuit AG1 is initialized to the L level. In this state, the fusing current supply transistor CTr is reliably set to the non-conductive state, and flow of through current via the fuse element FS in the not-cut state can be prevented at the time of power-on.

When the internal circuit power supply voltage VDD is applied, the fuse gate power supply voltage FGVDD is maintained at a voltage level lower than the threshold voltage Vth of the fusing current supply transistor CTr in order to obtain the following effects. When the fuse gate power supply voltage FGVDD becomes a voltage level higher than the threshold voltage Vth of the fusing current supply transistor CTr at the time of power on, there is the possibility that an output signal of the AND circuit AG1 becomes the H level in an unstable state and the fusing current supply transistor CTr is made conductive. In a fuse element in the not-cut state, by setting the gate voltage of the fusing current supply transistor CTr to a voltage level lower than the threshold voltage Vth, large through current can be prevented from flowing via the fuse element in the not-cut state and the fusing current supply transistor.

There is a case where, in the level shifter 12, the voltage level of the internal node becomes an intermediate voltage level according to an output signal of the unstable NAND gate 10. In this case, by maintaining the fuse gate power supply voltage FGVDD to a voltage level lower than the threshold voltage Vth of the fusing current supply transistor CTr, an output of the inverter 14 can be maintained at a voltage level lower than the threshold voltage Vth of the fusing current supply transistor CTr. Consequently, the fusing current supply transistor CTr can be prevented from becoming conductive.

Therefore, at the time of power on, until the reset signal RST is activated, the fuse gate power supply voltage FGVDD is set to a voltage level (for example, the ground voltage level) lower than the threshold voltage Vth of the fusing current supply transistor CTr, thereby preventing flow of large current from the power supply node to the ground node.

The fuse gate power supply voltage FGVDD and the internal circuit power supply voltage VDD are given from the outside of the semiconductor device (semiconductor integrated circuit device) as illustrated in FIG. 1. Therefore, in an external power supply controller, the reset signal RST is generated by using the power on reset signal at the start of supply of the power supply voltage VDD, the inside of the line cutting program circuit 4 is initialized and, after that, the fuse gate power supply voltage FGVDD is supplied (its voltage level is increased). As the power supply control, it is sufficient to control a power supply sequence by a sequence controller such as a processor.

Figure 4:
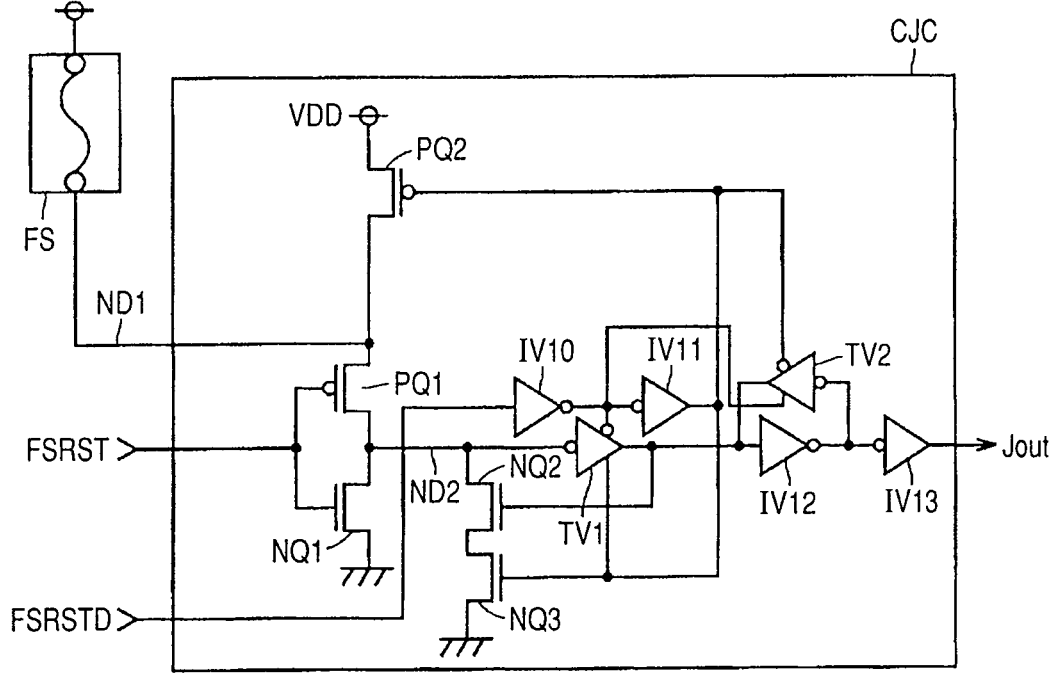
FIG. 4 is a diagram showing an example of the configuration of a cut determining circuit illustrated in FIG. 2.

FIG. 4 is a diagram showing an example of the configuration of the cut determining circuit CJC shown in FIG. 2. In FIG. 4, the cut determining circuit CJC includes: a P-channel MOS transistor PQ1 and an N-channel MOS transistor NQ1 configuring an inverter for inverting a fuse element reset signal FSRST; N-channel MOS transistors NQ2 and NQ3 coupled in series between a node ND2 and the ground node; and a P-channel MOS transistor PQ2 coupled between the power supply node VDD and the node ND1.

The node ND1 is coupled at one end of the fuse element FS, and the other end of the fuse element FS is coupled to the power supply node supplying the power supply voltage VDD. The node and its voltage are expressed by the same reference numeral. The cut determining circuit CJC includes: cascaded two inverters IV10 and IV11 receiving a fuse element reset delay signal FSRSTD; a tristate inverter TV1 for inverting a signal on the node ND 2 at the time of activation; cascaded two inverters IV12 and IV13 receiving an output signal of the tristate inverter TV1; and a tristate inverter TV2 coupled in parallel with the inverter IV12 in the opposite direction.

The tristate inverter TV1 is activated when output signals of the inverters IV10 and IV11 are at the L level and the H level, respectively, and inverts the signal on the node ND2. The tristate inverter TV2 is activated complementary to the tristate inverter TV1, inverts the output signal of the inverter IV12, and transmits the signal to the input of the inverter IV12. That is, the tristate inverter TV2 which is activated and the inverter IV12 form a latch circuit.

The N-channel MOS transistor NQ2 receives an output signal of the tristate inverter TV1 by its gate, and the MOS transistor NQ3 receives an output signal of the inverter IV11 by its gate. The P-channel MOS transistor PQ2 receives an output signal of the inverter IV11 by its gate. From the inverter IV13, a cut determination result instruction signal Jout from the cut determining circuit CJC is output.

Figure 5:
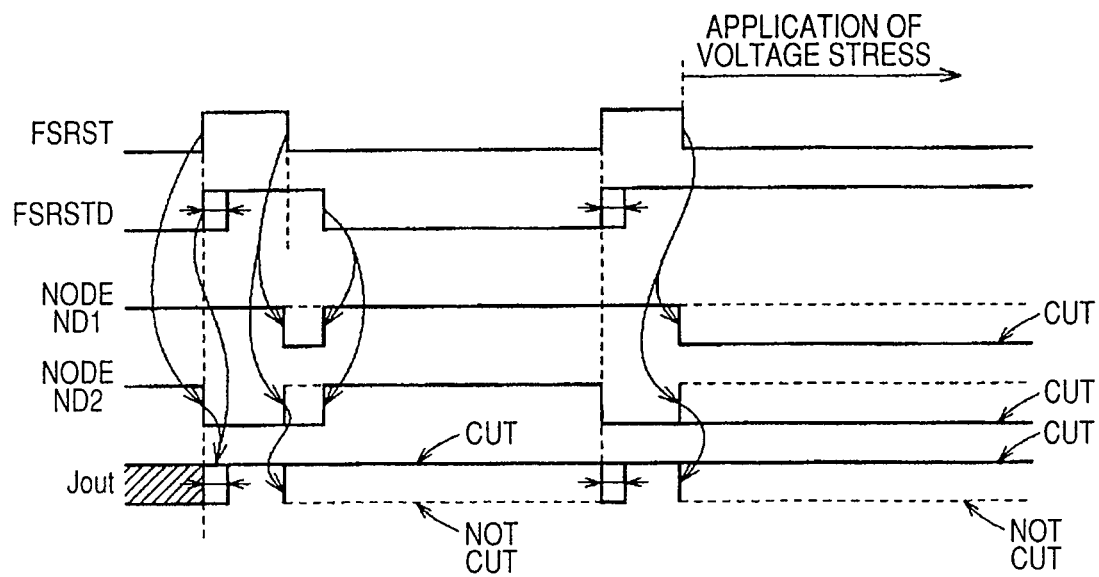
FIG. 5 is a timing chart showing operation of the cut determining circuit illustrated in FIG. 4.

FIG. 5 is a signal waveform chart showing the operation of the cut determining circuit CJC illustrated in FIG. 4. In the following, referring to FIG. 5, the operation of the cut determining circuit CJC illustrated in FIG. 4 will be described.

When both of the fuse element reset signal FSRST and the fuse element reset delay signal FSRSTD are at the L level, the node ND2 is electrically coupled to the node ND1 via the MOS transistor PQ1. On the other hand, the output signal of the inverter IV10 is at the H level, and the output signal of the inverter IV11 is at the L level. It is assumed that the power supply voltage VDD is in a stable state.

Accordingly, the MOS transistor PQ2 is in a conductive state, and the node ND1 is electrically coupled to the power supply node. On the other hand, the MOS transistor NQ3 is in the non-conductive state, and the node ND2 is isolated from the ground node. Therefore, the node ND2 is also charged to the power supply voltage VDD level via the MOS transistor PQ1. The output signal of the inverter IV10 is at the H level, the tristate inverter TV1 is in an output high-impedance state, and the state of the determination result output signal Jout does not change.

When the fuse element reset signal FSRST is set to the H level, the MOS transistor PQ1 becomes non-conductive. On the other hand, the MOS transistor NQ1 becomes conductive, and the node ND2 is driven to the ground voltage level. In this state, since the MOS transistor PQ1 is in the non-conductive state, the nodes ND1 and ND2 are electrically isolated from each other.

The fuse element reset delay signal FSRSTD rises to the H level simultaneously with or behind the fuse element reset signal FSRST, and output signals of the inverters IV10 and IV11 are driven to the L level and the H level, respectively. Accordingly, the MOS transistor PQ2 becomes non-conductive and, on the other hand, the MOS transistor NQ3 becomes conductive. The tristate inverter TV1 is activated, an output signal of the tristate inverter TV1 becomes the H level according to the ground voltage level on the node ND2, and the MOS transistor NQ2 becomes conductive. Consequently, a latch circuit is formed by the tristate inverter TV1 and the MOS transistors NQ2 and NQ3, and the node ND2 is maintained at the ground voltage level.

By the above process, the internal node ND2 is initialized, and the determination result output signal Jout becomes the H level.

After completion of the initialization, the fuse element reset signal FSRST is driven to the L level. At this time, the fuse element reset delay signal FSRSTD is still at the H level. In this state, the MOS transistor NQ1 is in the non-conductive state, the MOS transistor PQ1 is in the conductive state, and the nodes ND1 and ND2 are electrically coupled. When the fuse element FS is in a not-cut state, the current driving force of the fuse element FS is larger than that of the MOS transistors NQ2 and NQ3, the voltage level at the node ND2 rises, accordingly, an output signal of the tristate inverter TV1 becomes the L level, the MOS transistor NQ2 becomes non-conductive, and the node ND2 is driven to the power supply voltage VDD level.

On the other hand, when the fuse element FS is in a cut state, the node ND1 is discharged via the MOS transistors PQ1, NQ2, and NQ3, and the voltage level at the node ND1 is maintained at the ground voltage level. The node ND2 is maintained at the L level by the tristate inverter TV1 and the MOS transistors NQ2 and NQ3 and, accordingly, the determination result signal Jout is also maintained at the H level.

Next, when the fuse element reset delay signal FSRSTD becomes the L level, output signals of the inverters IV10 and IV11 become the H level and the L level, the tristate inverter TV1 enters an output high-impedance state, the MOS transistor PQ2 becomes conductive, and the MOS transistor NQ3 becomes non-conductive. Accordingly, the nodes ND1 and ND2 are precharged to the power supply voltage VDD level again by the MOS transistors PQ2 and PQ1. At this time, the tristate inverter TV1 is in the output high-impedance state, the node ND2 and the inverters IV12 and IV13 are isolated, and the determination result output signal Jout is maintained in the immediately preceding state. That is, when the fuse element FS is in the cut state, the determination result output signal Jout is maintained at the H level. When the fuse element FS is in the not-cut state, the determination result output signal Jout is maintained at the L level.

As a result, after the initialization, according to the program state of the fuse element FS in the fuse program circuit, the output signal Jout from the cut determining circuit CJC can be set to a logic level according to the program information (state of the fuse element).

In a test mode, the internal node is initialized according to the reset signals FSRST and FSRSTD. After that, the fuse element reset delay signal FSRSTD is maintained at the H level and only the reset signal FSRST is driven to the L level. In this state, the nodes ND1 and ND2 are maintained at the L level or H level according to whether the fuse element FS is cut or not. Similarly, since the tristate inverter TV1 is in an active state, the determination result output signal Jout is also set to the logic level according to whether the fuse element FS is cut or not.

In the test operation, when the fuse element FS is in the not-cut state, the node ND1 is maintained at the power supply voltage VDD level by the fuse element FS. In this case, similarly, the node ND2 is maintained at the power supply voltage VDD level. However, the MOS transistor NQ3 is in a non-conductive state according to the fuse element reset delay signal FSRSTD, and the current path from the power supply node to the ground node via the fuse element FS is blocked. Therefore, to the fuse element FS in the not-cut state, stress of the bias voltage VDD is not applied.

On the other hand, in the case where the fuse element FS is in the cut state, all of the MOS transistors PQ1, NQ2, and NQ3 are conductive, so that the node ND1 becomes the ground voltage level. Therefore, in the case where the fuse element FS is in the cut state, bias voltage is applied across both ends of the fuse element FS, and the bias voltage is applied to pieces (FS pieces) of the fuse element or fuse wires in a high-resistance state. According to the application voltage, copper (Cu) atoms migrate by the electromigration phenomenon. As a result, the fuse element in a high resistance state moves to a low resistance state.

Figure 6:
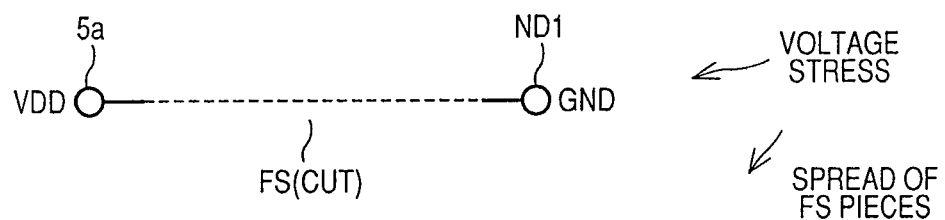
FIG. 6 is a diagram showing a voltage applied to both ends of a fuse element when voltage stress is applied.

FIG. 6 is a diagram schematically showing a state of the fuse element in the cut state. In FIG. 6, stress of the voltage VDD is applied between a fuse element power supply node 5a (which is coupled to the power supply node 5) and the node ND1. When the fuse element FS is a copper wire, copper atoms in the wire in the cut pieces (FS pieces) or in the wire in the high resistance state migrate in the insulating film in accordance with the voltage application. By the copper atoms migrating in the insulating film, dielectric breakdown in the insulating film occurs, and the fuse program circuit becomes defective due to inter-wire short-circuit or the like. There is also the possibility that the resistance value of the fuse element which is in the high resistance state and determined in the cut state decreases, and the program state inverts.

Therefore, by applying the voltage stress, the life in the case of using the copper wire as the fuse element FS can be measured. The voltage stress is not applied to a fuse element in the not-cut state, and the path in which current flows does not exist. Therefore, when the voltage stress is applied, regardless of whether the fuse element FS is cut or not, the path in which current flows is blocked, and the life of the fuse element in the cut state can be measured.

It is sufficient to set the trailing timing of the fuse element reset delay signal FSRSTD so that a period in which the voltage levels of the nodes ND1 and ND2 are set according to whether the fuse element FS is cut or not is assured. The trailing timing may be the same as or behind that of the fuse element reset signal FSRST.

Figure 7:
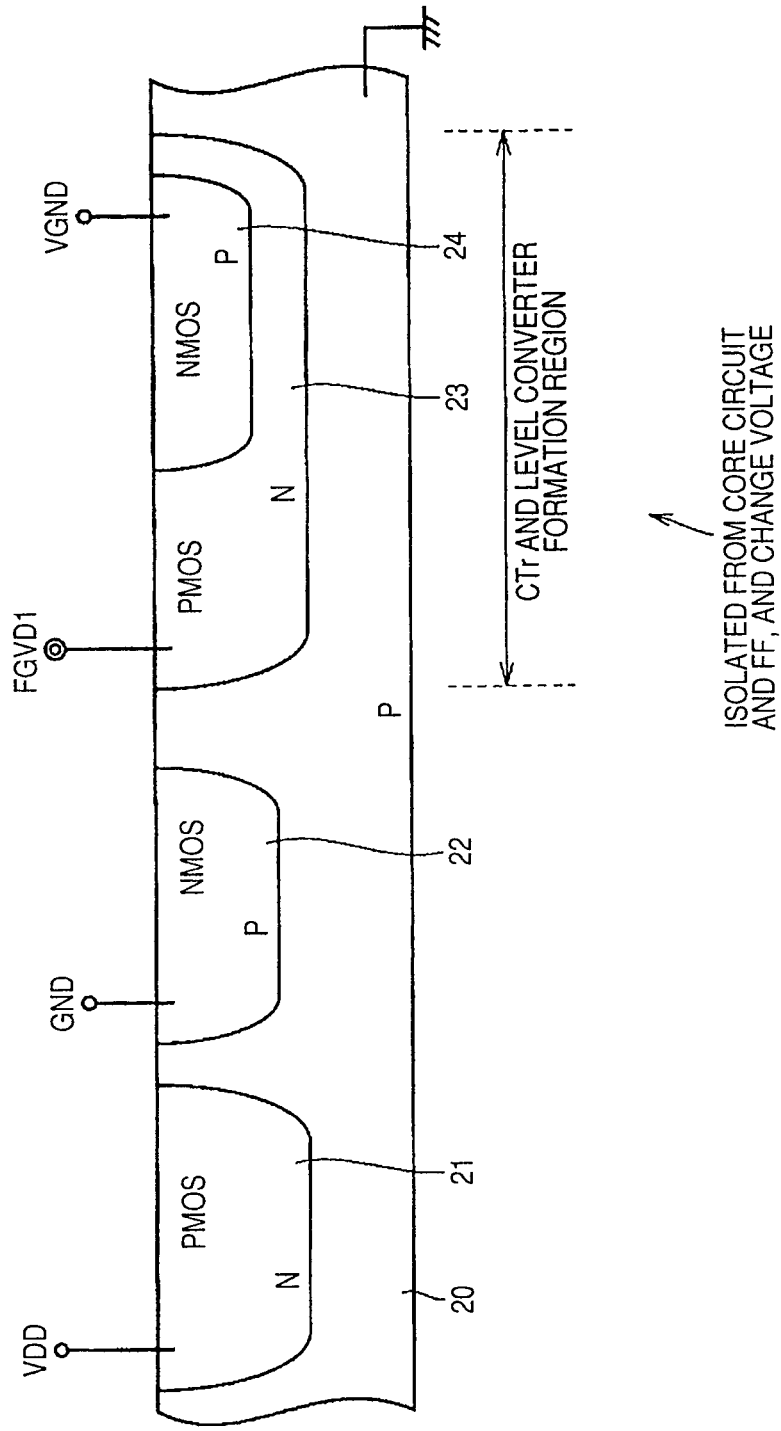
FIG. 7 is a diagram schematically showing a sectional structure of an AND circuit formation region illustrated in FIG. 2.

FIG. 7 is a diagram schematically showing the structure of transistor disposition regions below the fuse element in the fuse program circuit. The fuse element is formed by, as will be described in detail later, using a metal wire (Mi) in an upper layer in a multilayer interconnection structure. Therefore, in the part below the fuse element, free regions are formed. In the free regions, the transistor of the fuse circuit is disposed, and transistor of other related circuits are disposed.

In FIG. 7, in the region below the fuse element of the fuse program circuit, an N well 21, a P well 22, and an N well 23 are formed at intervals in the surface of a substrate region 20. In the N well 23, a P well 24 is further formed in the surface. In the N wells 21 and 23, P-channel MOS transistors (PMOS) are formed. In the P wells 22 and 24, N-channel MOS transistors (NMOS) are formed.

In the region of the triple well structure in which the N well 23 and the P well 24 are formed in the surface of the P-type substrate region 20, the fusing current supply transistor CTr and the level shifter (including an inverter buffer) are formed. In the N well 21 and the P well 22, components such as flip flops (FF; PSR and FSSR) in the corresponding fuse program circuit and circuits such as a multiplexer are formed. To the N well 21, the power supply voltage VDD is applied as the substrate bias voltage. To the P well 22, the ground voltage GND is applied as the substrate bias voltage. To the N well 23, the internal fuse gate power supply voltage FGVD1 is applied as the substrate bias voltage. The P well 24 is coupled to a virtual ground line VGND which will be described later. The P-type semiconductor substrate region 20 is coupled to the ground node.

The fuse gate power supply voltage FGVDD is given from a pad (power supply node) different from the power supply voltage VDD. To adjust current driven by the fusing current supply transistor CTr, the fuse gate power supply voltage FGVDD is set to a voltage level higher or lower than the power supply voltage VDD. Therefore, by providing the N well 23 and the P well 24 isolated from the other wells 21 and 22 in the substrate region 20, the voltage level of the fuse gate power supply voltage FGVDD can be adjusted so as not to exert influence on the circuit receiving the another power supply voltage VDD.

As will be described in detail later, the virtual ground line VGND is used as the ground line of the fusing current supply transistor CTr and the level converter (converter) included in the fuse circuit in each fuse program circuit. By coupling the P well 24 to the virtual ground line VGND, propagation of substrate noise to the other circuit regions is prevented by the fusing current flowing at the time of cutting the fuse, and erroneous circuit operation is prevented. By using the virtual ground line VGND, the voltage level of the fuse gate power supply voltage VGVDD can be set to an optimum value separately from the voltage level of the power supply voltage VDD.

The triple well structure shown in FIG. 7 is disposed commonly to the fuse program circuits. By the device isolation region formed in the surface, the structure is provided so as to be electrically isolated on the fuse program circuit basis.

Figure 8:
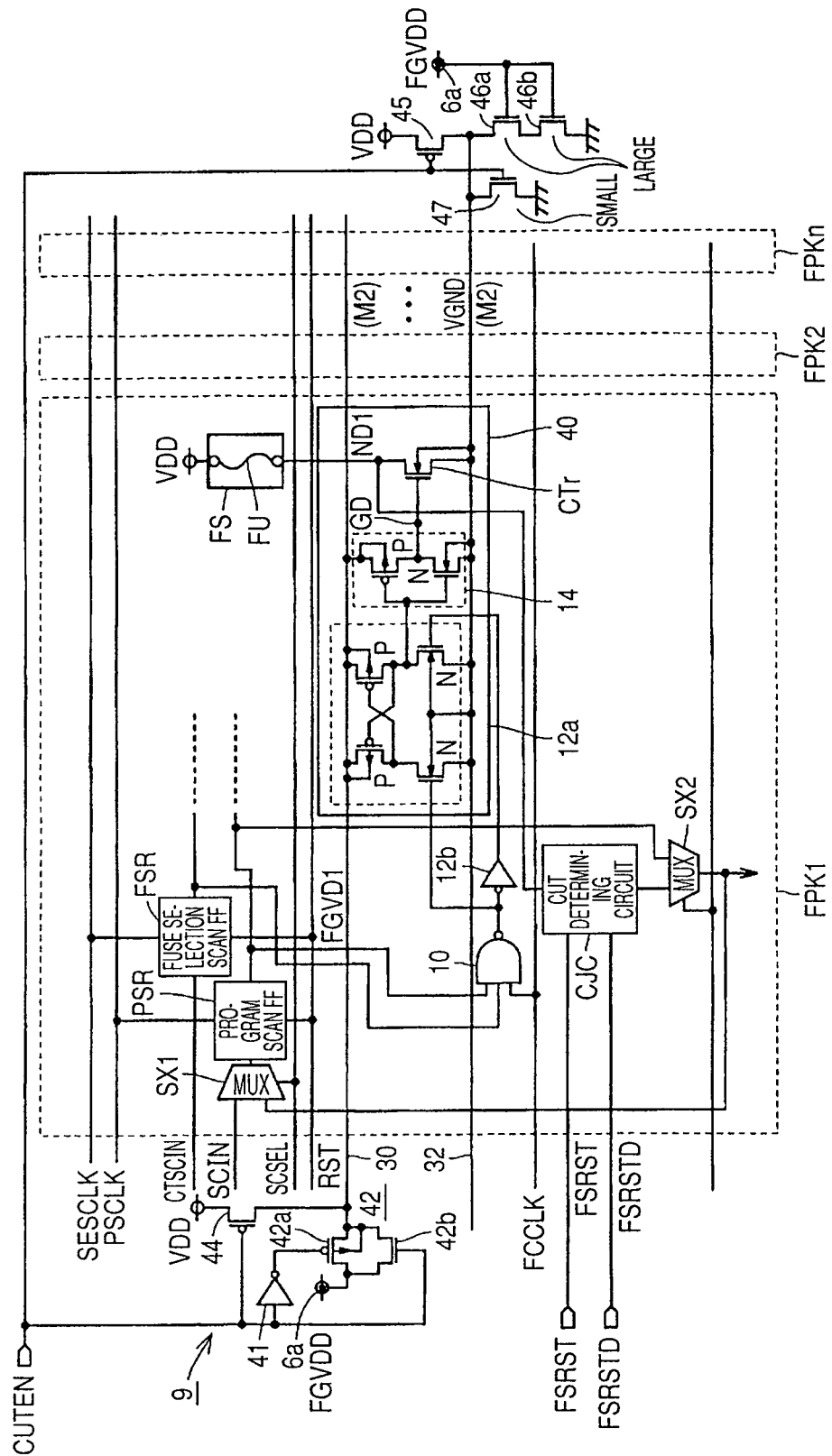
FIG. 8 is a diagram showing the configuration of a modification of the first embodiment of the invention.

FIG. 8 is a diagram showing the configuration of a power supply system related to parts for driving the fusing current drive transistor CTr. In FIG. 8, the fuse program circuits FPK1 to FPKn are provided. Since the fuse program circuits FPK1 to FPKn have the same configuration, the configuration of the fuse program circuit FPK1 is representatively shown in FIG. 8.

The fuse element FS includes a fuse FU, and a fuse circuit block 40 is disposed below the fuse FU. The fuse circuit block 40 includes: a level shifter 12a; the inverter buffer 14 for inverting an output signal of the level shifter 12a; and the fusing current supply transistor CTr which is selectively made conductive according to an output signal of the inverter buffer 14. The region in which the fuse circuit block 40 is disposed corresponds to the region of the N well 23 and the P well 24 illustrated in FIG. 7, and the transistors of the components of the circuit block 40 are formed in the N well 23 and the P well 24.

The level shifter 12a and an inverter 12b configure the level shifter 12 shown in FIG. 3. The inverter 12b receives the power supply voltage VDD as the operation power supply voltage and is not disposed below the fuse FU. In the circuit block 40 disposed below the fuse FU, a transistor for receiving the internal fuse gate power supply voltage FGVD1 is disposed.

A fuse gate power supply line 30 and a virtual ground line (VGND) 32 are provided commonly for the fuse program circuits FPK1 to FPKn. The fuse gate power supply line 30 is coupled to the source of a P-channel MOS transistor (indicated by reference character P) of the fuse circuit block 40 and the substrate region. The virtual ground line 32 is coupled to the source of an N-channel MOS transistor (indicated by reference character N) of the fuse circuit block 40 and the substrate region. Occurrence of the back gate bias effect caused by a potential change in the virtual ground line 32 is prevented and the PN junction between the substrate region and the impurity region can be prevented from becoming conductive. Thus, the components of the fuse circuit block 40 are operated stably with respect to a voltage change in the virtual ground line 32.

The fuse gate power supply line 30 is provided with: a P-channel MOS transistor 44 which is selectively conducted in accordance with a cut enable signal CUTEN as the fuse gate power selection circuit 9 and, in the conduction state, transmits the power supply voltage VDD to the fuse gate power supply line 30; and a CMOS transmission gate 42 which is conducted when the cut enable signal CUTEN is at the H level and couples the fuse gate power supply node 6 (6a) to the fuse gate power supply line 30.

The CMOS transmission gate 42 includes a P-channel MOS transistor 42a and an N-channel MOS transistor 42b. The substrate region in the P-channel MOS transistor 42a is coupled to the fuse gate power supply line 30. Also in the case where the fuse gate power supply voltage FGVDD is boosted to the power supply voltage VDD or higher in the CMOS transmission gate 42, the junction between the back gate (substrate region) of the P-channel MOS transistor 42a and the source/drain can be prevented from being conducted. The fuse gate power supply voltage FGVDD boosted to the power supply voltage VDD or higher can be reliably transmitted to the fuse gate power supply line 30.

Also in the case where the fuse gate power supply voltage FGVDD is at the ground voltage level and the fuse gate power supply line 30 is set to the power supply voltage VDD level by the MOS transistor 44, the back gate of the P-channel MOS transistor 42a is the N-type substrate region (21), and the junction between the back gate (substrate region) and the drain is in an inversely-biased state, and the fuse gate power supply line 30 is stably maintained at the power supply voltage VDD level.

The virtual ground line 32 is provided with a P-channel MOS transistor 45 and N-channel MOS transistors 46a, 46b, and 47. The P-channel MOS transistor 45 is conducted when the cut enable signal CUTEN is at the L level, and transmits the power supply voltage VDD to the virtual ground line 32. The N-channel MOS transistors 46a and 46b receive the fuse gate power supply voltage FGVDD by their gates via the power supply node 6a and function as resistive elements. The MOS transistors 46a and 46b are core transistors having the same configuration (the same gate insulating film thickness, the same gate insulating film material, and the same gate width device length) as that of the transistor in the internal circuit, and have relatively large current driving force.

The N-channel MOS transistor 47 is conducted when the cut enable signal CUTEN is at the H level, and couples the virtual ground line 32 to the ground node. The current drive force of the MOS transistor 47 is made relatively small. In the normal operation mode, the MOS transistor 47 is used to prevent uplift of the potential on the virtual ground line 32.

The configurations of another flip flop, the cut determining circuit, and the like in the fuse program circuit FPK1 are the same as those shown in FIG. 2, the same reference numerals are designated to the corresponding parts, and their detailed description will not be repeated.

The fuse gate power supply line 30 and the fuse virtual ground line 32 are configured by using, as an example, interconnection of a second metal interconnection layer M2 in the multilayer interconnection layer. The fuse FU included in the fuse element FS is configured by using, as an example, an interconnection layer above the second metal interconnection layer by which the fuse gate power supply line 30 and the fuse virtual ground line 32 are formed by two or more layers. By the interconnection structure, even when the fuse gate power supply line 30 and the virtual ground line 32 are disposed commonly for the fuse program circuits FPK1 to FPKn, no influence is exerted on the disposition of the fuse element FS.

Figure 9:
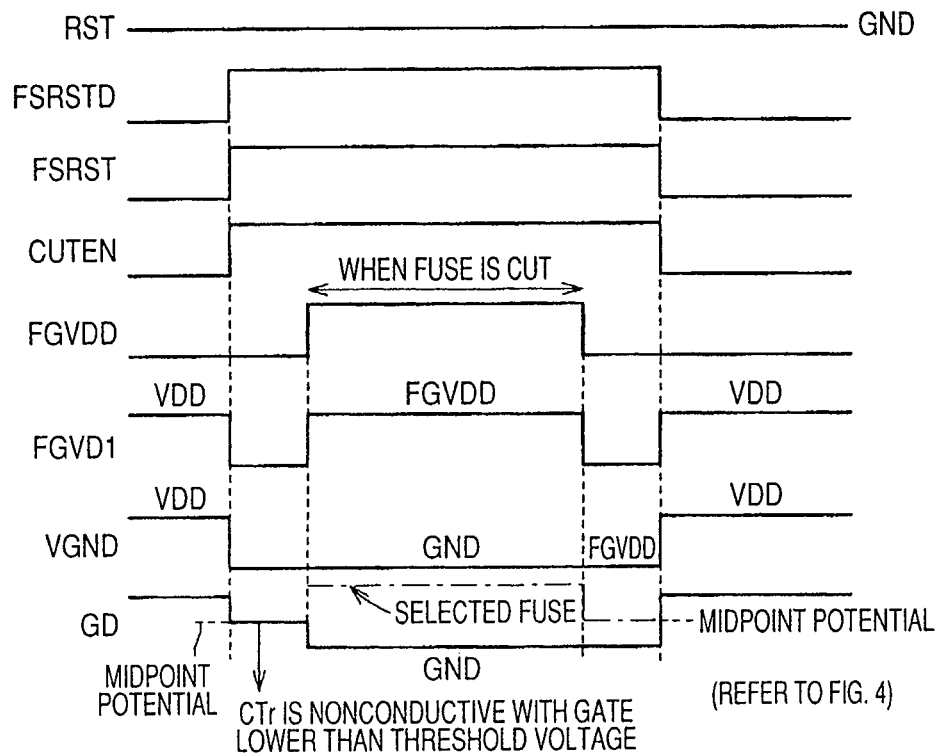
FIG. 9 is a timing chart showing fuse cutting operation of a fuse program circuit illustrated in FIG. 8.

FIG. 9 is a diagram showing a change sequence of the internal fuse gate power supply voltage FGVD1 and the virtual ground line voltage VGND when the fuse element is cut in the fuse program circuit illustrated in FIG. 8. In the following, referring to FIG. 9, the voltage application sequence on the fuse gate power supply line 30 and the virtual ground line 32 at the time of cutting a fuse will be described.

Before cutting a fuse, both of the reset signals FSRSTD and FSRST are at the L level. In this case, as shown in FIG. 4, the node ND1 is charged to the power supply voltage VDD level by the MOS transistor PQ2. Since the cut enable signal CUTEN is at the L level, the MOS transistor 44 is in the on state, the CMOS transmission gate 42 is in the off state, and the voltage FGVD1 on the fuse gate power supply line 30 is at the power supply voltage VDD level.

The fuse gate power supply voltage FGVDD is at the L level, both of the MOS transistors 46a and 46b are in a non-conductive state, and the virtual ground line 32 is maintained at the power supply voltage VDD level by the MOS transistor 45. In this state, in the circuit block 40, both of the power supply line 30 and the ground line 32 are at the power supply voltage VDD level, and an output signal GD of the inverter 14 is at the power supply voltage VDD level. Similarly, all of the internal lines (first and second metal lines) in the fuse circuit block 40 are maintained at the power supply voltage VDD level, that is, the voltage level equal to the voltage levels at both ends of the fuse FU. Under the condition, movement of the line pieces (copper atoms) generated at the time of cutting a fuse is prevented.

At the time of cutting a fuse, first, the fuse element reset delay signal FSRSTD and the fuse element reset signal FSRST become at the H level, and the cut enable signal CUTEN becomes the H level. The reset signal RST is maintained at the L level of the ground voltage GND. The fuse gate power supply voltage FGVDD is maintained at the ground voltage level.

According to the cut enable signal CUTEN, the CMOS transmission gate 42 becomes conductive, the P-channel MOS transistor 44 is turned off, and the voltage FGVD1 on the fuse gate power supply line 30 decreases to the ground voltage level. On the other hand, all of the MOS transistors 45, 46a, and 46b enter the off state (nonconductive state) and the MOS transistor 47 enters the conductive state (on state). The virtual ground line 32 is driven to the ground voltage level by a small current drive force.

The current drive force of the MOS transistor 47 is sufficiently smaller than that of the transistor formed in the circuit block 40. Even when the voltage VGND on the virtual ground line 32 drops to the ground voltage level, by migration of charges of the internal interconnection precharged to the power supply voltage level in the circuit block 40, the output signal GD of the inverter buffer 14 changes to the intermediate potential level at the worst case (the output signal of the inverter 12b is at either the power supply voltage VDD level or the ground voltage level). In this case, even when the gate potential of the fusing current supply transistor CTr is at the intermediate potential level, the voltage between the gate and the source is at the voltage level lower than the threshold voltage of the fusing current supply transistor CTr. Therefore, the fusing current supply transistor CTr enters a weak conduction state at the worst case, and leak current hardly flows in the fuse circuit block 40.

As shown in FIG. 4, in the cut determining circuit CJC, the MOS transistors PQ1 and PQ2 are in the off state, and current supply from the cut determining circuit CJC to the node ND1 is stopped.

Subsequently, at the time of cutting a fuse, the fuse gate power supply voltage FGVDD to be supplied to the fuse power supply node 6a is increased to the cut voltage level. In response to the rise of the fuse gate power supply voltage FGVDD, the voltage FGVD1 on the fuse power supply line 30 becomes the level of the fuse gate power supply voltage FGVDD via the CMOS transmission gate 42. On the other hand, when the voltage level of the fuse gate power supply voltage FGVDD rises, the MOS transistors 46a and 46b are turned on, and the voltage VGND on the virtual ground line 32 is maintained at the ground GND level by the large current drive force.

In a not-selected fuse program circuit, according to an output signal of the NAND gate 10, the output signal GD of the inverter 14 adapted to the intermediate voltage level at the worst case is maintained at the ground voltage GND level. In a selected fuse program circuit, the output signal GD of the inverter becomes the fuse gate power supply voltage FGVDD level in accordance with the output signal of the NAND gate 10, the fusing current supply transistor CTr is conducted, current flows in the fuse FU, and the fuse FU is cut. By adjusting the voltage level of the fuse gate power supply voltage FGVDD, the magnitude of the fusing current flowing in the fusing via the current supply transistor CTr can be adjusted.

Even if large current flows at the time of cutting a fuse, the virtual ground line 32 is maintained at the ground voltage level by the MOS transistors 46a and 46b more reliably, and fusing current of a desired magnitude can be supplied to a fuse to be cut. At the time of cutting a fuse, in the cut determining circuit CJC shown in FIG. 4, both of the MOS transistors PQ1 and PQ2 are in the nonconductive state, and no influence is exerted on the fuse cutting.

After completion of the fuse cutting period, the fuse gate power supply voltage FGVDD is again driven to the ground voltage level and, accordingly, the voltage FGVD1 on the fuse gate power supply line 30 drops to the ground voltage level. In the virtual ground line 32, the MOS transistors 46a and 46b enter the off state (nonconductive state). However, the cut enable signal CUTEN is still at the H level and is maintained by the ground voltage level with high resistance by the MOS transistor 47. By the drop in the level of the voltage FGVD1 on the fuse gate power supply line 30, in the selected fuse program circuit, the voltage of the internal node in the circuit block 40 becomes an intermediate voltage level or the ground voltage level due to migration of charges. FIG. 8 shows the assumed worst case in which the output signal GD of the inverter buffer 14 in the selected fuse program circuit is maintained in the intermediate voltage level. In this case as well, the voltage VGND of the virtual ground line 32 is at the ground voltage GND level, the fusing current supply transistor CTr maintains the nonconductive state, and even in a fuse cutting defective state, leak current can be sufficiently suppressed.

In the not-selected fuse program circuit, the output signal GD of the inverter 14 maintains the ground voltage level. Therefore, the fusing current supply transistor CTr is set in the nonconductive state in both of the selection/non-selection fuse programs, and the leak current path from the fuse power supply node to the virtual ground line is sufficiently blocked.

After completion of cutting the fuse in the selected fuse program circuit, the signals FSRSTD, FSRST, and CUTEN drop to the L level. Accordingly, the CMOS transmission gate 42 enters the nonconductive state, the P-channel MOS transistor 44 enters the on state, and the voltage FGVD1 on the fuse gate power supply line 30 is maintained at the power supply voltage VDD level. The virtual ground line 32 becomes the power supply voltage VDD level by the P-channel MOS transistor 45 (the MOS transistors 46a, 46b, and 47 are in the nonconductive state).

Therefore, at the time of cutting a fuse, except for the operation when a fuse is actually cut, the metal line in the circuit block 40 is at the same level as the voltage level across both ends of the fuse FU, and migration of the copper atoms in the cut fuse pieces can be suppressed. By controlling the conduction states, by use of the P-channel MOS transistors 44 and 45, in accordance with the cut enable signal CUTEN, the voltage level of the fuse gate power supply line 30 and the virtual ground line 32 can be easily changed according to the fuse cutting operation.

When the cut enable signal CUTEN is at the H level, the fuse FU is cut according to the fuse cut clock signal FCCLK. In the not-selected fuse program circuit, an output signal of the NAND gate 10 is at the H level regardless of the state of the fuse cut clock signal FCCLK. Therefore, by the period of the H level of the cut enable signal CUTEN, the period of cutting a fuse is specified.

Figure 10:
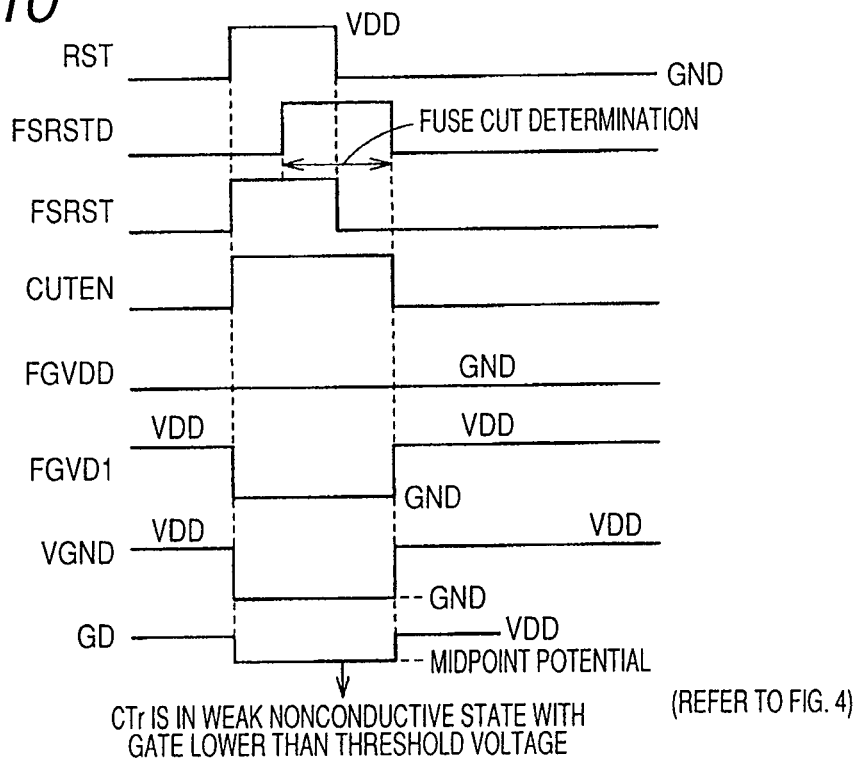
FIG. 10 is a timing chart showing the operation of determining fuse cutting of the fuse program circuit illustrated in FIG. 8.

FIG. 10 is a signal waveform chart showing operation at the time of determination after the fuse cutting. In the following, referring to FIGS. 10 and 4, voltage changes in the fuse gate power supply line 30 and the virtual ground line 32 shown in FIG. 8 will be described.

Before determination of cutting of a fuse, the cut enable signal CUTEN is at the L level, and the reset signal RST, the fuse element reset signal FSRST, and the fuse element reset delay signal FSRSTD are also at the L level. Therefore, both of the voltage FGVD1 on the fuse gate power supply line 30 and the voltage VGND on the virtual ground line 32 are at the power supply voltage VDD level. Thus, the output signal GD of the inverter buffer 14 is at the power supply voltage VDD level, the gate, source, and drain of the fusing current supply transistor CTr are at the same voltage level, and the fusing current supply transistor CTr is in the nonconductive state (the node ND1 is maintained at the power supply voltage level by the MOS transistor PQ2 shown in FIG. 4).

Subsequently, the cut enable signal CUTEN is driven to the H level, and the reset signals RST and FSRST are driven to the H level. Accordingly, the CMON transmission gate 42 is made conductive, and the voltage FGVD1 on the fuse gate power supply line 30 is maintained at the same ground voltage GND level as the fuse gate power supply voltage FGVDD. By the reset signal RST, output signals of the flip flops PSR and FSR in the fuse program circuits FPK1 to FPKn become the L level, and all of the output signals of the NAND gate 10 become the H level. Accordingly, an output signal of the level shifter 12a becomes an intermediate voltage level by migration of charges in the internal line, the output signal GD of the inverter 14 becomes the intermediate voltage level and, in the worst case, the fusing current supply transistor CTr becomes nonconductive (the gate-source voltage of the transistor CTr is lower than the threshold voltage).

With respect to the virtual ground line 32, although the MOS transistors 45, 46a, and 46b are in the off state, the MOS transistor 47 is in the on state. Therefore, charges supplied to the virtual ground line 32 by current supplied from the fuse in the not-cut state or the MOS transistor (PQ21) in the initial state from the cut determining circuit CJC are divided to the fuse gate power supply line 30 via the circuit block 40. The voltage level of the virtual ground line 32 drops and, by the MOS transistor 47, the virtual ground line 32 is maintained at the ground voltage GND level. The fuse gate power supply line 30 is maintained at the ground voltage level by the fuse gate power supply voltage FGVDD.

When the difference between the output signal GD of the inverter 14 and the voltage VGND of the virtual ground line 32 becomes equal to or less the threshold voltage level of the fusing current supply transistor CTr, the fusing current supply transistor CTr becomes nonconductive, and leak current is reduced. Accordingly, the voltage level of the virtual ground line 32 is reliably maintained at the ground voltage level by the MOS transistor 47.

The gate voltages of the MOS transistors 46a and 46b provided for the virtual ground line 32 are at the ground voltage level, and leak current from the virtual ground line 32 to the ground node via the transistors 46a and 46b is sufficiently suppressed.

Subsequently, the fuse reset delay signal FSRSTD is driven to the H level. After that, the rest signals RST and FSRST are driven to the L level. At this time, information before the reset may be re-stored via the multiplexer SX2 in the program scan flip flop PSR. At the time of determining cut of a fuse element, the determining operation is simply performed in the cut determining circuit CJC, and the information stored in the scan flip flops PSR and FSR does not exert influence on the determining operation. Therefore, even when the scan flip flops PSR and FSR maintain the reset state, no problem occurs.

In this state of the rest signals RST and FSRSTD, the voltage level of the internal node (ND2) changes according to whether the fuse element FS is cut or not in the cut determining circuit CJC shown in FIG. 4, and whether the fuse is cut or not is determined. In the determining period, the virtual ground line 32 is maintained at the ground voltage GND level, and erroneous determination as will be described later does not occur. Supply of current from the fusing current supply transistor CTr to the virtual ground line 32 is stopped.

When the determining period is completed, the fuse element reset delay signal FSRSTD and the cut enable signal CUTEN are driven to the L level. Accordingly, the fuse gate power supply line 30 is driven to the power supply voltage VDD level by the MOS transistor 44. The virtual ground line 32 is also charged to the power supply voltage VDD level by the MOS transistor 45. Accordingly, the voltage level of the internal node (second metal line M2) in the circuit block 40 returns to the power supply voltage VDD level.

Therefore, except for the case where a fuse is actually cut, the voltage level of the internal node (second metal line) in the fuse circuit block 40 is maintained at the voltage level (the power supply voltage VDD level) across the fuse FU. Thus, except for the case of cutting a fuse, the fuse FU and the second metal line M2 are maintained at the same potential. Even when the fuse FU is in a cut state, dielectric breakdown caused by diffusion of the second metal line (M2) in the circuit block 40, the fuse element cut pieces, or the like from the fuse element FS of copper atoms of the broken pieces or spread parts of copper (Cu) is suppressed.

Figure 11:
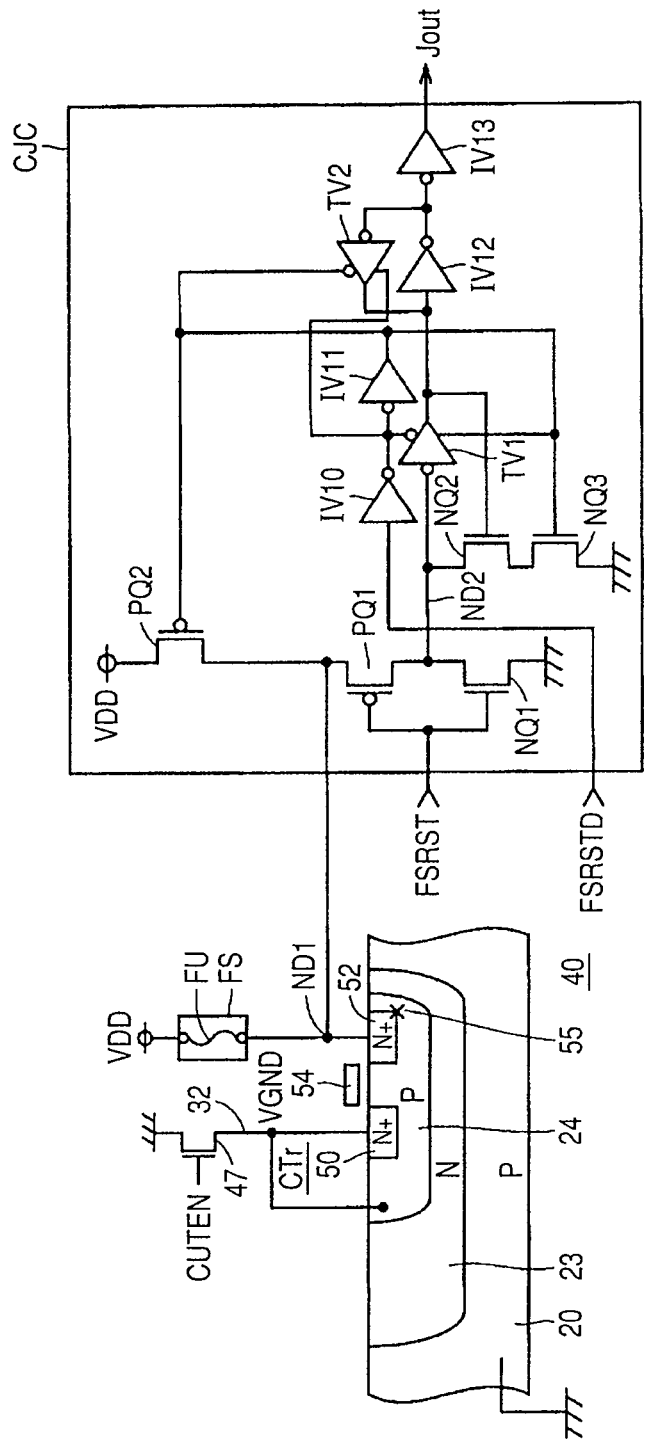
FIG. 11 is a diagram showing a sectional structure of a fuse cutting transistor in the fuse program circuit illustrated in FIG. 8 and the configuration of a cut determining circuit.

FIG. 11 is a diagram schematically showing a sectional structure of the fusing current supply transistor CTr and a connection mode of the fusing current supply transistor CTr and the cut determining circuit CJC. The configuration of the cut determining circuit CJC shown in FIG. 11 is the same as that of the cut determining circuit CJC shown in FIG. 4, the same reference numerals are designated to corresponding parts, and the detailed description of the parts will not be repeated.

In the circuit block 40, the N well 23 is formed in the surface of the P-type semiconductor substrate 20, and the P well 24 is formed in the surface of the N well 23. The fusing current supply transistor CTr is formed in the surface of the P well 24. The fusing current supply transistor CTr includes high-concentration N-type impurity regions 50 and 52 formed in the surface of the P well 24 and a gate electrode 54 formed in a region between the impurity regions 50 and 52 via a gate insulating film. The impurity region 50 is coupled to the MOS transistor 47 via the virtual ground line 32. On the other hand, the impurity region 52 serves as the drain region of the fusing current supply transistor CTr and is coupled to the node ND1 and the fuse element FS. The P well 24 is coupled to the virtual ground line 32, and provided commonly for the fusing current supply transistors CTr included in the fuse program circuits FPK1 to FPKn (the device isolation film is formed for each of the fusing current supply transistors).

In the configuration, a state where a poor junction as shown by an x mark 55 exists in the impurity region 52 will be examined. In this case, when the fuse FU in the fuse element FS is in a not-cut state, charges are supplied from the fuse power supply node via the fuse element FS to the P well 24 via the impurity region 52. In this case, however, when the cut enable signal CUTEN is at the H level, the virtual ground line 32 is coupled to the ground node via the MOS transistor 47, and charges supplied from the fuse power supply node are discharged to the ground node due to the poor junction 55. Therefore, the voltage VGND on the virtual ground line 32 is maintained at the ground voltage GND level even in the case where the poor junction 55 exists in the period in which the cut enable signal CUTEN is at the H level. When the fuse FU is in the cut state in the fuse element FS and the resistance is high in the MΩ order, the node ND1 is almost isolated from the power supply node. It can be said that the N-type impurity region 52 and its PN junction are electrically coupled to the determination node ND2 of the cut determining circuit CJC. In the case where the fuse element reset signal FSRST is set to the H level, in the cut determining circuit CJC, the P-channel MOS transistor PQ1 enters the off state, the MOS transistor NQ1 enters the on state, and the internal node ND2 is electrically isolated from the node ND1 and decreased to the L level of the ground voltage level.

As shown in FIG. 10, when the fuse element reset delay signal FSRSTD becomes the H level, the tristate inverter TV1 is activated, and the signal potential of the node ND2 is inverted and becomes the H level. After that, when the fuse element reset signal FSRST becomes the L level, the MOS transistor PQ1 in the cut determining circuit CJC enters the on state, and the MOS transistor NQ1 enters the off state. In the state, the internal node ND2 in the cut determining circuit CJC is electrically coupled to the node ND1, and is further coupled to the N-type impurity region 52 via the node ND1. However, in this case, the P well 24 is coupled from the virtual ground line 32 to the ground node via the MOS transistor 47, and the P well 24 is at the ground voltage GND level. Therefore, the internal node ND2 in the cut determining circuit CJC is not charged to a level exceeding the input threshold value of the tristate inverter TV1, but a signal of the H level indicative of a fuse cut state is accurately output from the tristate inverter TV1 in the cut determination period. After that, when the fuse element reset delay signal FSRSTD drops to the L level, the tristate inverter TV1 enters an output high-impedance state, and the determination result signal Jout is maintained at the H level.

On the other hand, in the case where the fuse FU is in a low resistance state indicative of the not-cut state, the node ND1 becomes the power supply voltage VDD level. Even if the poor PN junction 55 exists, the current supply force of the fuse FU is higher than the current drive force of the MOS transistor 47, and the node ND1 is maintained at the power supply voltage level. The fusing current supply transistor CTr is in a nonconductive state, leak current from the poor PN junction 55 is small, and the voltage VDND of the virtual ground line 32 is maintained at almost the ground voltage level also in the determination period.

In this case, in the cut determining circuit CJC, the node ND2 is charged via the MOS transistor PQ1 during the determination period, and an output signal of the tristate inverter TV1 becomes the L level. Therefore, when the fuse FU is not cut, the determination result signal Jout becomes the L level, the determination result according to the state of whether the fuse element FS is cut or not can be accurately output, and the cut determination can be performed accurately.

For the P well 24, the fusing current supply transistors of the plurality of fuse program circuits SPK1 to SPKn are provided (the not-shown device isolation regions are formed). In the fuse program circuits SPK1 to SPKn, the fuse element FS is in the cut state or the not-cut state, and a fuse element in the cut state and a fuse element in the not-cut state mixedly exist. In such a case as well, at the time of determining the cut state, by setting the MOS transistor 47 in the on state and maintaining the P well at almost the ground voltage GND level, the state of each of the fuse elements FS can be accurately discriminated.

In FIG. 8, the MOS transistors 46a and 46b are coupled in series to the virtual ground line 32. Alternatively, in this case, one MOS transistor may be disposed and the fuse gate power supply voltage FDVDD may be given to the gate of the MOS transistor.

As described above, according to the first embodiment of the present invention, the transistor for maintaining the ground voltage level in the cutting operation is disposed for the virtual ground line provided commonly for the plurality of fuse program circuits. Whether a fuse element is cut or not can be accurately determined at the time of the cut determination.

In the normal operation, MOS transistors (47, 46a, and 46b) for maintaining the virtual ground line at the ground voltage level are set to the off state (the fuse gate power supply voltage FGVDD is maintained at the set voltage level in the normal operation mode), and the virtual ground line is maintained at the power supply voltage VDD level. Consequently, the voltage level of the wiring of the fuse circuit block 40 disposed below the fuse can be maintained at the same voltage level as that of the voltage applied across both ends of the fuse element FS, and defect of the copper wire caused by migration of the copper atoms can be prevented.

Second Embodiment

Figure 12:
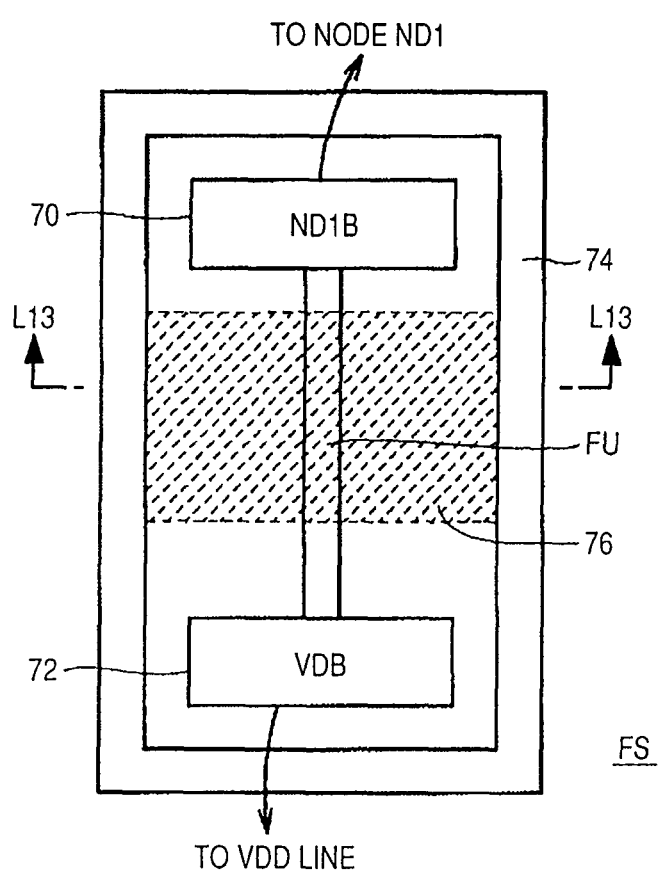
FIG. 12 is a diagram schematically showing planar layout of a fuse element according to a second embodiment of the invention.

FIG. 12 is a diagram schematically showing the configuration of the fuse element FS according to a second embodiment of the present invention. In FIG. 12, the fuse element FS includes the fuse FU. The fuse FU is formed by a copper (Cu) wire and is realized by using the metal wire in an upper layer above a third metal wire layer. In the second embodiment, the fuse element FU is formed by using the wire in a fourth metal wire layer.

The fuse FU is coupled to a not-shown power supply line via a wide wire bed region VDB and is coupled to a wire region realizing the node ND1 via a node bed region ND1B. A copper diffusion preventing wall structure 74 is disposed so as to surround the fuse FU and the bed regions VDB and ND1B. The configuration of the copper diffusion preventing wall structure 74 will be described in detail later. An upper-part diffusion preventing wall wire 76 formed so as to cover at least a cut part in the fuse FU is included in an upper layer of the fuse FU. In the second embodiment, as the upper-part diffusion preventing wall wire 76, a power supply line for transmitting the power supply voltage VDD is used, and a fifth metal line layer (M5) is used as the power supply line.

In a wiring layer just above the fuse FU, no line and no via hole are disposed. At the time of fusing the fuse FU formed by the copper wire, movement of copper pieces due to thermal diffusion is prevented by the preventing wall structure 74, and occurrence of wiring short-circuit and poor cutting of a fuse element is suppressed.

Below the fuse FU, a transistor disposition region for disposing a transistor for cutting the fuse FU is provided, and the transistors of the fuse circuit block 40 shown in FIG. 8 are disposed. The fuse elements FS shown in FIG. 12 are aligned in parallel in correspondence with the fuse program circuits (FPK).

Figure 13:
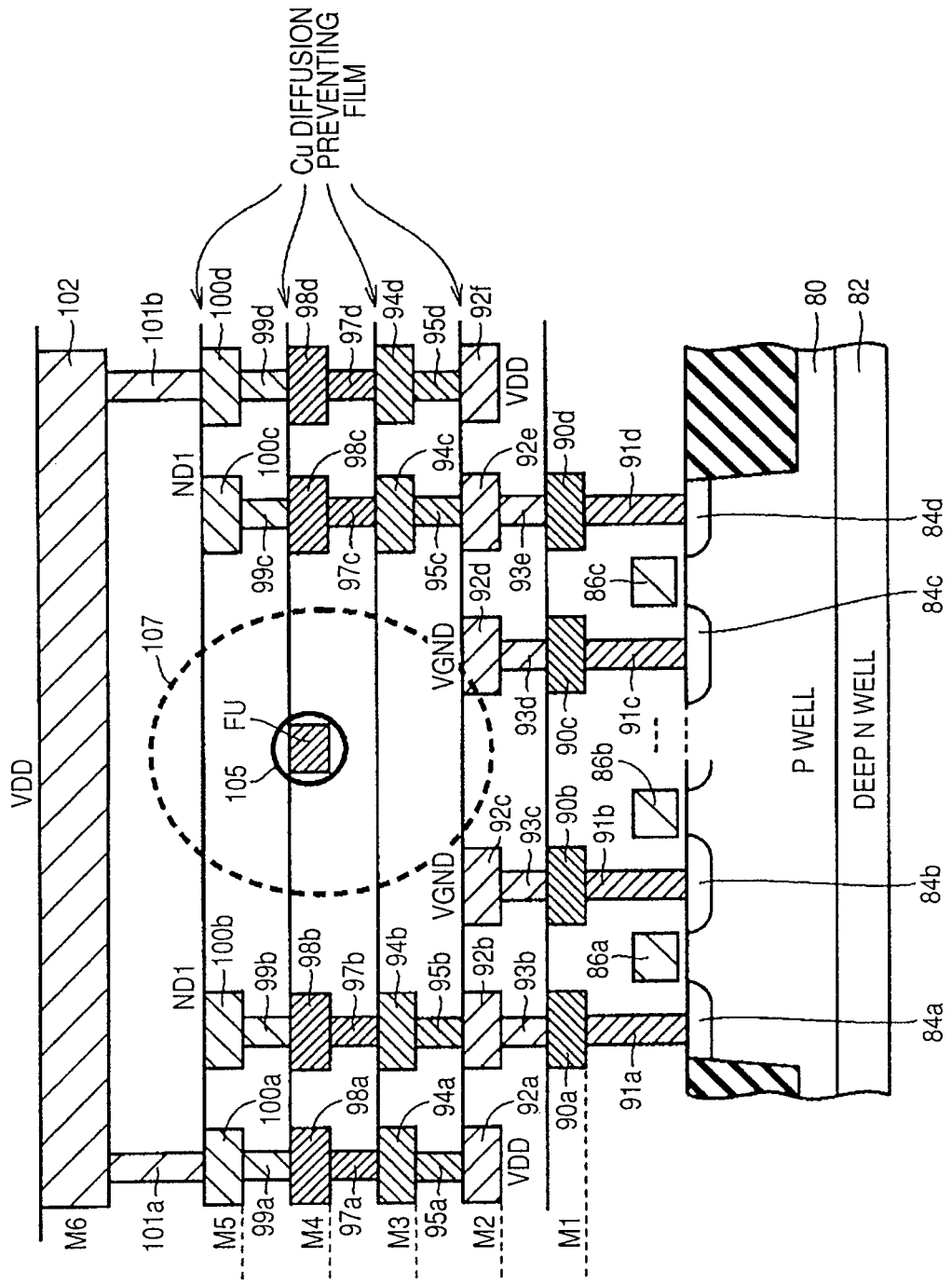
FIG. 13 is a diagram schematically showing a sectional structure taken along line L13-L13 of FIG. 12.

FIG. 13 is a diagram schematically showing a sectional structure taken along line L13-L113 of the fuse element FS illustrated in FIG. 12. In FIG. 13, N-type active regions (impurity regions) 84*a* to 84*d* are formed at intervals in the surface of a P-type well (P well) 80. A deep N well 82 is formed below the P well 80, and the P well 80 is isolated from other circuit formation regions. The P well 80 is disposed commonly for the fuse program circuits. The P well 80 and the deep N well 82 correspond to the P-type well region 24 shown in FIG. 7.

On the surface of the P-well 80 between the impurity regions 84*a* to 84*d*, gate electrode wires 86*a*, 86*b*, and 86*c* made of, for example, polysilicon are disposed. By the gate electrode wires 86*a* to 86*c* and the active regions 84*a* to 84*d*, an N-channel MOS transistor (fusing current supply transistor) included in the fuse circuit block 40 (refer to FIG. 8) in the fuse program circuit is formed. That is, the fusing current supply transistor CTr is configured by a plurality of unit MOS transistors disposed in parallel, and each of the unit MOS transistors is formed by the active region and the gate electrode wire which are shown in the diagram.

The impurity regions 84*a* to 84*d* are coupled to wires 90*a* to 90*d* of the first metal wiring layer M1 via contacts 91*a* to 91*d*, respectively. The first metal wires 90*b* and 90*c* are coupled to wires 92*c* and 92*d* in the second metal wiring layer M2 via first vias 93*c* and 93*d*, respectively. The second metal wires 92*c* and 92*d* are coupled to the virtual ground line and receive the virtual ground voltage VCND.

The first metal wire 90*a* is coupled to the second metal wire 92*b* via a first via 93*b*, and the first metal wire 90*d* is coupled to a second metal wire 92*e* via a first via 93*e*.

In the second metal wiring layer M2, second metal wires 92*a* and 92*f* are disposed on the outside of the second metal wires 92*b* and 92*e*. The second metal wires 92*a* and 92*f* transmits the power supply voltage VDD as will be described later.

In the third metal wiring layer M3, third metal wires 94*a*, 94*b*, 94*c*, and 94*d* are disposed at intervals and are electrically coupled to the second metal wires 92*a*, 92*b*, 92*e*, and 92*f* via second vias 95*a*, 95*b*, 95*c*, and 95*d*, respectively. No third metal wires are disposed above the second metal wires 92*c* and 92*d*.

In the fourth metal wiring layer M4, fourth metal wires 98*a*, 98*b*, 98*c*, and 98*d* are disposed at intervals and are electrically coupled to third metal wires 94*a*, 94*b*, 94*c*, and 94*d* via third vias 97*a*, 97*b*, 97*c*, and 97*d*, respectively. In the fourth metal wiring layer M4, the fuse FU formed by using the fourth metal wire is disposed. In the third metal wiring layer M3 just below the fuse FU, no wire is disposed, and the second metal wires 92*c* and 92*d* in the second metal wiring layer M2 and the fuse FU are disposed in positions so as not to be aligned.

In the fifth metal wiring layer M5, fifth metal wires 100*a*, 100*b*, 100*c*, and 100*d* are disposed at intervals, and are electrically coupled to the fourth metal wires 98*a*, 98*b*, 98*c*, and 98*d* via fourth vias 99*a*, 99*b*, 99*c*, and 99*d*, respectively.

The fifth metal wires 100*b* and 100*c* are coupled to the node bed region ND1B shown in FIG. 12 and coupled to the nodes ND1.

On the other hand, the fifth metal wires 100*a* and 100*d* are coupled to a sixth metal wire 102 in a sixth metal wiring layer M6 via sixth vias 101*a* and 101*b*, respectively. To the sixth metal wire 102, the power supply voltage VDD is transmitted. The sixth metal wire 102 is disposed so as to cover the fuse above the fuse FU. Therefore, just above and just below the fuse FU, a gap of at least two wiring layers is assured. A trimming region 105 of the fuse FU is a region fused by Joule heat generated by the fusing current, and the copper atoms at the time of fusing migrate from the trimming region 105 by thermal diffusion. A damage expected region 107 exists around the fuse trimming region. In the case where the fuse is cut by the Joule heat, it is expected that, in the damage expected region 107, temperature rises to the melting point (1,000° C. or higher) of copper, and copper diffuses. In reality, the region is a region in which it is expected that quality deterioration of the insulating film due to heat occurs, and poor insulation due to migration of the copper atoms does not occur.

By the copper diffusion preventing wall structure, occurrence of wiring short-circuit (poor insulation) caused by thermal diffusion of the copper atoms and poor cutting of the fuse FU is suppressed in the damage expected region 107.

By the vias and wires disposed around the fuse FU, the copper (Cu) diffusion preventing film is formed and the copper diffusion preventing structure 74 shown in FIG. 12 is realized. The upper-part diffusion preventing wall wire 76 shown in FIG. 12 corresponds to the sixth metal wire 102 shown in FIG. 13. As shown in FIG. 13, by forming the upper-part copper diffusion preventing film of the fuse FU by using the wires in the sixth metal wiring layer, the number of wiring layers used for formation of a fuse element can be reduced. As compared with the configuration of forming the prevention film above a fuse by using the wires 100*b* and 100*c* forming the node ND1, the occupation area can be reduced.

As shown in FIG. 13, thermal diffusion of copper over the gap region above the fifth metal wires 100*b* and 100*c* is prevented by the fifth vias 101*a* and 101*b*. Accordingly, thermal diffusion of copper to the fuse element disposed adjacently can be suppressed. The preventing wall has a double-wall structure formed by plugs configured by intermediate metal wires and vias existing between the six metal wiring layer and the second metal wiring layer and plugs configured by intermediate metal wires and vias existing between the substrate region and the fifth metal wiring layer, so that the thermal diffusion path of copper can be blocked with reliability.

An interlayer insulating film is disposed between metal wires in the metal wiring layers, and a diffusion preventing film made of SiCN which prevents copper (Cu) diffusion and has a small copper diffusion coefficient is disposed for each wiring layer of the interlayer insulating film. By disposing the copper diffusion preventing film, copper diffusion in the damage region is suppressed, deterioration in the insulating film is suppressed, and thermal diffusion of copper atoms in the insulating film is suppressed. Particularly, the copper diffusion preventing film is disposed in each of the second to fifth metal wiring layers M2 to M5. The diffusion preventing film disposed between the wire to which the power supply voltage VDD is applied and the wire to which the voltage of the node ND1 is applied is important since it prevents the copper atoms diffused when the adjacent fuse FU is fused from being diffused.

Figure 14:
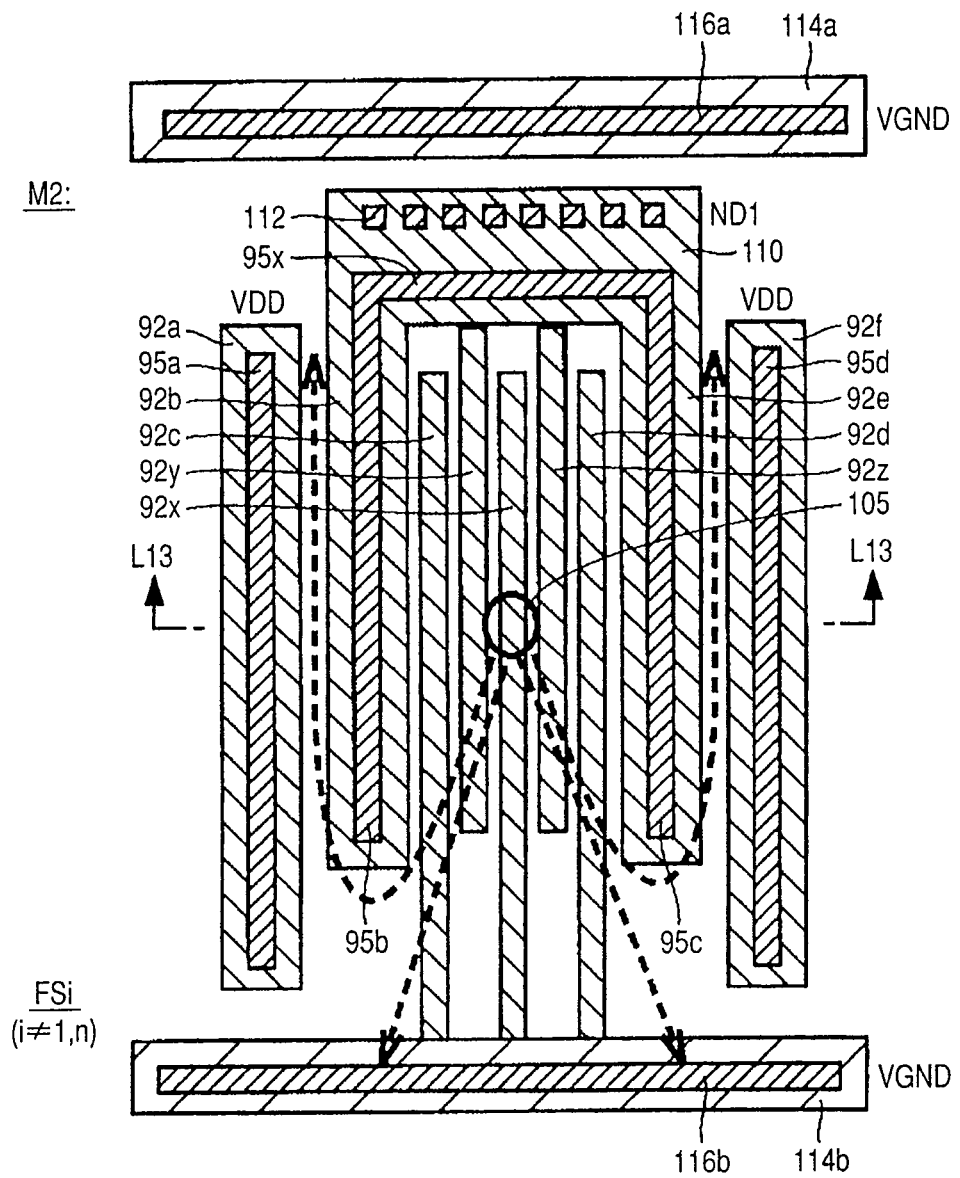
FIG. 14 is a diagram schematically showing planar layout of a second metal wiring layer and a second via in the sectional structure illustrated in FIG. 13.

FIG. 14 is a plan view schematically showing a layout of the second metal wiring layer M2 and the second via in the fuse element illustrated in FIG. 13. A sectional structure taken along line L13-L13 in FIG. 14 is the sectional structure shown in FIG. 13. The following drawings also similarly show sectional structures. A fuse element FSi is disposed in a place other than an end part in a fuse box in which a plurality of fuse elements are disposed in an aligned manner.

In FIG. 14, the second metal wires 92a and 92f are formed in a vertically long shape and opposed to the fuse trimming region 105. On the surface of the second metal wires 92a and 92f, similarly, the second vias 95a and 95d each having a vertically long shape are disposed. The second vias 95a and 95d having the vertically long shape are not isolated from each other in a small unit area unlike the case of forming normal unit contacts but are groove-shaped vias formed linearly continuously. By forming the groove-shaped vias extending continuously, copper (Cu) diffusion paths indicated by dashed arrows are blocked.

The second metal wires 92b and 92e are coupled to a second metal bed wire 110. To the second metal bed wire 110, second metal wires 92y and 92z are also coupled. Between the second metal wires 92b and 92y, the second metal wire 92c is disposed. Between the second metal wires 92y and 92z, a second metal wire 92x is disposed. Between the second metal layers 92z and 92e, the second metal wire 92d is disposed. Although the second metal wires 92x to 92z are not shown in the plan-view layout of FIG. 13, they are disposed in accordance with the number of unit transistors of the fusing current supply transistor (CTr).

The second metal wires 92c, 92x, and 92d are coupled to a second metal wire 114b disposed so as to extend continuously in the lateral direction. The second metal wire 114b is coupled to a virtual ground SEN and transmits a virtual ground voltage VGND. A groove-shaped second via 116b continuously extending is formed in the surface of the second metal wire 114b to interrupt a copper diffusion path to the outside of the fuse box.

The second vias 95b and 95c having the groove shape are disposed on the second metal wires 92b and 92e disposed on the outermost parts to the bed wire 110 as a component of the node ND1. The second bias 95b and 95c are mutually coupled to a groove-shaped second via 95x on the second metal bed wire 110. Therefore, by the groove-shaped second vias 95b, 95c, and 95x formed in a U shape, a preventing wall surrounding the trimming region 105 is formed in the second metal wiring layer.

In the second metal bed wire 110, a plurality of second vias 112 each having a unit area are disposed at intervals for electric coupling to the upper-layer wire.

A first metal wire 114a continuously extending in the lateral direction is disposed on the outside of the second metal bed wire 110, and a second via 116a having a groove shape is disposed in the surface of the first metal wire 114a. The second metal wire 114a is coupled to the virtual ground line and transmits the virtual ground voltage VGND. By the second metal wire 114a and the groove-shaped second via 116a, the diffusion path of copper atoms diffusing belong the bed wire 110 is blocked.

Figure 15:
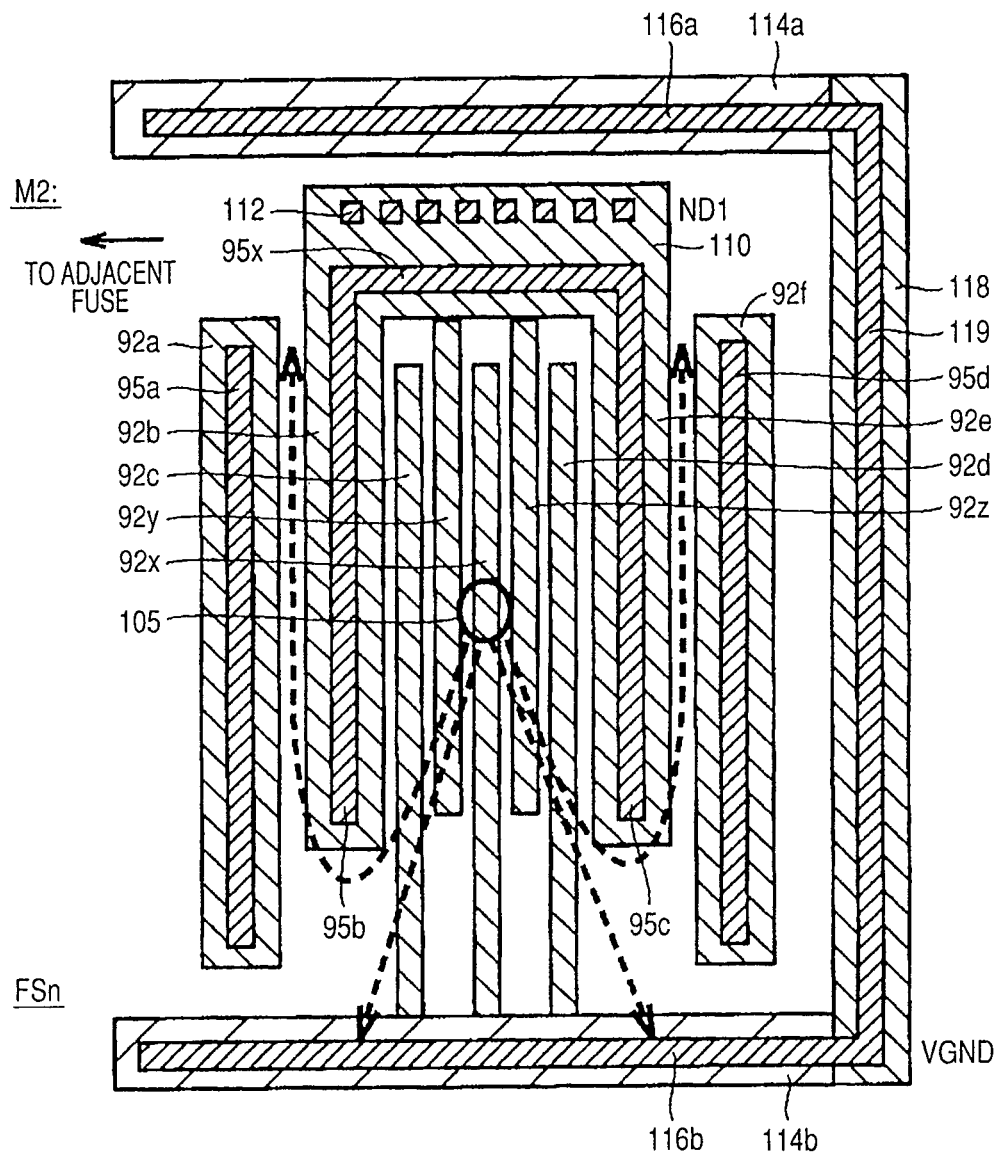
FIG. 15 is a diagram schematically showing planar layout of a second metal wiring layer and a second via of a fuse element at an end of a fuse box.

FIG. 15 is a diagram schematically showing planar layout of a fuse element FSn disposed at an end of a fuse element sequence in a fuse box. The planar layout of the fuse element FSn shown in FIG. 15 is different from that of the fuse element FSi shown in FIG. 14 with respect to the following points. In the fuse element FSn at an end, the second metal wires 114a and 114b are mutually coupled to a second metal wire 118 extending in the vertical direction. The groove-shaped second vias 116a and 116b are mutually coupled to each other via a groove-shaped second via 119 extending in the vertical direction and formed in the surface of the second metal wire 118. The planar layout of the other configuration of the fuse element FSn shown in FIG. 15 is the same as that of the fuse element FS1 shown in FIG. 14. The same reference numerals are designated to the corresponding parts and their detailed description will not be repeated.

In the fuse element FSn at an end, by the groove-shaped second via 119 and the second metal wire 118, propagation of copper (Cu) by thermal diffusion to the outside of the fuse element sequence in the end region is prevented.

As shown in FIGS. 14 and 15, in the second metal wiring layer, the thermal diffusion path (indicated by the dashed arrows in FIGS. 14 and 15) of copper (Cu) from the trimming region 105 is blocked. In this case, the thermal diffusion path between the second metal wires 92a and 92b and the thermal diffusion path between the second metal wires 92e and 92f are reliably blocked by the second metal wires 92c, 92d, and 92x to 92z. In addition, a transistor other than the fuse circuit (circuit block 40) is disposed on the outside of the second metal wire 114b, the thermal diffusion path of copper indicated by the dashed arrows is reliably blocked by the second metal wire 114b and the groove-shaped second via 116b, and thermal diffusion of copper (Cu) to wires of other circuits can be prevented reliably.

Figure 16:
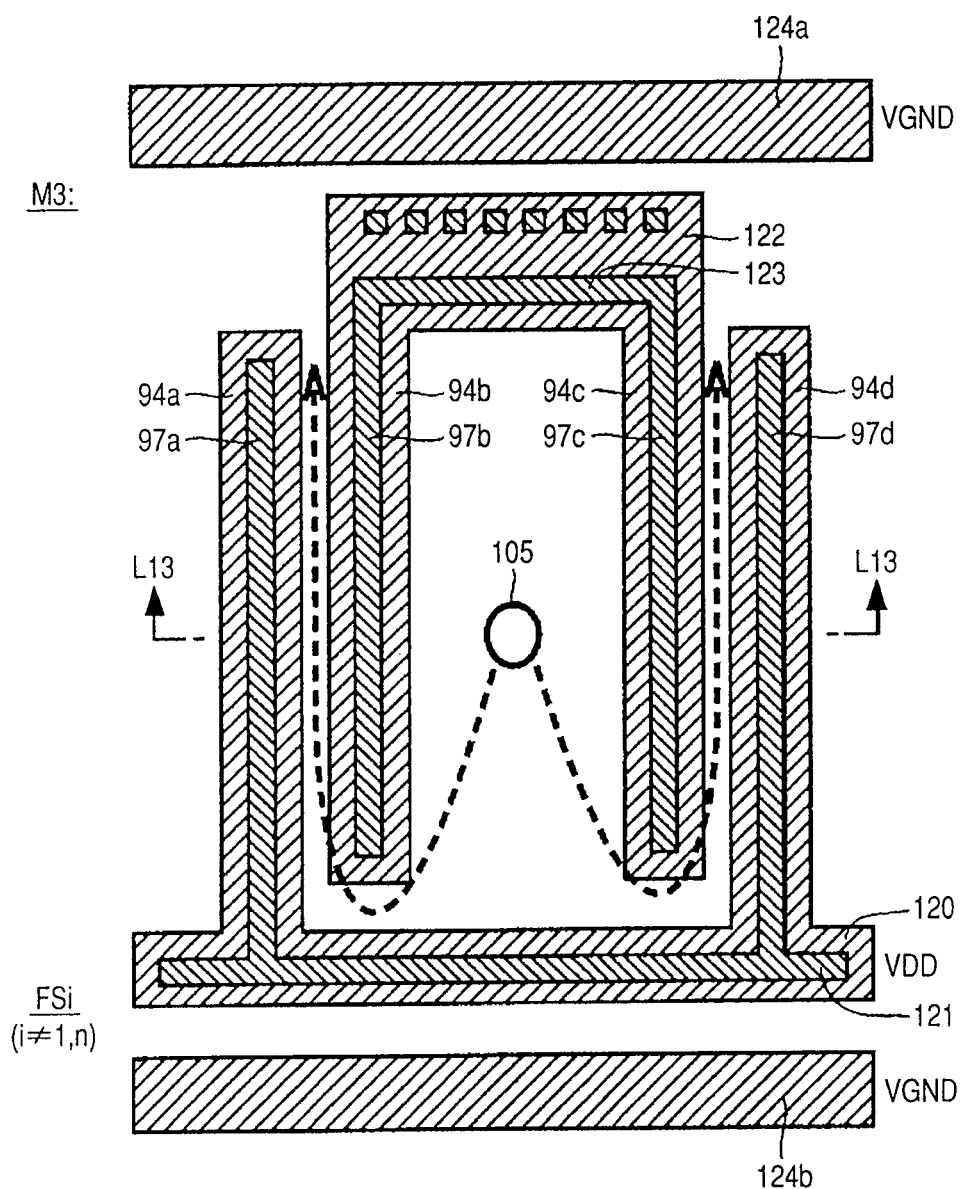
FIG. 16 is a diagram schematically showing wiring layout of a third metal wiring layer as an upper layer of the planar layout illustrated in FIG. 14.

FIG. 16 is a diagram schematically showing planar layout of an upper layout in the planar layout of the fuse element FSi illustrated in FIG. 14. In FIG. 16, layout of wires in the third metal wiring layer M3 of the fuse element FSi is shown. Also in FIG. 16, as a sectional structure taken along line L13-L13, the sectional structure shown in FIG. 13 is obtained.

In FIG. 16, the third metal wires 94a and 94d are formed in a vertically-long shape, and the groove-shaped third vias 97a and 97d are formed so as to continuously extend in the third metal wires 94a and 94d, respectively. The third metal wires 94a and 94d are coupled to a third metal wire 120 formed below. The third vias 97a and 97d are also electrically coupled to a groove-shaped third via 121 formed in the third metal wire 120. The third metal wire 120 is disposed in a position on the inside of the layout region of the second metal wires 114a and 114b shown in FIG. 15, and transmits the power supply voltage VDD. The third metal wire 120 is electrically coupled to the second metal wires 92a and 92f shown in FIG. 15 via the groove-shaped second via.

The third metal wires 94b and 94c are similarly formed in a vertically-long shape in parallel with the third metal wires 94a and 94d. In the surface I of the third metal wires 94b and 94c, the groove-shaped third vias 97b and 97c continuously extending are formed. The third metal wires 94b and 94c are electrically coupled to a third metal bed wire 122. The groove-shaped third vias 97b and 97c are also electrically coupled to a groove-shaped third via 123 formed in the third metal bed wire 122. Also in the third metal wire 122, third vias as units for obtaining electric coupling to an upper-layer wire are disposed at intervals.

The third metal bed wire 122 is electrically coupled to the second metal bed wire 110 via the second via 112 shown in FIG. 14.

In regions upper and lower than the fuse element, third metal wires 124*a* and 124*b* are formed so as to continuously extend in the lateral direction, and are electrically coupled to the third metal wires 114*a* and 114*b* shown in FIG. 14 via the second vias 116*a* and 116*b*, respectively. The third metal wires 124*a* and 124*b* serve as virtual ground lines and transmit the virtual ground voltage VGND. In the surface of the third metal wires 124*a* and 124*b*, no groove-shaped vias are formed. The third metal wires 124*a* and 124*b* are disposed as a global virtual ground line (32) and transmit the virtual ground voltage VGND with low resistance.

Figure 17:
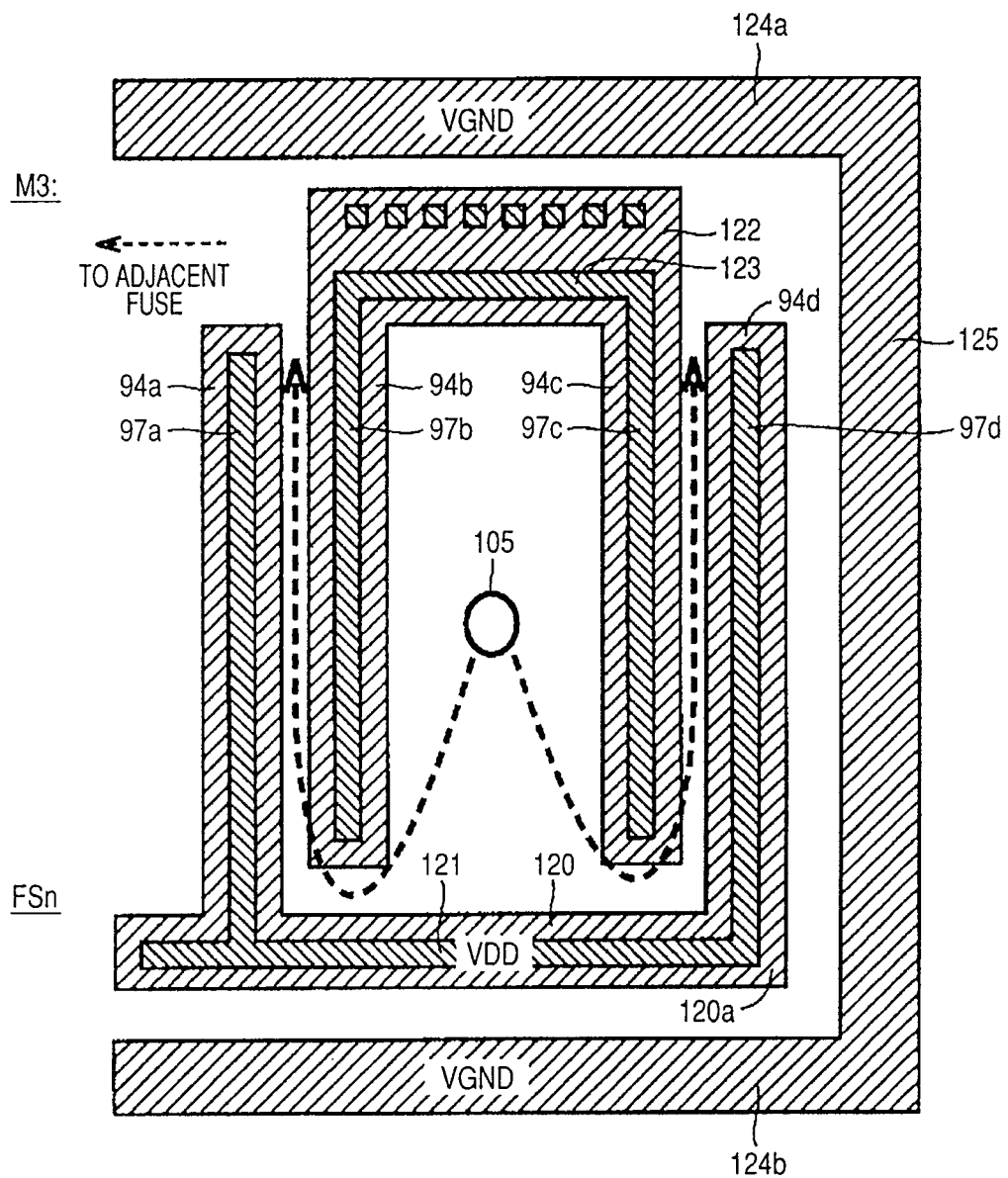
FIG. 17 is a diagram schematically showing wiring layout of the third metal wiring layer as an upper layer of the planar layout illustrated in FIG. 15.

FIG. 17 is a diagram schematically showing the layout of the third metal wiring layer of the fuse element FSn at an end of the fuse element sequence. The planar layout of the fuse element FSn at an end illustrated in FIG. 17 is different from that of the fuse element FSi (i≠1, n) shown in FIG. 16 with respect to the following points. That is, the third metal wires 124*a* and 124*b* continuously extending in the lateral direction in the regions upper and lower than the fuse element sequence are electrically coupled to each other via a third metal wire 125 extending in the vertical direction. The wiring layout of the third metal wire 120 is terminated by a termination end 120*a*. The planar layout of the other components of the fuse element FSn shown in FIG. 17 is the same as that of the fuse element FSi shown in FIG. 16, so that the same reference numerals are designated to corresponding parts and their detailed description will not be repeated.

As shown in FIGS. 16 and 17, also in the third metal wiring layer M3, the thermal diffusion path of copper (Cu) from the fuse element trimming region 105 exists, as shown by the dashed arrows, in a region between the third metal wires 94*a* and 94*b* and a region between the third metal wires 94*c* and 94*d*. However, in the path, a sufficiently long distance is assured for the fuse having a distance equal to or longer than the length of the thermal diffusion path of copper. The influence of thermal diffusion on an adjacent fuse element, of the copper (Cu) of the diffusion path, can be sufficiently suppressed.

In the fuse element FSn at the end, by disposing the third metal wire 125, thermal diffusion of copper to circuits disposed on the outside of the fuse element sequence (fuse box) is suppressed, and adverse influence on the external circuits can be avoided with reliability.

As described above, thermal diffusion of copper (Cu) to the transistor formation region in another circuit disposed on the outside of the lower region of the third metal wire 124*b* in FIGS. 16 and 17 can be reliably suppressed.

The fuse element FSn at the end is disposed so that the second metal wire 120*a* does not project from the end of the second metal wire 94*d* as shown in FIG. 17. With the arrangement, the second metal wires 125 and 120*a* are prevented from being electrically short-circuited.

Figure 18:
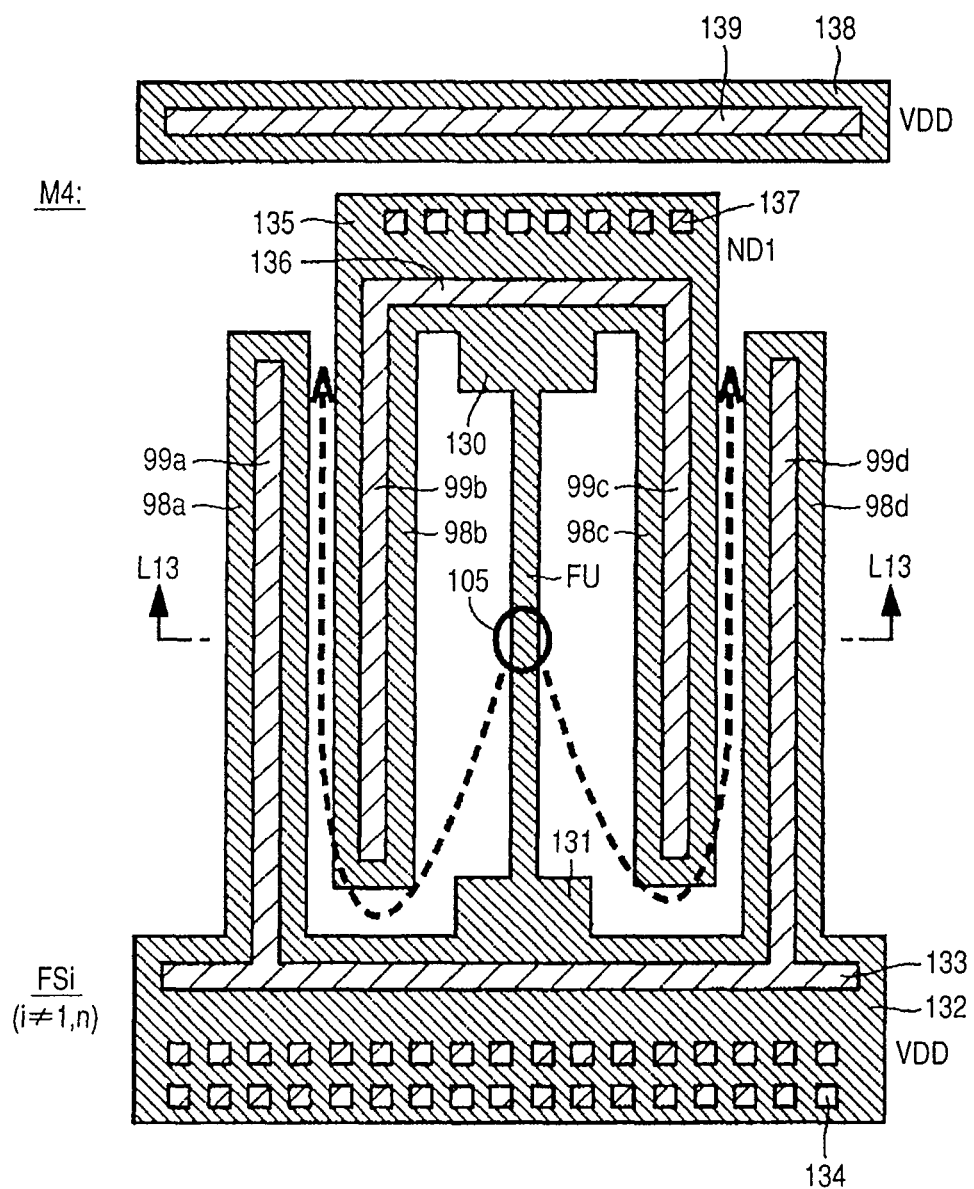
FIG. 18 is a diagram schematically showing planar layout of a fourth metal wiring layer as an upper layer of the wiring layer illustrated in FIG. 16.

FIG. 18 is a diagram showing the wiring layout of a fourth metal wiring layer M4 as an upper layer of the fuse element illustrated in FIG. 16. A sectional structure taken along line L13-L13 of FIG. 18 is the sectional structure of the fourth metal wiring layer, the fourth via, and the lower layer shown in FIG. 13.

In FIG. 18, in the fourth metal wiring layer M4 of the fuse element FSi, the fourth metal wires 98*a* and 98*d* extend in the vertical direction, and the groove-shaped fourth vias 99*a* and 99*d* are formed so as to extend linearly and continuously in the fourth metal wires 98*a* and 98*d*. For the fourth metal wires 98*a* and 98*d*, a fourth metal wire 132 which extends continuously in the lateral direction is provided. In the fourth metal wire 132, a groove-shaped fourth via 138 is formed. The fourth metal wires 98*a* and 98*d* are coupled to the fourth metal wire 132, and the fourth vias 99*a* and 99*d* are coupled to a fourth via 133. A plurality of fourth vias 134 as units for obtaining electric coupling to upper-layer wires are aligned at intervals in the surface of the fourth metal wire 132.

The fourth metal wire 132 transmits the power supply voltage VDD and is electrically coupled to the third metal wire 120 in the lower layer shown in FIG. 16 via the groove-shaped third via.

In the fourth metal wires 98*a* and 98*d*, fourth metal wires 98*b* and 98*d* are disposed so as to linearly extend. In the fourth metals 98*b* and 98*c*, the groove-shaped fourth vias 99*b* and 99*c* are disposed.

For the fourth metal wires 98*b* and 98*c*, a fourth metal bed wire 135 is disposed so as to align with the third metal bed wire 122 shown in FIG. 16, and a groove-shaped fifth via 136 is formed in the surface of the third metal bed wire 135. The fourth metal wires 98*b* and 98*c* are coupled to the fourth metal bed wire 135, and the fourth groove-shaped via 136 is coupled to the fourth vias 99*b* and 99*c*.

On the inside of the fourth metal wires 98*b* and 98*c*, the fourth metal wire as a component of the fuse FU is disposed, and fourth metal pad wires 130 and 131 are disposed at both ends of the fuse FU. The fourth metal pad wire 130 is coupled to the fourth metal bed wire 135, and the fourth metal pad wire 131 is coupled to the fourth metal wire 132. Accordingly, both ends of the fuse FU are coupled to the node ND1 and the power supply node.

Figure 19:
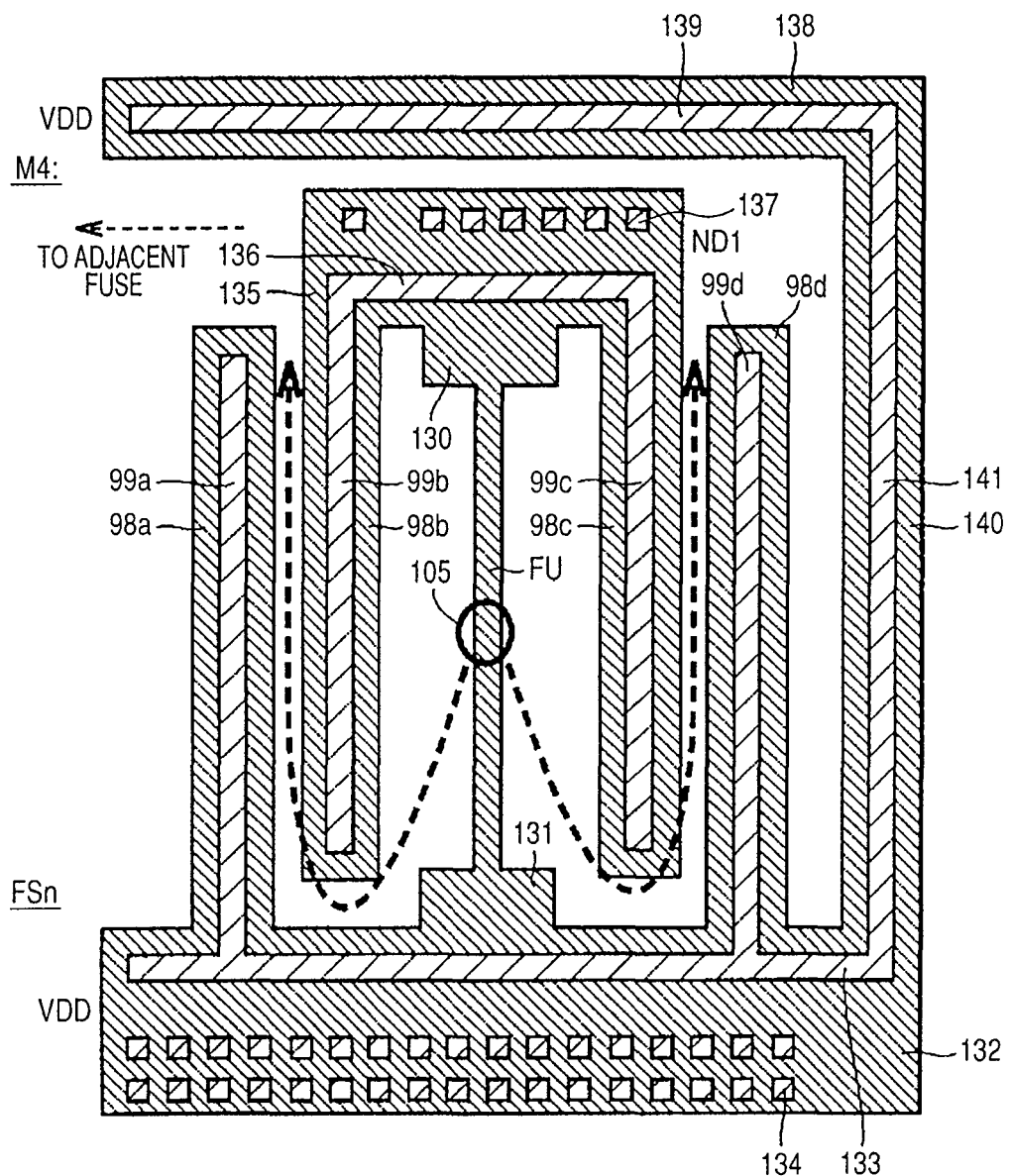
FIG. 19 is a diagram schematically showing planar layout of a fourth metal wiring layer and a fourth via as an upper layer of the planar layout illustrated in FIG. 17.

FIG. 19 is a diagram schematically showing the layout of the fuse FSn at an end of the fuse element sequence. In FIG. 19, at an end of the fuse element FSn, a fourth metal wire 140 and a groove-shaped fourth via 141 are formed in a rectangular shape which is long in the vertical direction. The fourth metal wire 140 is coupled to the fourth metal wires 138 and 132, and the groove-shaped fourth via 141 is coupled to the fourth vias 139 and 133. Therefore, in the fuse element FSn at the end, a preventing wall is formed by the fourth metal wire and the fourth via at the end. The other disposition in the wiring layout of FIG. 19 is the same as that in the planar layout of the fuse element shown in FIG. 18. In FIG. 19, the same reference numerals are designated to the parts corresponding to those of the fuse element FSi shown in FIG. 18, and their detailed description will not be repeated.

As shown in FIGS. 18 and 19, the fourth metal wires 98*a*, 98*b*, 98*c*, and 98*d* are disposed and the groove-shaped fourth vias 99*a* to 99*d* are disposed so as to surround the fuse FU. Therefore, in the case where a wire is fused in the trimming region 105 in the fuse FU, the thermal diffusion path (indicated by the dashed arrows) of copper (Cu) exists only in a part. The length of the hatched diffusion path of copper (Cu) is sufficiently longer than the diffusion length of copper, and the influence on the other wires is sufficiently suppressed.

Each of the plurality of vias 134 and 137 provided for the bed wires 132 and 135, respectively, is provided to obtain electric coupling to an upper-layer wire. As the preventing wall, a groove-shaped via is used.

Figure 20:
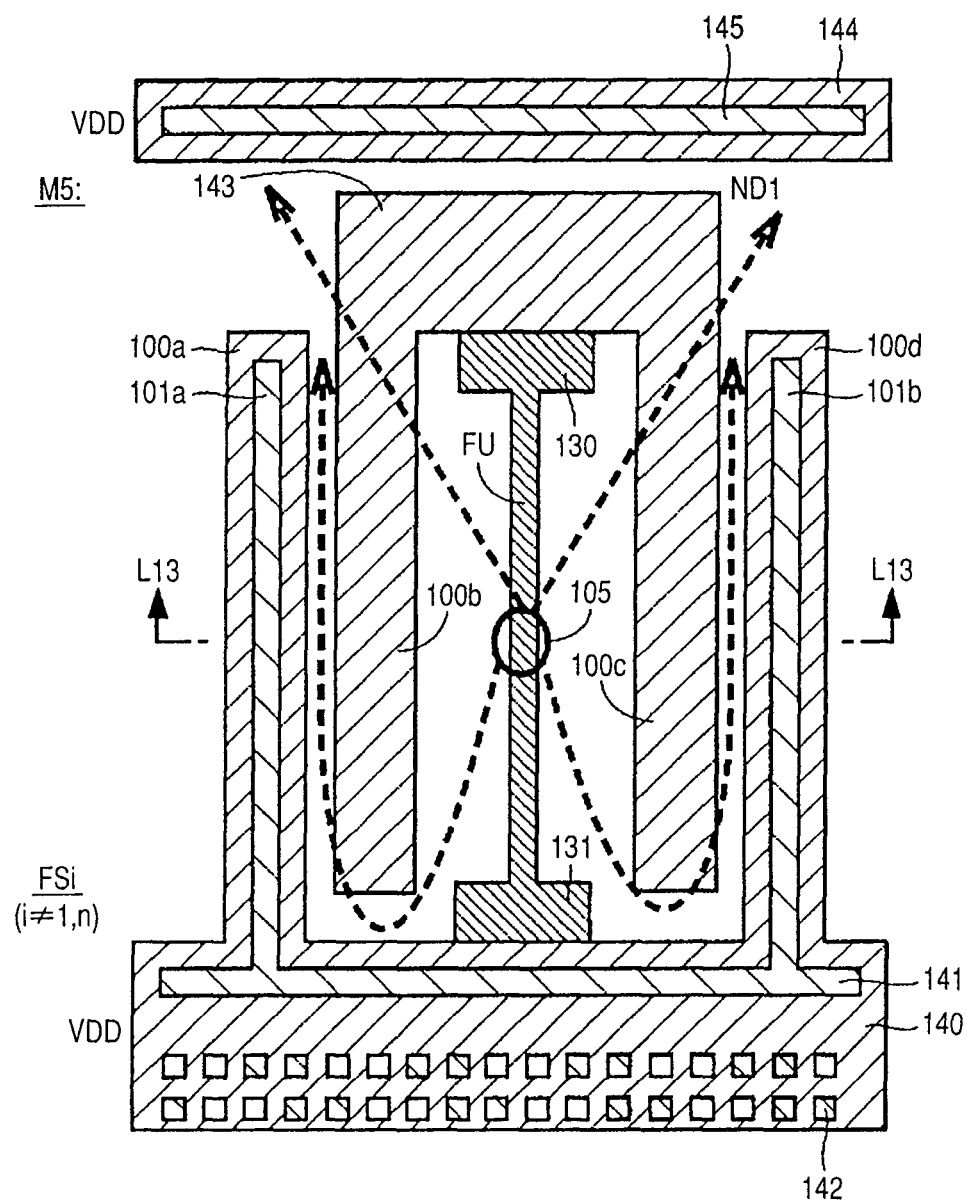
FIG. 20 is a diagram showing wiring layout of a fifth metal wiring layer as an upper layer of the planar layout illustrated in FIG. 18 together with layout of a via.

FIG. 20 is a diagram showing wiring layout of a fifth metal wiring layer M5 as an upper layer of the planar layout of the fuse element illustrated in FIG. 18. A sectional structure taken along line L13-L13 of FIG. 20 is the sectional structure of a layer lower than the fifth metal wiring layer shown in FIG. 13. In FIG. 20, the fifth metal wires 100*a* and 100*d* are disposed long in the vertical direction, and the groove-shaped fifth vias 101a and 101b continuously extend in the fifth metal wires 100a and 100d. For the fifth metal wires 100a and 100d, the fifth metal wire 140 which extends continuously in the lateral direction is disposed. In the fifth metal wire 140, the groove-shaped fifth via 141 is disposed so as to continuously extend. The fifth metal wires 100a and 100d are coupled to the fifth metal wire 140, and the groove-shaped fifth vias 101a and 101b are coupled to the groove-shaped fifth via 141. A plurality of fifth vias 142 as units for obtaining electric coupling to upper-layer wires are formed in the fifth metal wire 140.

The fifth metal wires 100a and 100d are electrically coupled to the fourth metal wires 98a and 98d shown in FIG. 18 via the groove-shaped fourth vias 99a and 99d. The fifth metal wire 140 is electrically coupled to the fourth metal wire 132 shown in FIG. 18 via the vias 133 and 134.

On the inside of the fifth metal wires 100a and 100d, the fifth metal wires 100b and 100c are disposed so as to linearly extend and surround the fuse FU. For the fifth metal wires 100b and 100c, a fifth metal bed wire 143 is disposed. The fifth metal bed wire 143 is electrically coupled to the fourth metal bed wire 135 shown in FIG. 18 via the vias 136 and 137 and disposed so as to align with each other.

A fifth metal wire 144 is formed so as to align with the fourth metal wire 138 shown in FIG. 18, and a groove-shaped fifth via 145 is formed in the fifth metal wire 144. The fifth metal wire 144 is electrically coupled to the fourth metal wire 138 shown in FIG. 18 via the groove-shaped fourth via 139.

Figure 21:
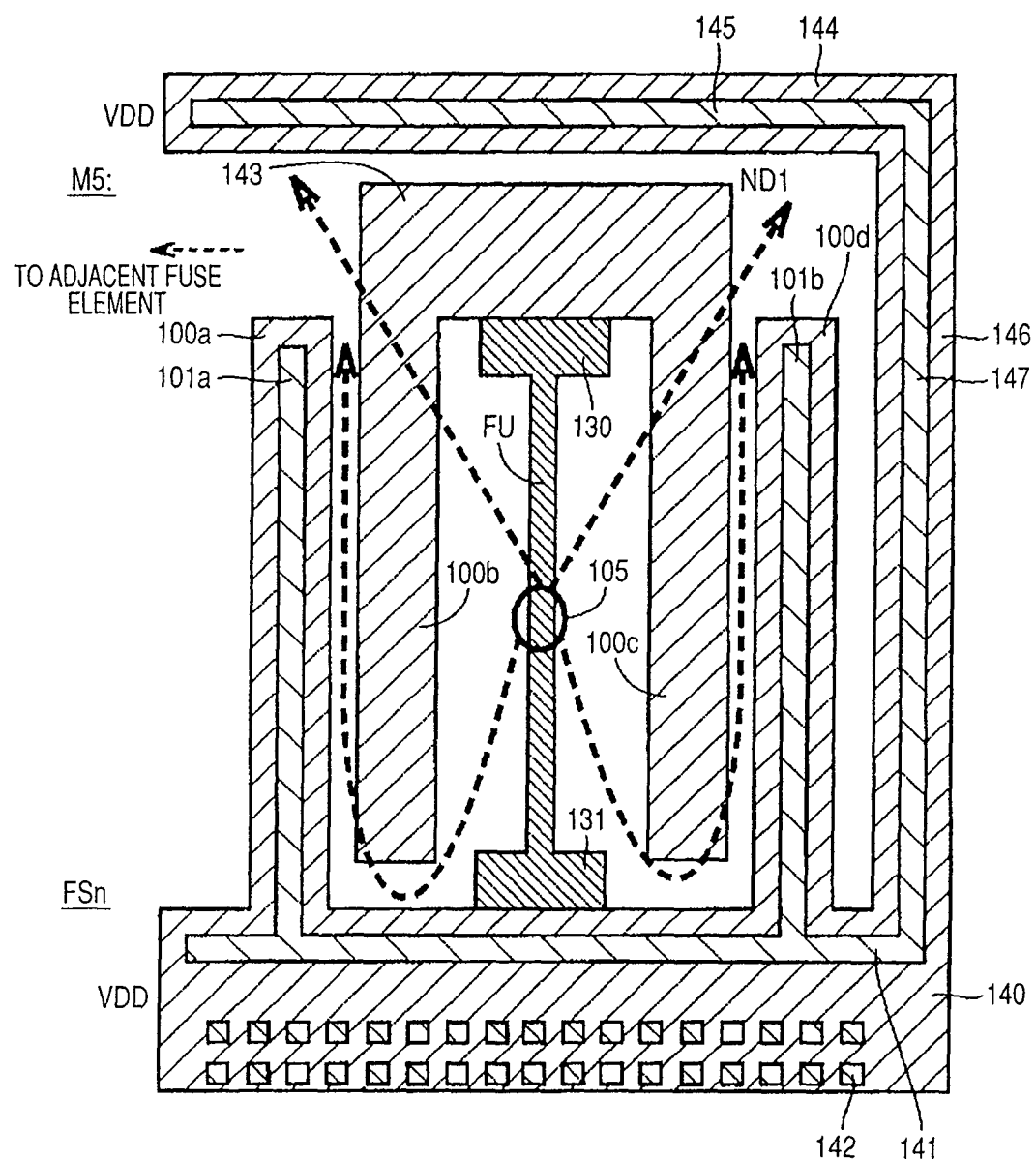
FIG. 21 is a diagram schematically showing layout of a wire and a via in the fifth metal wiring layer as an upper layer of the wiring layout illustrated in FIG. 19.

FIG. 21 is a diagram showing wiring layout of the fifth metal wiring layer of the fuse element FSn at an end of the fuse element sequence, which is the wiring layout of an upper layer of the wiring layer shown in FIG. 19. The wiring layout of the fuse element FSn at the end shown in FIG. 21 is different from that of the fuse element FSi shown in FIG. 20 with respect to the following points. In the fuse element FSn at an end of the fuse element sequence, a fifth metal wire 146 and a fifth groove-shaped via 147 which are long in the vertical direction are also formed. The fifth metal wire 146 is coupled to the fifth metal wires 144 and 140 extending continuously in the lateral direction, and the fifth via 147 is coupled to the groove-shaped fifth vias 145 and 141. Also in the fifth metal wiring layer M5, in the fuse element FSn at an end, the fifth metal wires 144 and 140 and the groove-shaped fifth vias 145 and 141 are terminated by the fifth metal wire 146 and the groove-shaped fifth via 147, thereby forming a diffusion preventing wall of the fuse box. The other disposition in the planar layout shown in FIG. 21 is the same as that in the planar layout shown in FIG. 20. In FIG. 21, the same reference numerals are designated to parts corresponding to those shown in FIG. 20 and the detailed description of the wiring layout of the fuse element FSn at the end will not be repeated.

As shown in FIGS. 20 and 21, in the case where the fuse FU is cut in the trimming region 105 in the fuse element FU and the copper thermal diffusion path exists as shown by the dashed arrows, the path in which copper atoms are thermally diffused from the trimming region 105 is blocked, and only the diffusion path between the fifth metal wires 100a and 100b and the diffusion path between the metal wires 100d and 100c exist. In this case as well, the distance from the fuse trimming region 105 to the thermal diffusion path is long, and the length of the copper diffusion path indicated by the dashed arrow is sufficiently longer than the copper thermal diffusion distance, so that diffusion of copper to an adjacent fuse element can be prevented.

Figure 22:
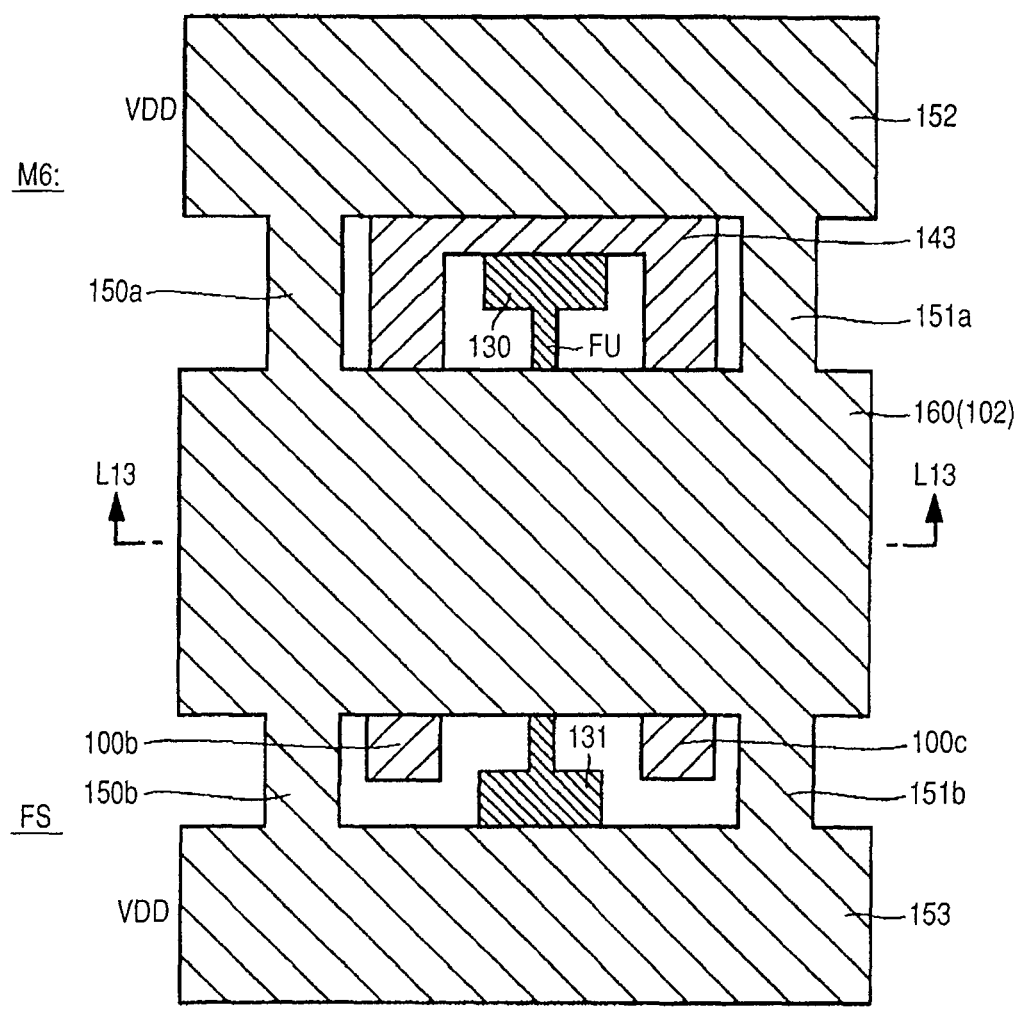
FIG. 22 is a diagram schematically showing layout of a sixth metal wiring layer as an upper layer in the wiring layout illustrated in FIGS. 20 and 21.

FIG. 22 is a diagram schematically showing wiring layout of a sixth metal wiring layer in the fuse element FS. In FIG. 22, in the sixth metal wiring layer M6, the fuse element FSn and the other fuse elements FSi have the same wiring layout, so that the fuse elements are represented by a fuse element FS in FIG. 22. FIG. 22 also shows the wiring layout of parts related to the fuse FU. The sectional structure taken along line L13-L13 of FIG. 22 corresponds to the sectional structure below the sixth metal wiring layer shown in FIG. 13.

In FIG. 22, a sixth metal wire 160 (102) is disposed above the fuse FU. The six metal wire 160 corresponds to the upper-part preventing wall wire 102 shown in FIG. 13. The sixth metal wire 160 (102) is formed by a wide solid wire so as to cover the trimming region of the fuse FU. The sixth metal wire 160 (102) is coupled to a sixth metal wire 152 via sixth metal wires 150a and 151a formed on the outside of the fifth metal wires 100b and 100c, and is also coupled to a sixth metal wire 153 formed continuously in the lateral direction via sixth metal wires 150b and 151b. The sixth metal wires 152 and 153 are wires that transmit the power supply voltage VDD. The sixth metal wires 150a and 150b are disposed so as to align the fifth metal wire 100a shown in FIG. 20, and the sixth metal wires 150a and 150b and the fifth metal wire 100a are electrically coupled to the groove-shaped fifth via 101a. The sixth metal wires 151a and 151b are disposed so as to align with the fifth metal wire 100b shown in FIG. 20, and the sixth metal wires 151a and 151b and the fifth metal wire 100a are electrically coupled via the groove-shaped fifth via 101b.

In the plane layout shown in FIG. 22, the sixth metal wires (power supply lines) 152 and 153 are disposed so as to continuously extend commonly to a plurality of fuse elements (FS0 to FSn), and the sixth metal wire 102 is also disposed commonly to a plurality of fuse elements.

In the planar layout shown in FIG. 20, a gap is created in a part of the bed wires 130 and 131 at both ends of the fuse element FU. However, the fuse element trimming region (which is not shown in FIG. 22) is covered with the sixth metal wire 102. In the case of cutting the fuse FU, there is a case such that a crack occurs so as to be apart from the fuse to the upper side of the fuse FU using, as start points, two points at corner parts of the fuse FU as a contact part between the fuse FU and the copper diffusion preventing film, and the interlayer film. The crack reaches the second metal wire 102. The copper metal enters the crack and it causes short circuit between the fuse FU and the sixth metal wire 102. At this time, the potential of the fuse FU becomes the power supply voltage VDD on the sixth metal wire 102, so that poor trimming can be detected by the cut determining circuit CJC, and a chip (semiconductor device) in which such a crack occurs can be eliminated as a defective before shipment of the product. To put it the other way around, if the fuse element trimming region is not covered with the sixth metal wire 102, a chip in which such a crack occurs and the copper metal enters the crack cannot be detected as a defective and is shipped as a product. In this case, the chip shipped as a product changes with time by a potential bias or heat accompanying the chip operation (actual operation of the semiconductor device), the copper metal which enters the crack is diffused to circuits in the periphery of the fuse element, and adverse influence is exerted on the chip.

Further, in the present invention, the metal wire disposed on the upper side of the fuse FU and closest to the fuse FU just above the fuse element trimming region is the sixth metal wire 102. To the sixth metal wire 102, the power supply voltage VDD is applied. In contrast, in the above-described patent document 1 (Japanese Unexamined Patent Application Publication No. 2007-317882), a voltage corresponding to the voltage of the node ND1 is applied to the metal wire disposed on the upper side of the fuse FU and closest to the fuse just above the fuse element trimming region. Therefore, in the case of cutting the fuse FU like in the present invention, when a crack occurs on the upper side and reaches the sixth metal wire 102, the copper metal enters the crack, and short circuit occurs between the fuse FU and the sixth metal wire, the following problems occur. That is, the potential of the fuse FU does not become the power supply voltage VDD like the voltage on the sixth metal wire, so that it is difficult to detect poor trimming by the cut determining circuit CJC. It becomes difficult to detect and eliminate such a chip as a defective before shipment of the chip. The present invention provides the layout such that a metal wire disposed just above the slim fuse FU and closest to the fuse FU is the sixth metal wire 102, and the power supply voltage VDD is supplied to the sixth metal wire 102.

In addition, the copper diffusion preventing film is provided also for the sixth metal wiring layer M6 and each of the fuses FU of the fuse elements (FS0 to FSn) is surrounded by the sixth metal wires 152, 151a, 150b, 151b, and 153, copper diffusion to the wire in the sixth metal wiring layer M6 via linear paths as shown by the dashed arrows in the planar layout of FIG. 20 is prevented from reaching circuits on the outside of the fuse elements (FS0 to FSn).

Further, a gap is formed in the part of the bed wires 130 and 131 at both ends of the fuse FU, so that the area of the sixth metal wire 102 can be sufficiently reduced, and adverse influence of dishing caused by CMP at the time of manufacture can be prevented.

In the case where the sixth metal wire (solid wire) 160 (102) shown in FIG. 20 is wide, a phenomenon such as dishing occurs at the time of CMP (Chemical Mechanical Polishing) of copper, and the film of copper becomes thin. Therefore, on the basis of the wire width determined by the design rule, the wire width by which wire resistance becomes sufficiently small without causing dishing is used.

Modification

Figure 23:
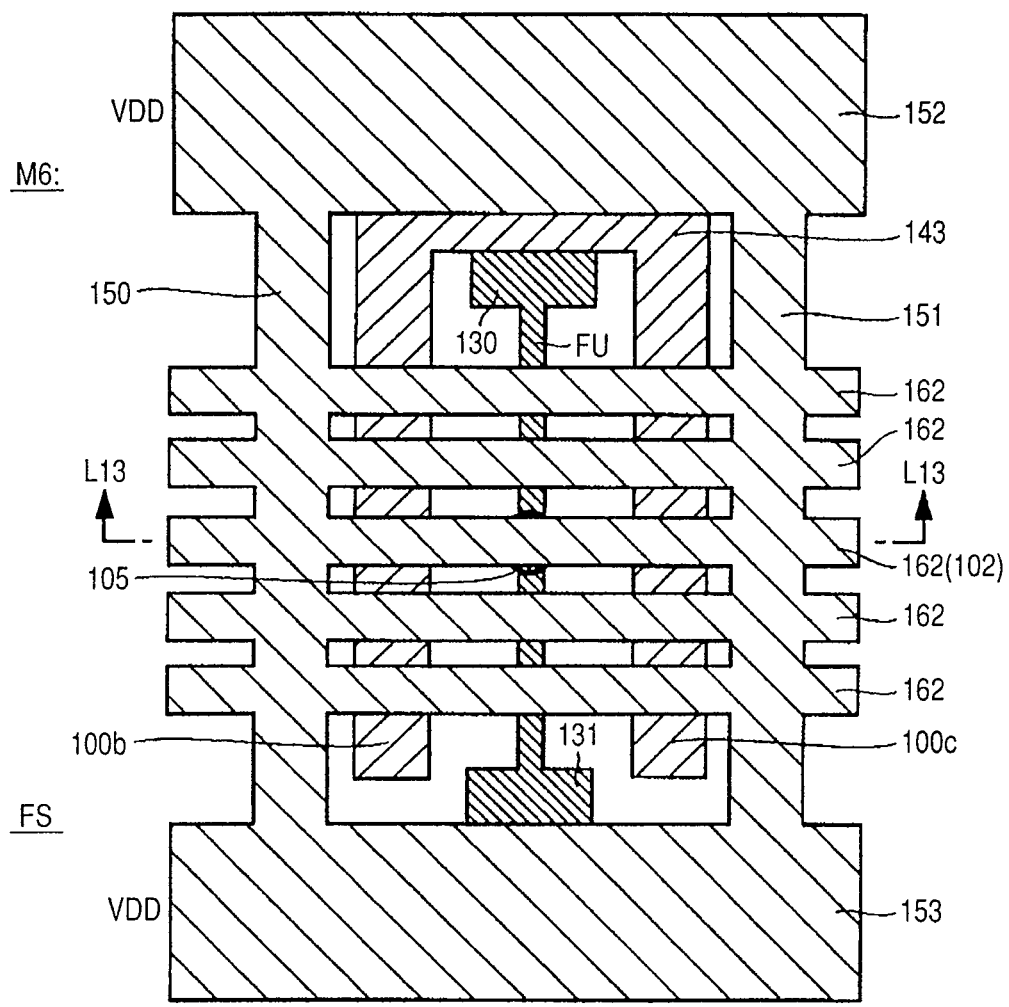
FIG. 23 is a diagram schematically showing wiring layout of the sixth metal wiring layer in a modification of the second embodiment of the invention.

FIG. 23 is a modification of the wiring layout of the sixth wiring layer M6 of the fuse element FS. In FIG. 23, in the part covering the fuse FU, a plurality of striped wires 162 are formed in place of the solid wire 160 are formed as the upper-part diffusion preventing wall wire 102. The striped six metal wires 162 are electrically coupled to the sixth metal wires (power supply lines) 152 and 153 disposed on both sides of the sixth metal wires 162 via the sixth metal wires 150 and 151.

The other wiring layout of the fuse element shown in FIG. 23 is the same as that of the fuse element FS shown in FIG. 22, and the same reference numerals are designated to corresponding parts, and their detailed description will not be repeated.

As shown in FIG. 23, even when the striped wires 162 are disposed just above the trimming region 105 of the fuse FU, the effect of preventing thermal diffusion of copper just above the fuse is the same as that of the solid wire 160 shown in FIG. 20. The thermal diffusion of copper to an adjacent fuse element is prevented by the groove-shaped vias 101a and 101b and the sixth metal wires 150a, 150b, 151a, and 151b, or the sixth metal wires 150 and 151 shown in FIGS. 20 and 21. It is sufficient to set the width of the striped sixth metal wire 162 to width by which the wiring resistance is reduced. As the shape of the sixth metal wire (preventing wall wire) just above the fuse FU shown in FIGS. 22 and 23, it is sufficient to use a pattern having a wire width with which dishing does not occur and realizing reduced wiring resistance.

The fuse element uses the wire in the sixth metal wiring layer as the uppermost layer wire that prevents thermal diffusion of copper at the time of cutting the fuse FU. Therefore, it is unnecessary to use a seventh metal wire, so that the number of wiring layers can be reduced. Since the number of wiring layers is reduced, the layout area of the part forming the preventing wall can be reduced, and the occupation area of the fuse element can be reduced.

Effects similar to those of the structure of the fuse element shown in FIG. 22 can be obtained.

Modification of Fuse Element

Figure 24:
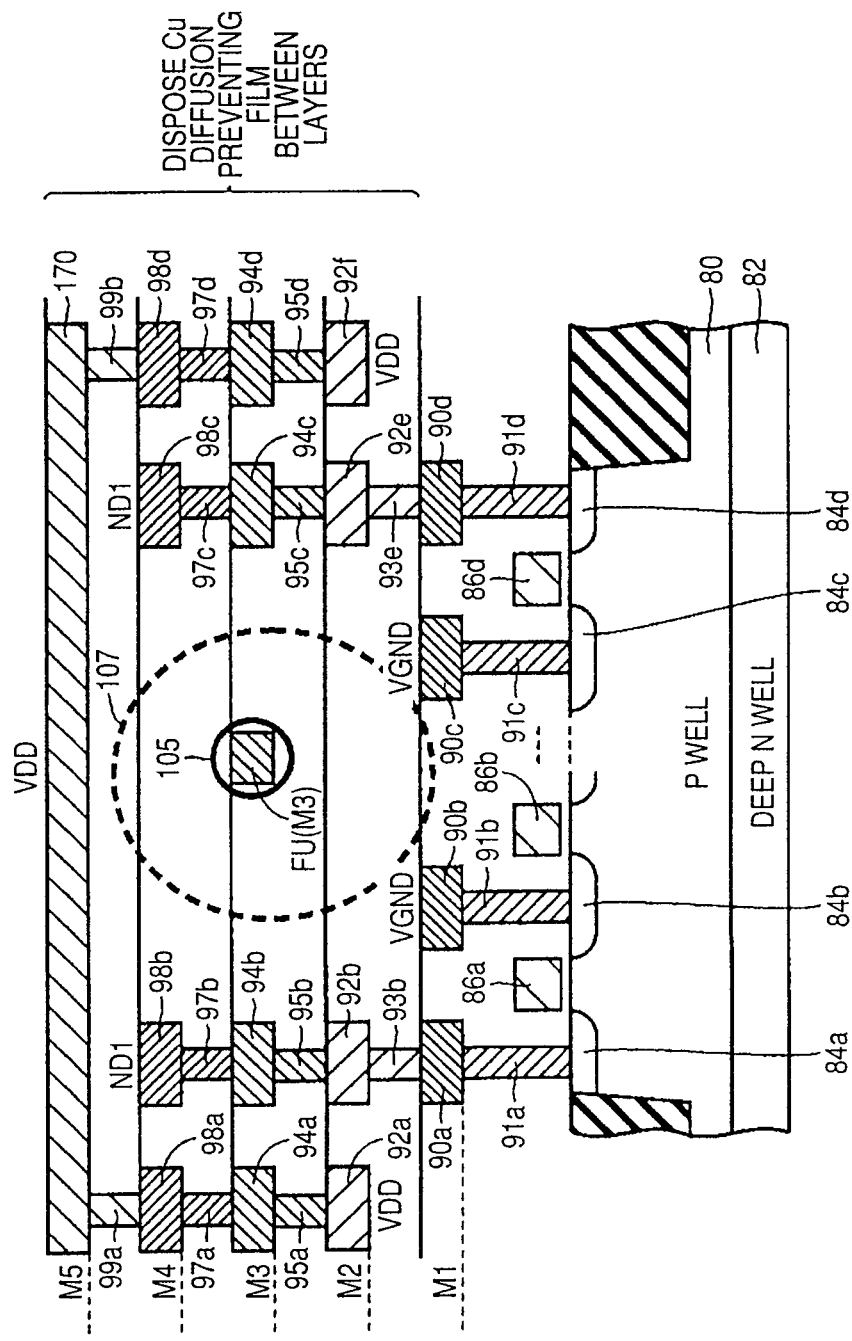
FIG. 24 is a diagram schematically showing a sectional structure of a fuse element of the modification of the second embodiment of the invention.

FIG. 24 is a diagram schematically showing a sectional structure of a modification of the fuse element according to the second embodiment of the invention. The fuse element FS shown in FIG. 24 has a structure different from that of the fuse element shown in FIG. 13 with respect to the following point. The first metal wires 90b and 90c in the first metal wiring layer M1 are coupled to the virtual ground line, and transmit the virtual ground voltage VGND. Above the first metal wires 90b and 90c, the second metal wires 92c and 92d shown in FIG. 13 are not disposed. In the third metal wiring layer M3, a fuse element FU (M3) is disposed. That is, the fuse is formed by the wire in the third metal wiring layer. In this case, in the fifth metal wiring layer M5, a power supply line 170 that transmits the power supply voltage VDD is disposed so as to cover the trimming region 105 in the fuse element FU. In the fourth metal wiring layer M4, the fourth metal wires 98b and 98c are coupled to the node ND1. In the planar layout, therefore, a wiring layer in which the global virtual ground line that transmits the virtual ground voltage VGND disposed on the outside of the fuse element and the global power supply line that is provided commonly for a plurality of fuse elements and transmits the power supply voltage VDD is disposed immediately below, and the second metal wires 92c, 92d, and 92x shown in FIG. 14 are not disposed.

The other configuration of the sectional structure of the fuse element shown in FIG. 24 is the same as that of the fuse element shown in FIG. 13, and the same reference numerals are designated to corresponding parts and their detailed description will not be repeated.

Also in the configuration shown in FIG. 24, although the damage region 107 exists in the trimming region 105 of the fuse element FU(M3), the damage region 107 is a copper (Cu) atoms diffusion region and a region in which the interlayer insulating film may deteriorate due to heat generated at the time of copper fusing. However, also in the configuration shown in FIG. 24, there is a gap of the amount of at least two wiring layers just above and just below the fuse element FU (M3), and wiring short-circuit or the like caused by thermal diffusion of copper atoms is suppressed. A copper diffusion preventing film is continuously formed from the power supply line (fifth metal wire) 170 at the top, a diffusion preventing film is formed by the fourth metal wire extending from the substrate region toward the power supply line, and a preventing wall structure which completely prevents copper diffusion at the time of cutting the fuse element FU (M3) is realized. In this case, only the wires to the fifth metal wiring layer are used, so that the number of wiring layers used can be reduced. The layout area of the fuse element can be reduced, the sixth metal wiring layer as the uppermost layer can be used for another wire, and the flexibility of wiring improves.

The fuse element trimming region is covered with the fifth metal wire 170. In the case of cutting the fuse FU, there is a case where a crack occurs so as to be apart from the fuse to the upper side of the fuse FU using, as start points, two points at corner parts of the fuse FU as a contact part between the fuse FU, the copper diffusion preventing film, and the interlayer film (interlayer insulating film) and the crack reaches the fifth metal wire 170. The copper metal enters the crack and it causes short circuit between the fuse FU and the fifth metal wire 170. At this time, the potential of the fuse FU becomes the power supply voltage VDD on the fifth metal wire 170. Accordingly, poor trimming can be detected by the cut determining circuit CJC, and a chip (semiconductor device) can be detected and eliminated as a defective before shipment of the product. In the embodiment of the invention, the metal wire disposed on the upper side of the fuse FU just above the slim fuse FU and closest to the fuse FU is the fifth metal wire 170, and the layout structure to which the power supply voltage VDD is supplied is obtained.

Figure 25:
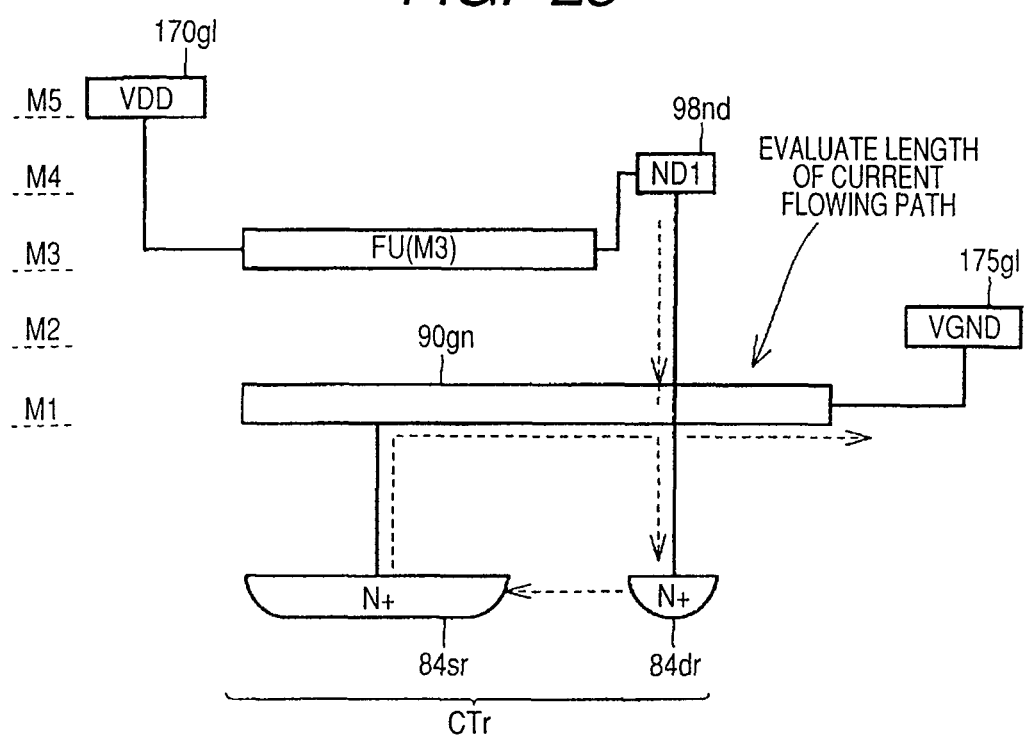
FIG. 25 is a diagram schematically showing a path in which fusing current flows at the time of using a fuse element illustrated in FIG. 24.

FIG. 25 is a diagram schematically showing a connection mode of a power supply at the time of cutting a fuse in a fuse element illustrated in FIG. 24. In the fifth metal wiring layer M5, a global power supply line 170g1 that transmits the power supply voltage VDD is disposed in the fifth metal wiring layer M5, and one end of the fuse element FU (M3) formed in the third metal wiring layer M3 is coupled to the global power supply line 170g1 via an intermediate wire and a via. On the other hand, the other end of the fuse element FU (M3) is coupled to a node bed wire 98nd formed in the fourth metal wiring layer M4. The node bed wire 98nd is coupled to a node pad wire (not shown in FIG. 24) to which the fourth metal wires 98b and 98c shown in FIG. 24 are coupled. The node bed wire 98nd is coupled to a drain impurity region 84dr formed in the substrate region in a lower layer. In the surface of the substrate region, a source impurity region 84sr is disposed in parallel with the impurity region 84dr. Although the impurity regions 84sr and 84dr are disposed in parallel with each other, in FIG. 25, they are shown as if they were disposed adjacent to each other in order to clarify the current flowing path.

The source impurity region 84sr corresponds to the impurity region of a unit transistor in the fusing current supply transistor CTr and has an elongated shape so as to roughly correspond to the second metal wire 92c shown in FIG. 14. A local ground wire 90gn is disposed in the first metal wiring layer M1 in parallel with the source impurity region 84sr. The local ground wire 90gn corresponds to the first metal wires 90b and 90c shown in FIG. 24.

The local ground wire 90gn is coupled to a global virtual ground line 175glg formed in the second metal wiring layer M2 and receives the virtual ground voltage VGND. At the time of cutting the fuse, current flows from the global power supply line 170gl to the global virtual ground wire 175gl via the fuse FU (M3), the node bed wire 98nd, the drain impurity region 84dr, the source impurity region 84sr, and the local ground wire 90gn. The electric characteristic of the metal wire in the first metal wiring layer M1 is inferior to that of the metal wire in the second metal wiring layer M2 (the impurity concentration is set to be high in order to enhance stress tolerance). The copper electromigration tolerance of the metal wire 90gn when the fusing current flows in the first metal wiring layer M1 is lower than that of the metal wiring layer in the second metal wiring layer. Therefore, since large fusing current flows via the fusing current supply transistor CTr at the time of cutting the fuse element, there is the possibility that large current flows in the local ground wire 90gn, and the wire is cut by electromigration. Therefore, in the case of using the structure shown in FIG. 24, the electromigration resistance of the local ground wire 90gn (the first metal wires 90b and 90c in FIG. 24) in the first metal wiring layer M1 is evaluated accurately, the length of the wire is estimated, and it is necessary to assure that there is no possibility that the current path extending from the global virtual ground wire 175g1 to the fuse FU (M3) is not cut by the electromigration resistance in the first metal wire (90gn).

As described above, according to the second embodiment of the invention, a wire is disposed just above or just below the fuse at an interval of at least two wiring layers, the copper diffusion preventing wall structure of the fuse is disposed, and the wire that transmits the power supply voltage is mounted as the wire in a layer just above the fuse. With the configuration, the number of wiring layers required to form a fuse element can be reduced. Accordingly, the layout area for realizing the preventing wall structure is reduced, and the number of manufacturing processes can be decreased.

The preventing wall structure is configured by a first preventing wall extending from the power supply line in the uppermost layer toward the substrate and a second preventing wall extending in the power supply direction from the substrate, and a second preventing wall structure is formed in the first preventing wall. With the configuration, the thermal diffusion path of copper (Cu) at the time of cutting the fuse can be reliably blocked, the influence such as wiring short-circuit of the fuse cut can be reliably prevented, and a fuse element capable of accurately programming can be realized.

Third Embodiment

Figure 26:
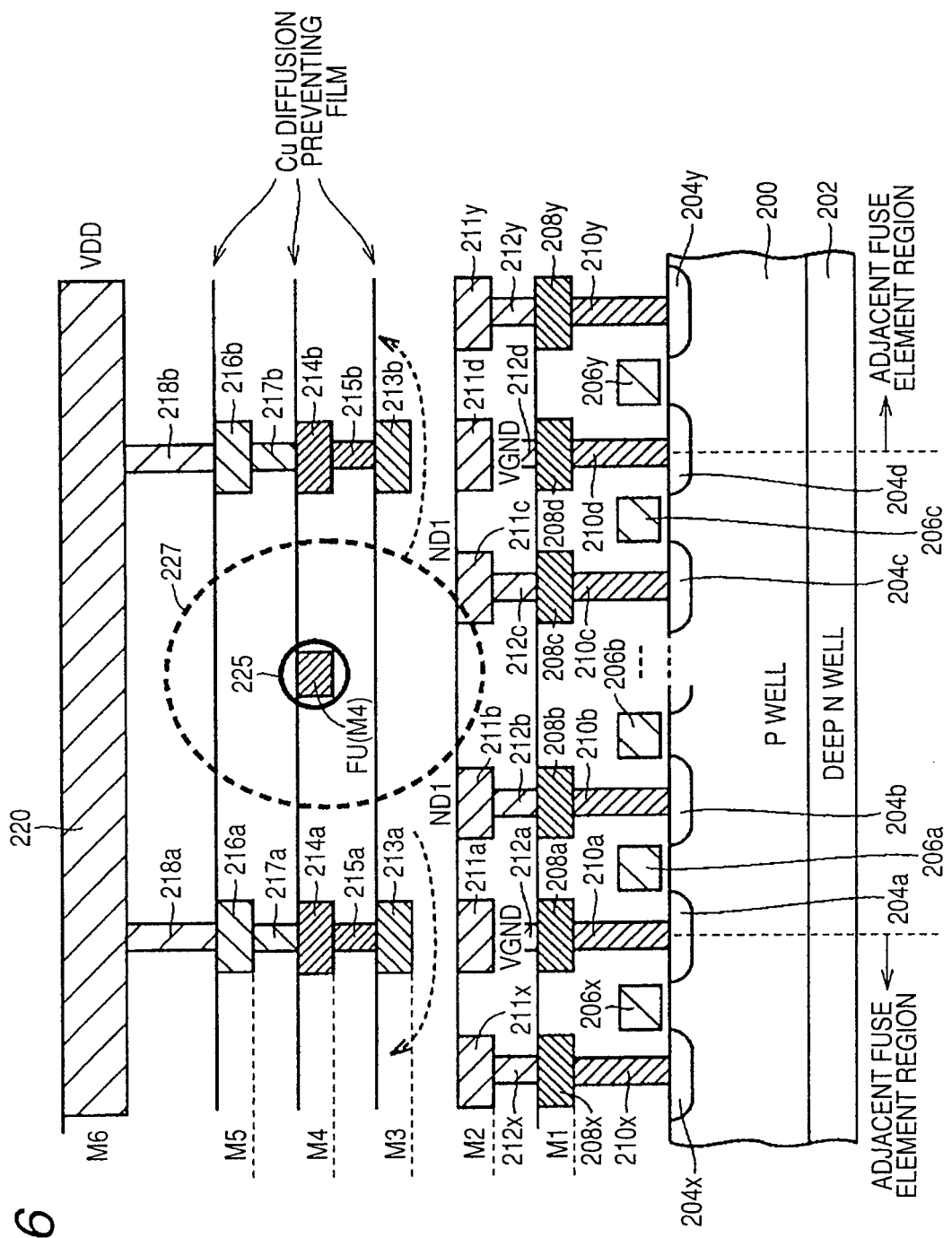
FIG. 26 is a diagram schematically showing a sectional structure of a fuse element according to a third embodiment of the invention.

FIG. 26 is a diagram schematically showing a sectional structure of a fuse element according to a third embodiment of the invention. In FIG. 26, a deep N well 202 is provided below a P well 200. The P well 200 and the deep N well 202 are disposed commonly to a fuse element in a fuse box. The fuse box refers to a region in which a plurality of fuse elements are aligned.

In the surface of the P well 200, active regions (N-type impurity regions) 204a to 204d are disposed at intervals. Active regions 204x and 204y are disposed in adjacent fuse element regions. The impurity regions 204 and 204d are shared by fusing current supply transistors for the fuse elements included in the adjacent fuse program circuits.

In the surface of the P well 200, gate electrode wires 206a, 206b, and 206c are disposed via a gate insulating film between the impurity regions 204a and 204b, between the impurity regions 204b and 204c, and between the impurity regions 204c and 204d. Also in the adjacent fuse element region, a gate electrode wire 206x is disposed above a region between the impurity regions 204x and 204a. Above a region between the impurity regions 204d and 204y, a gate electrode wire 206y is disposed.

First metal wires 208a to 208d, 208x, and 208y in the first metal wiring layer M1 are disposed in correspondence with the impurity regions 204a to 204d, 204x, and 204y, respectively. The first metal wires 208a to 208d, 208x, and 208y are coupled to the corresponding impurity regions 204a to 204d, 204x, and 204y via contacts 210a to 210d, 210x, and 210y, respectively.

In the second metal wiring layer M2, second metal wires 211a to 211d, 211x, and 211y are disposed in correspondence with the first metal wires 208a to 208d, 208x, and 208y, respectively. The second metal wires 211a to 211d, 211x, and 211y are coupled to the corresponding metal wires 208a to 208d, 208x, and 208y in a lower layer via first groove-shaped vias 212a to 212d, 212x, and 212y, respectively. The second metal wires 211a and 211b are coupled to the virtual ground line and transmit the virtual ground voltage VGND. The second metal wires 211b and 211c are coupled to the node ND1.

In the third metal wiring layer M3, third metal wires 213a and 213b are disposed in correspondence with the second metal wires 211a and 211d, respectively. No vias are formed below the third metal wires 213a and 213b, and a gap exists between the second metal wires 211a and 211d and the third metal wires 213a and 213b.

In the fourth metal layer M4, fourth metal wires 214a and 214b are disposed in correspondence with the third metal wires 213a and 213b, respectively, and are electrically coupled to the corresponding third metal wires 213a and 213b via third groove-shaped vias 215a and 215b, respectively.

By using the fourth metal wiring layer M4, a fuse FU (M4) is formed between the fourth metal wires 214a and 214b. A sufficient distance is assured between the fuse FU (M4) and each of the fourth metal wires 214a and 214b.

In the fifth metal wiring layer M5, fifth metal wires 216a and 216b are disposed in correspondence with the fourth metal wires 214a and 214b, and are electrically coupled to the corresponding fourth metal wires 214a and 214b via fourth groove-shaped vias 217a and 217b, respectively.

Fifth groove-shaped vias 218a and 218b are disposed in correspondence with the fifth metal wires 216a and 216b, respectively. The fifth vias 218a and 218b are electrically coupled to a power supply wire 220 in the sixth metal wiring layer M6. The power supply line configured by the sixth metal wire 220 is disposed commonly for a plurality of fuse elements and so as to cover a fuse trimming region 225, and functions as an upper-part diffusion preventing wall wire for fuses.

In the configuration shown in FIG. 26, a damage region 227 exists with the trimming region 225 of the fuse FU (M4) as a center. The damage region 227 is heated to the melting point of copper or higher at the time of fusing copper (Cu) as the material of the fuse FU (M4). Consequently, the damage region 227 has the possibility that deterioration occurs due to the influence of the heating. For an interlayer insulating film of metal wiring layers, a copper diffusion preventing film is disposed.

Also in the configuration shown in FIG. 26, a diffusion preventing film for copper (Cu) of the fuse FU (M4) is formed by using the wires in the third to sixth metal wiring layers, thereby realizing the copper diffusion preventing wall structure.

In the configuration shown in FIG. 26, the second metal wires 211b and 211c are coupled to the nodes ND1. Consequently, the distance between the fuse FU (M4) and each of the second metal wires 211b and 211c can be made sufficiently long. It is unnecessary to dispose the node ND1 in the fourth or fifth metal wiring layer as an upper layer, it is unnecessary to assure a space in which a wire and a via for extending the node ND1 are disposed, and the layout area of the fuse can be reduced.

With respect to thermal diffusion of copper at the time of cutting the fuse FU (M4), a copper diffusion path in the horizontal direction in the configuration shown in FIG. 26 can be blocked by the preventing wall structure.

Since a gap exists below the wires 213a and 213b in the third metal wiring layer M3, there is the possibility that copper (Cu) thermally diffuses in the region. However, in this case, by assuring a sufficiently long distance between each of the third metal wires 213a and 213b and the trimming region 225 of the fuse FU (M4) in consideration of the thermal diffusion distance of copper, thermal diffusion of copper shown by broken lines in FIG. 26 to adjacent fuses can be prevented.

Particularly, the wires in the fuse box are maintained at the same potential as that of the power supply voltage VDD level in the circuit (refer to the first embodiment). Consequently, the copper thermal diffusion distance can be set to a sufficiently short distance, and thermal diffusion of copper to adjacent fuse element regions can be reliably suppressed.

Figure 27:
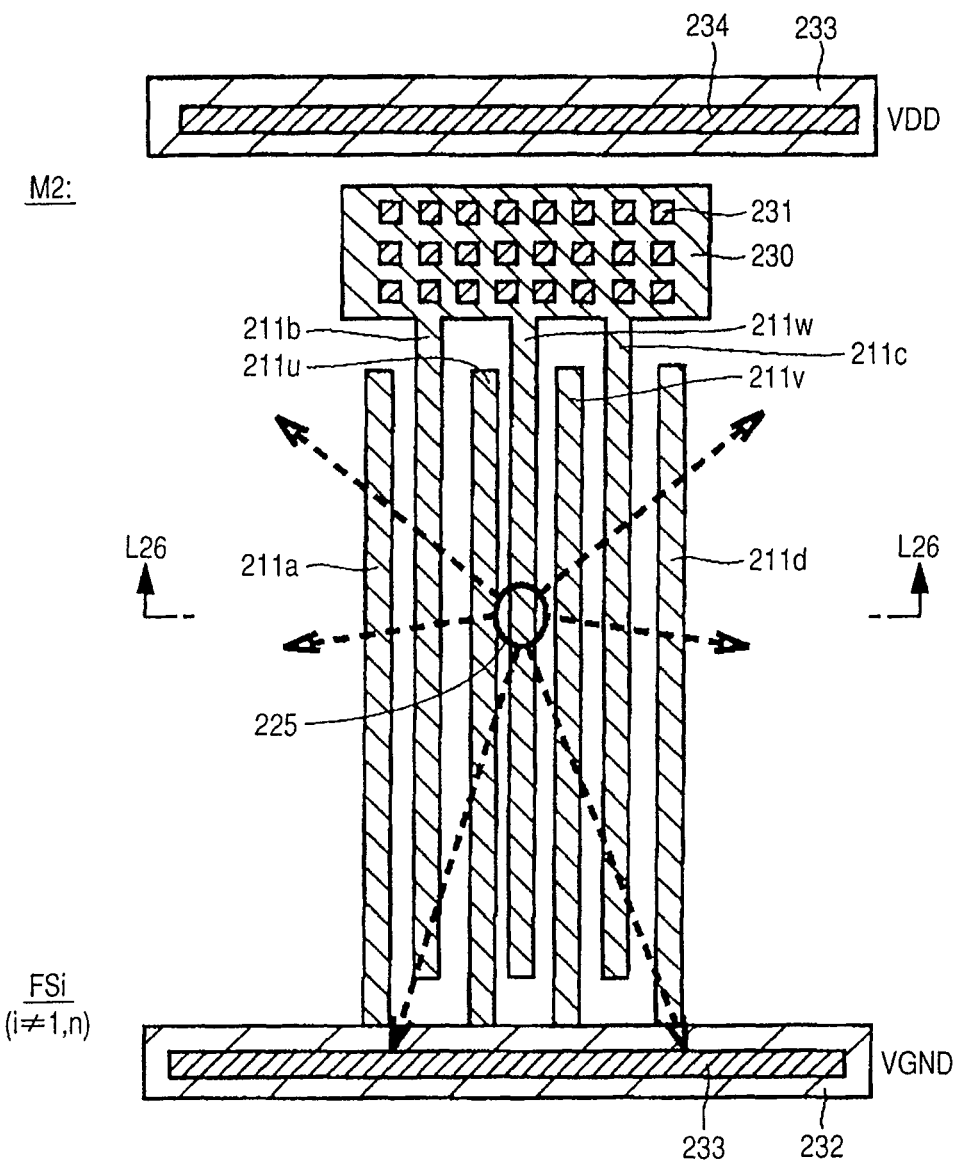
FIG. 27 is a diagram schematically showing planar layout of a second metal wiring layer of a fuse element illustrated in FIG. 26.

FIG. 27 is a diagram schematically showing planar layout of a second metal wiring layer and a second via of the fuse element FSi illustrated in FIG. 26. The fuse element is a fuse disposed in the fuse box. A sectional structure taken along line L26-L26 of FIG. 27 corresponds to the sectional structure shown in FIG. 26. In the following, also in FIGS. 28 to 36, sectional structures taken along line L26-L26 correspond to the sectional structure of FIG. 26.

In FIG. 27, in the second metal wiring layer M4, the second metal wires 211a and 2113 which are long in the longitudinal direction are disposed on the outermost sides, and the first metal wires 211b and 211c are disposed on the inside of the second metal wires 211a and 211d. FIG. 27 also shows second metal wires 211u, 211v, and 211w disposed in impurity regions hatched in FIG. 26. The second metal wires 211b, 211c, and 211w are coupled to a second metal pad wire 230 having a rectangular shape. On the other hand, the second metal wires 211a, 211d, 211u, and 211v are coupled to a second metal wire 232 extending in the lateral direction.

The second metal wire 232 is coupled to the virtual ground line and transmits the virtual ground voltage VGND. In the surface of the second metal wire 232, a groove-shaped second via 233 is formed. On the other hand, in the second metal pad wire 230, a plurality of unit vias 231 are aligned. The second vias 231 are provided for electric coupling to an upper-layer wire and do not have a purpose of preventing diffusion of copper.

On the outside of the second metal pad wire 230, the second metal wires 233 extending continuously in the lateral direction are provided. The second metal wires 233 supply the power supply voltage VDD. In the second metal wire 233, a groove-shaped second via 234 is disposed. The second metal wire 233 and the groove-shaped second via 234 may be disposed in correspondence with each fuse element formation region or may be formed so as to continuously extend along a plurality of fuse element formation regions.

Figure 28:
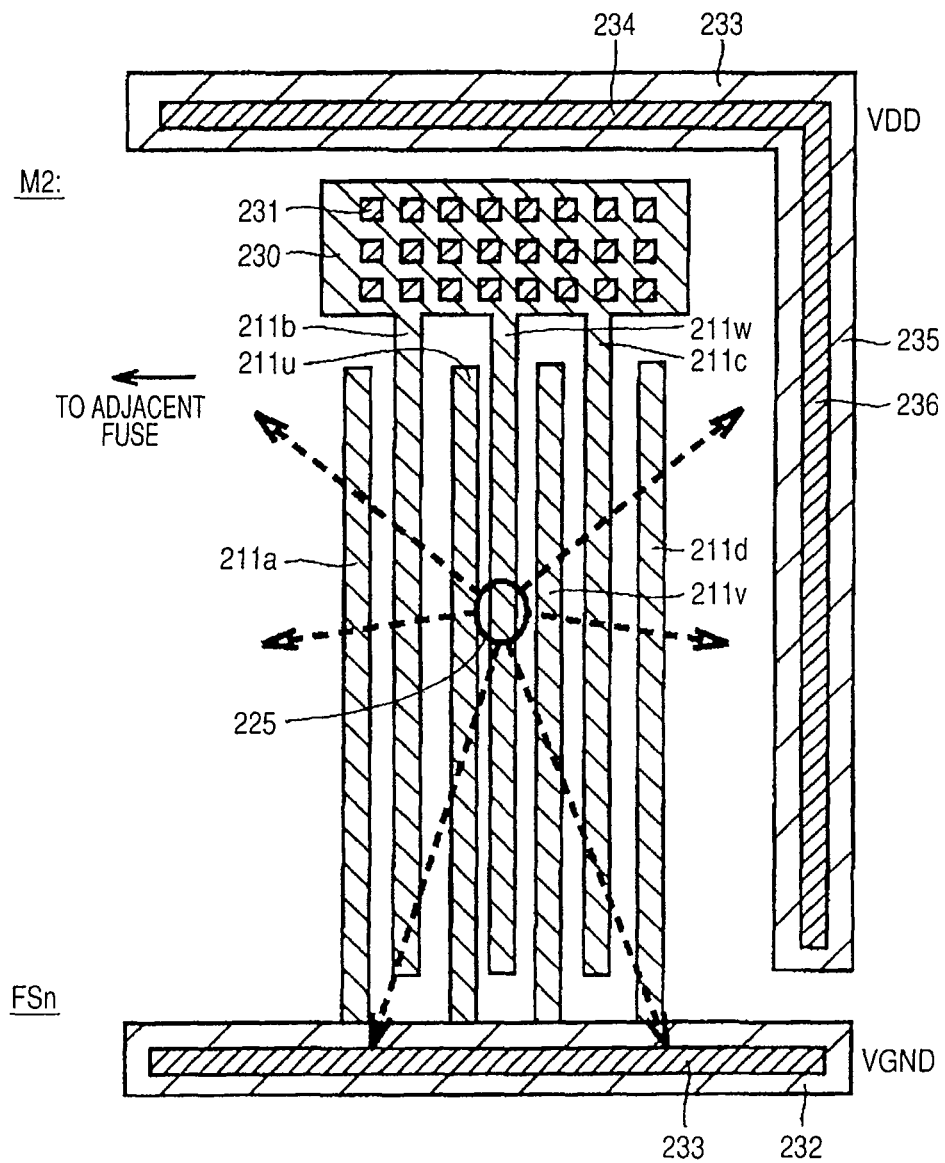
FIG. 28 is a diagram schematically showing wiring layout of the second metal wiring layer of a fuse element at an end of a fuse program circuit.

FIG. 28 is a diagram showing wiring layout of the second metal wiring layer of the fuse element FSn at an end of the plurality of fuses FS0 to FSn in the fuse box. The planar layout of the fuse element FSn is different from that of the fuse element FS1 shown in FIG. 27 with respect to the following points. A second metal wire 235 which is long in the vertical direction is formed, and a groove-shaped second via 236 is provided in the surface of the second metal wire 235. The second metal wire 235 is coupled to the second metal wire 233, and the groove-shaped second via 236 is coupled to the groove-shaped second via 234. In this case, the second metal wire 235 transmits the power supply voltage VDD and the second metal wire 232 transmits the virtual ground voltage VGND, so that a gap exists between the second metal wires 235 and 232.

As shown in FIGS. 27 and 28, the thermal diffusion paths (indicated by broken lines in FIGS. 27 and 28) of copper from the trimming region (fuse cut region) 225 are reliably blocked by the second metal wires, and thermal diffusion of copper to the outside of the fuse box is reliably suppressed by the second metal wires 232, 233, and 235 and the groove-shaped second vias 233, 234, and 246.

In the fuse element FSn at the end shown in FIG. 28, there is the possibility that a gap exists between the second metal wires 235 and 232 and copper diffuses to the outside of the fuse box. However, by setting the distance between the fuse trimming region 225 and the gap region to be larger than the copper thermal diffusion distance, thermal diffusion of copper to the outside of the fuse box can be reliably suppressed.

Also in deposition shown in FIGS. 27 and 28, a transistor element other than the fusing current supply transistor of the fuse program circuit is disposed in the region outside of the second metal wire 232 of the fuse, so that thermal diffusion of copper to the wire for disposing those transistor elements is prevented reliably.

Figure 29:
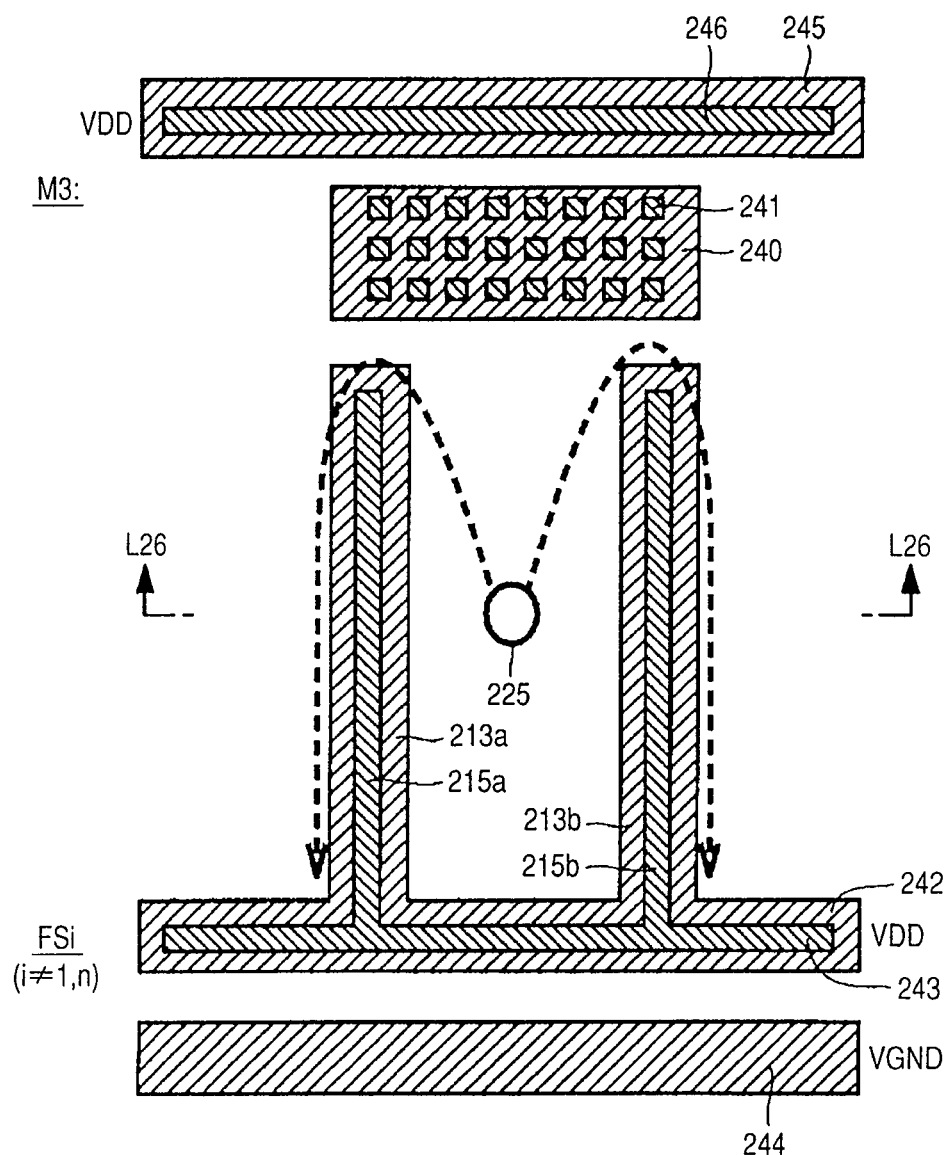
FIG. 29 is a diagram schematically showing layout of a third metal wiring layer and a third via in an upper layer of the planar layout illustrated in FIG. 27.

FIG. 29 is a diagram schematically showing planar layout of the third metal wiring layer M3 and the third via in the fuse element FSi illustrated in FIG. 26. FIG. 29 also shows the line L26-L26 along which the sectional structure of FIG. 26 is taken.

In FIG. 29, the third metal wires 213a and 213b are formed long in the vertical direction, and the groove-shaped third vias 215a and 215b are formed long in the surface of the third metal wires 231a and 213b, respectively. A third metal wire 242 extending continuously in the lateral direction is formed for the third metal wires 213a and 213b, and a groove-shaped third via 243 is formed in the third metal wire 242 in correspondence with the fuse element FSi. The third metal wire 242 transmits the power supply voltage VDD and is coupled to the third metal wires 213a and 213b. The groove-shaped third via 243 is coupled to the third groove-shaped vias 215a and 215b. The third metal wire 242 is disposed in an inner region closer to the fuse than the region in which the second metal wire 232 shown in FIG. 26 is disposed.

On the other hand, a third metal node bed wire 240 is disposed in correspondence with the second metal pad wire 231 shown in FIG. 27. In the third metal bed wire 240, a plurality of unit third vias 241 for obtaining electric coupling to upper wires are aligned.

On the outside of the third metal wire 242, a third metal wire 244 is disposed in correspondence with the second metal wire 232, and a groove-shaped third via is disposed in the surface of the third metal wire 244. On the outside of the third metal pad wire 240, a third metal wire 245 is disposed in correspondence with the second metal wire 233 shown in FIG. 26, and a groove-shaped third via 246 is disposed in the surface of the third metal wire 245 in correspondence with the groove-shaped second via 234 shown in FIG. 26. The third metal wire 245 transmits the power supply voltage VDD, and the third metal wire 244 is coupled to the virtual ground line and transmits the virtual ground voltage VGND.

Figure 30:
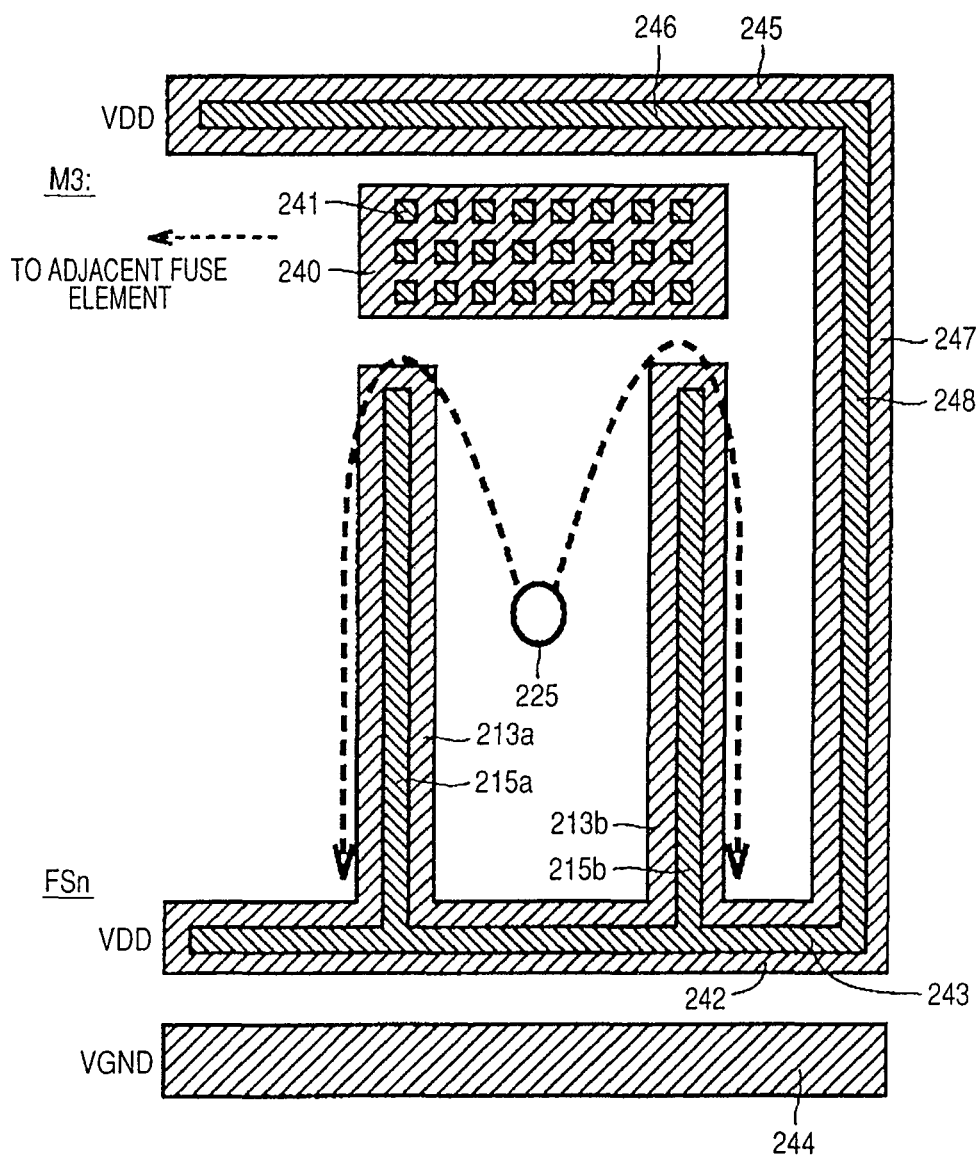
FIG. 30 is a diagram schematically showing planar layout of the third metal wiring layer and the third via in an upper layer of the wiring layer illustrated in FIG. 28.

FIG. 30 is a diagram schematically showing planar layout of the third metal wiring layer M3 of the fuse element FSn at the end of the fuse box. The planar layout of the fuse element FSn shown in FIG. 30 is different from that of the fuse element shown in FIG. 29 with respect to the following point. A third metal wire 247 which is long in the vertical direction is disposed at an end of the fuse box, and a groove-shaped third via 248 which is long in the vertical direction is also formed. The third metal wire 247 is coupled to the third metal wires 245 and 242, and the groove-shaped third via 248 is coupled to the groove-shaped third vias 246 and 243. Therefore, at the end of the fuse box, the copper diffusion preventing wall having no gap is reliably formed by the third metal wires 245, 247, and 242 and the groove-shaped third vias 246, 248, and 243, and thermal diffusion of copper to the outside of the fuse box is suppressed. The other layout of the fuse element FSn shown in FIG. 30 is the same as that of the fuse element FSi shown in FIG. 29, the same reference numerals are designated to corresponding parts, and their detailed description will not be repeated.

As shown in FIGS. 29 and 30, the propagation paths of copper atoms from the fuse trimming region 225 extend only in the gap region between the third metal wires 213a and 213b and the third metal pad wire 240, as indicated by dashed arrows. In the case of this layout, although there is the possibility of thermal diffusion of copper atoms to an adjacent fuse element, thermal diffusion of copper atoms to the outside of the fuse box is reliably suppressed. Since the internal wires are usually maintained at the same voltage (power supply voltage VDD) in the fuse box (refer to the first embodiment), the copper thermal diffusion distance is sufficiently short, and its influence can be mostly suppressed.

Figure 31:
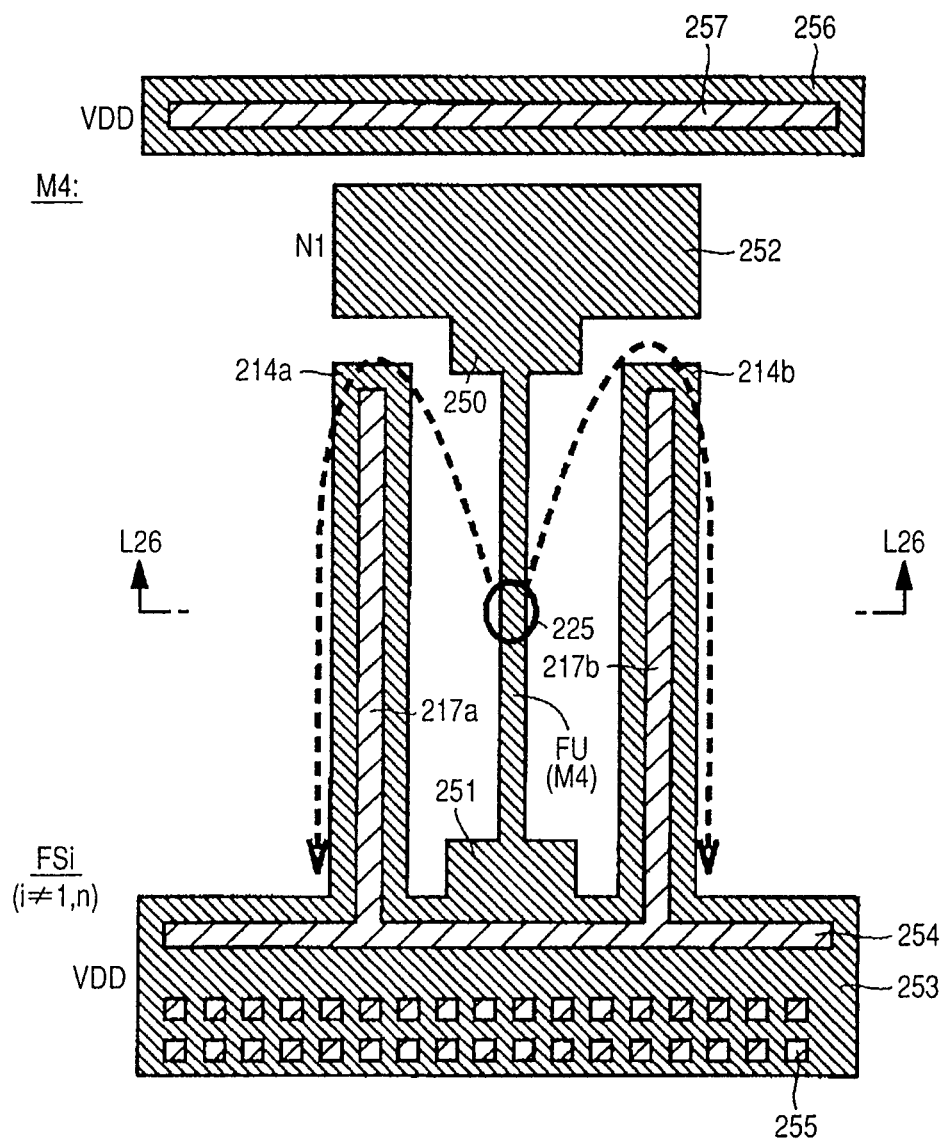
FIG. 31 is a diagram schematically showing planar layout of a fourth metal wiring layer as an upper layer of the planar layout illustrated in FIG. 29.

FIG. 31 is a diagram schematically showing planar layout of the fourth metal wiring layer M4 and the fourth via of the fuse element FSi illustrated in FIG. 26. FIG. 31 also shows the line L26-L26 along which the sectional structure of the fuse element shown in FIG. 26 is taken.

In FIG. 31, the fourth metal wires 214a and 214b are formed long in the vertical direction, and the groove-shaped fourth vias 217a and 217b are formed so as to continuously extend in the fuse element formation region, in the surface of the fourth metal wires 214a and 214b, respectively. A fuse FU (M4) formed by the fourth metal wire is disposed between the fourth metal wires 214a and 214b. At both ends of the fuse FU (M4), fourth metal pad wires 250 and 251 are formed. By the wide pad wires 250 and 251, occurrence of current concentration on the fuse FU (M4) at the time of cutting is suppressed.

A fifth metal bed wire 252 is disposed in correspondence with the third metal bed wire 241 shown in FIG. 29 adjacent to the fourth metal pad wire 250, and the pad wire 250 and the bed wire 252 are coupled to each other. On the other hand, a fourth metal wire 253 which continuously extends in the lateral direction is disposed in contact with the fourth metal wires 214a and 214b and the fourth metal pad wire 251. A groove-shaped fourth via 254 is formed in the surface of the fourth metal wire 253. The fifth metal wires 214a and 214b and the pad wire 251 are coupled to the fourth metal wire 253, and the groove-shaped fourth via 254 is coupled to the fourth vias 217a and 217b. The fourth metal wire 253 is disposed commonly for a plurality of fuse elements, and is electrically coupled to a wire in an upper layer via a plurality of unit fourth vias 255 formed in the surface.

In a region on the outside of the bed wire 252, a fourth metal wire 256 which extends continuously in the lateral direction in correspondence with the third metal wire 245 shown in FIG. 29 is disposed, and a groove-shaped fourth via 257 is formed in the surface of the fourth metal wire 256. The fourth metal wires 253 and 256 transmit the power supply voltage VDD.

Figure 32:
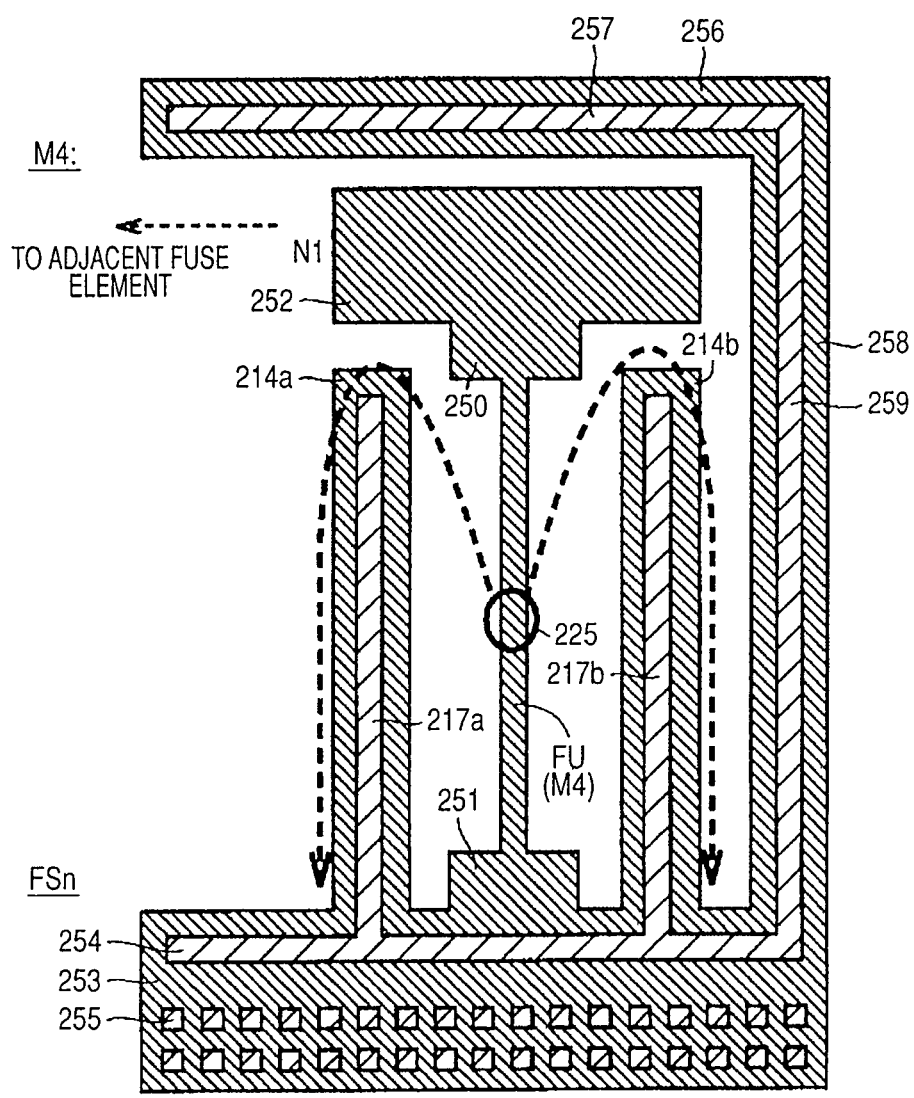
FIG. 32 is a diagram schematically showing planar layout of the fourth metal wiring layer and a fourth via as an upper layer of the wiring layer illustrated in FIG. 30.

FIG. 32 is a diagram showing planar layout of the fourth metal wiring layer M4 and the fourth via of the fuse element FSn disposed at an end of the fuse box. The planar layout of the fuse element FSn shown in FIG. 32 is different from that of the fuse element FSi shown in FIG. 31 with respect to the following points. A fourth metal wire 258 and a groove-shaped fourth via 259 which are long in the vertical direction are disposed at an end of the fuse box. The fourth metal wire 258 is coupled to the fourth metal wires 256 and 253, and the groove-shaped fourth via 259 is coupled to the groove-shaped fourth vias 257 and 254. The layout of the other components of the planar layout shown in FIG. 32 is the same as that of the fuse element shown in FIG. 31, the same reference numerals are designated to corresponding parts, and the detailed description will not be repeated.

As shown in FIGS. 31 and 32, also in the fourth metal wiring layer M4, in the thermal diffusion paths of copper from the fuse trimming region 225 indicated by the dashed arrows, the diffusion paths reaching the outside of the fuse box are blocked by the fourth metal wire 253 and the via 254. Also in the fuse element FSn shown in FIG. 32, the thermal diffusion paths of copper are blocked by the fourth metal wire 258 and the groove-shaped fourth via 259, and the paths of thermal diffusion of copper to the outside of the fuse box are interrupted.

Also in FIGS. 31 and 32, there is the possibility that copper thermally diffuses to an adjacent fuse element in the copper thermal diffusion paths shown by the dashed arrows. However, the wires in the fuse box are normally maintained at the same potential. In the wiring layer as well, the copper thermal diffusion distance can be made sufficiently short, and diffusion of copper to an adjacent fuse element is sufficiently suppressed.

Figure 33:
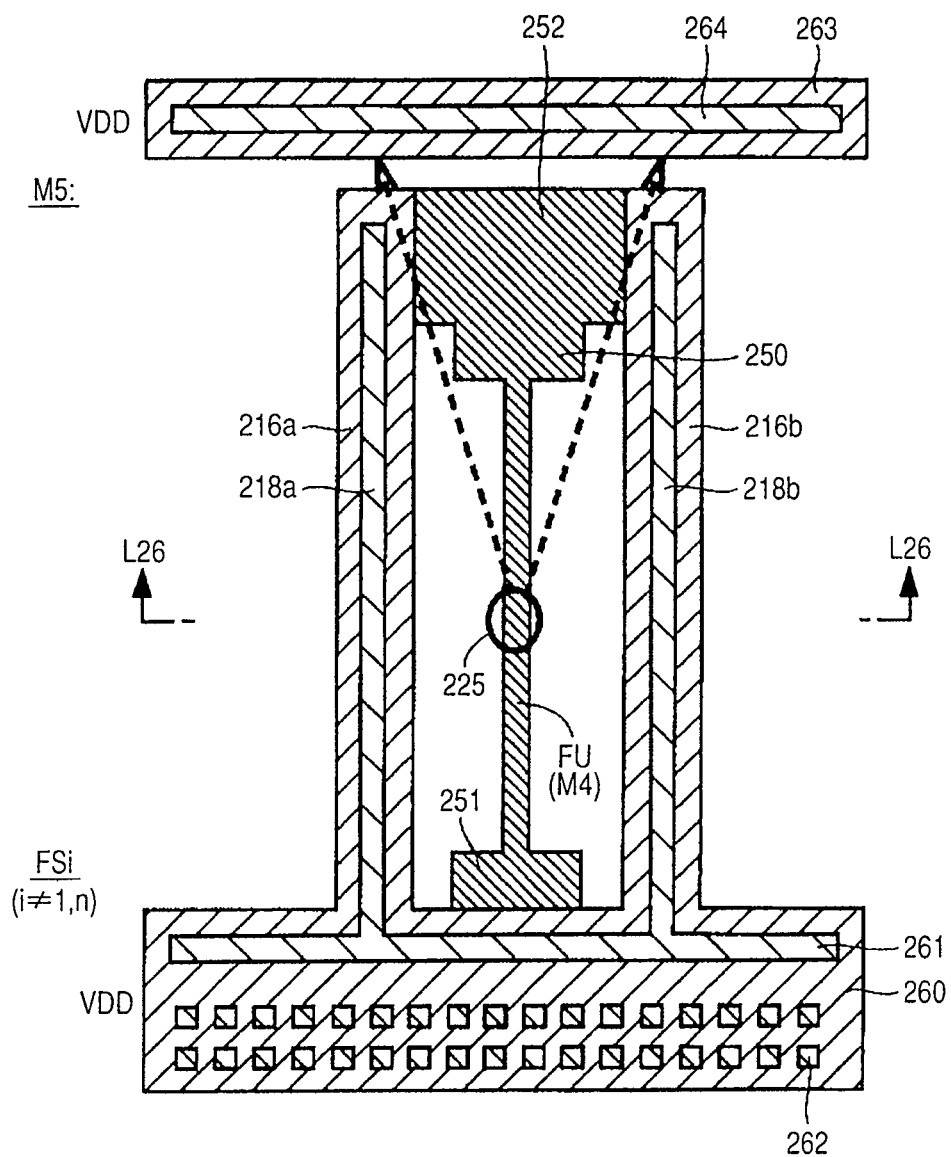
FIG. 33 is a diagram showing planar layout of a fifth metal wiring layer as an upper layer of the wiring layout illustrated in FIG. 31 together with planar layout of a via.

FIG. 33 is a diagram schematically showing planar layout of the fifth metal wiring layer M5 and the fifth via of the fuse element illustrated in FIG. 26. FIG. 33 also shows the line L26-L26 along which the sectional structure of the fuse element shown in FIG. 26 is taken.

In FIG. 33, the fifth metal wires 216*a* and 216*b* are disposed so as to extend in the vertical direction to places on the fourth metal bed wire 252 shown in FIG. 31. The groove-shaped fourth vias 218*a* and 218*b* are formed so as to continuously extend in the vertical direction in the surface of the fifth metal wires 216*a* and 216*b*, respectively. A fifth metal wire 260 is disposed so as to extend continuously in the lateral direction in contact with the fifth metal wires 216*a* and 216*b*. In a region on the outside of the fifth metal bed wire 252, a fifth metal wire 263 is disposed so as to continuously extend. A groove-shaped fifth via 261 is disposed in the surface of the fifth metal wire 260. The fifth via 261 is coupled to the fifth vias 218*a* and 218*b*. The fifth metal wire 260 is disposed so as to align with the fourth metal wire 253 shown in FIG. 31. The metal wires 260 and 253 are electrically coupled to each other via the fourth via 250 and the unit via 255 shown in FIG. 31. Also in the fifth metal wire 260, a plurality of unit fifth vias 262 for obtaining electric coupling to a wire in an upper layer are disposed in parallel.

Figure 34:
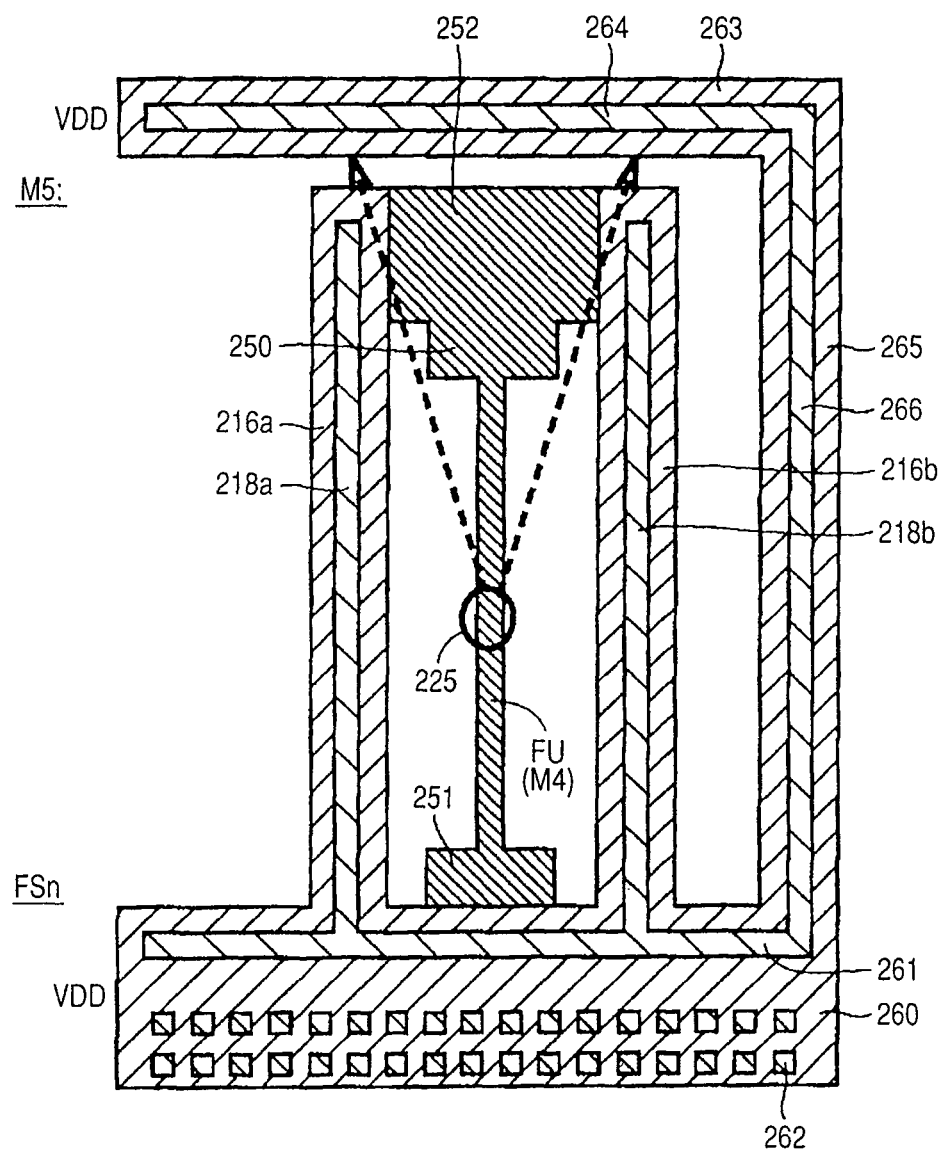
FIG. 34 is a diagram schematically showing layout of the fifth metal wiring layer and the fifth via as an upper layer of the wiring layout illustrated in FIG. 32.

FIG. 34 is a diagram schematically showing layout of the fifth metal wiring layer M5 and the fifth via of the fuse element FSn at the end of the fuse box. The wiring layout of the fuse element FSn shown in FIG. 34 is different from the planar layout of the fuse element FSi shown in FIG. 33 with respect to the following points. At an end of the fuse box, a fifth metal wire 265 is disposed so as to extend in the vertical direction. In the surface of the fifth metal wire 265, a fifth via 266 is formed so as to extend continuously in the vertical direction. The fifth metal wire 265 is coupled to the fifth metal wires 263 and 260, and the fifth via 266 is coupled to the fifth vias 264 and 261. The layout of the other components of the fuse element FSn shown in FIG. 34 is the same as that of the fuse element FSi shown in FIG. 33, the same reference numerals are designated to corresponding parts, and the detailed description will not be repeated.

As shown by dashed arrows in FIGS. 33 and 34, in the fifth metal wiring layer M5, the thermal diffusion paths of copper from the fuse trimming region 255 extend via a gap region between the bed wire 252 and the fifth metal wire 216*a* and a gap region between the bed wire 252 and the fifth metal wire 216*b*. However, in this case, the thermal diffusion paths of copper are blocked by the fifth metal wire 263 and the fifth via 264 formed in the upper region, and the diffusion path to the outside of the fuse fox is blocked. On the other hand, the thermal diffusion paths of copper from the trimming region 225 are blocked by the fifth metal wire 260 and the fifth via 261 in the lower region. Therefore, in both of the fuse elements FSi and FSn, the thermal diffusion paths to the outside of the fuse box, of copper atoms from the trimming region 225 are blocked.

Figure 35:
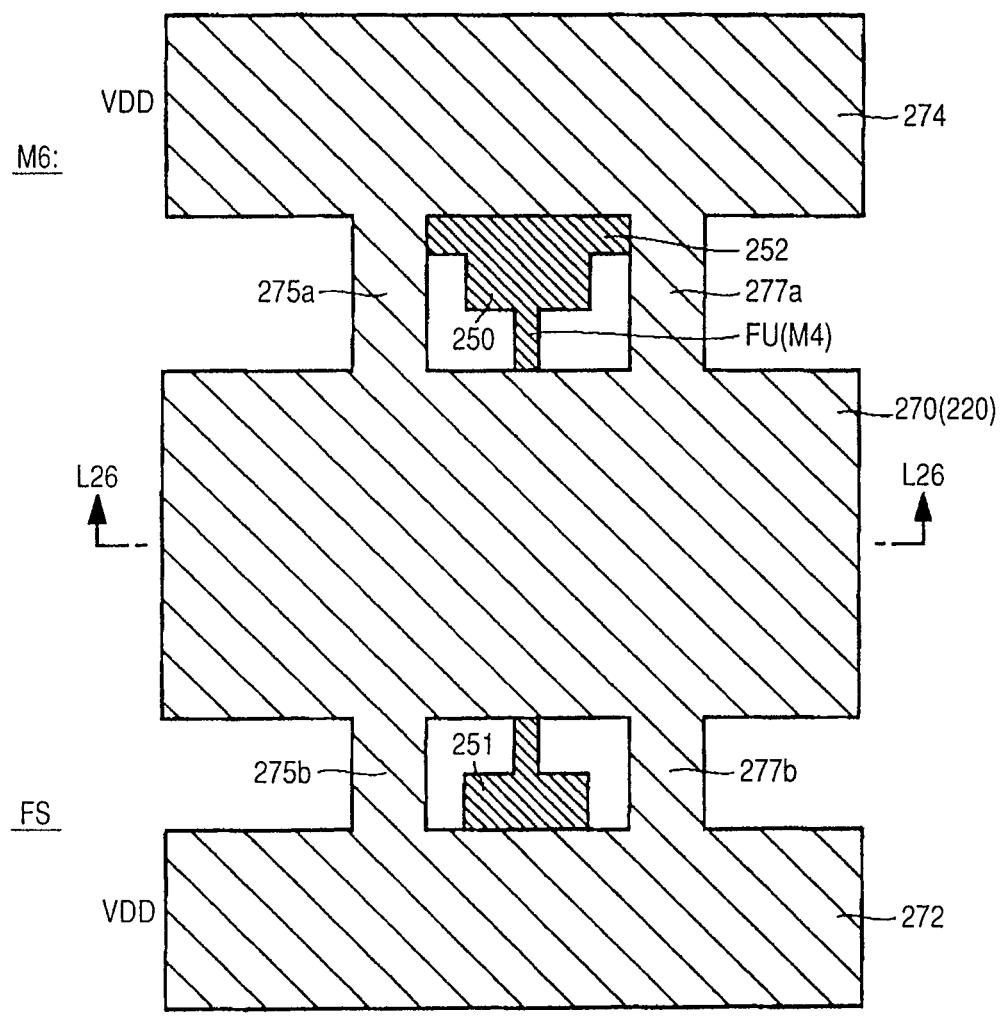
FIG. 35 is a diagram schematically showing planar layout of the sixth metal wiring layer as an upper layer in the planar layout illustrated in FIGS. 33 and 34.

FIG. 35 is a diagram schematically showing wiring layout of the sixth metal wiring layer M6 of the fuse element shown in FIG. 26. FIG. 35 also shows components related to the fuse FU (M4). The wiring layouts of the sixth metal wiring layers in the fuse elements FSi and FSn are the same. FIG. 35 shows the fuse elements FSi and FSn as the fuse element FS. The line L26-L26 is a sectional line along which the sectional structure shown in FIG. 26 is obtained.

In FIG. 35, a wide sixth metal wire 270 is disposed so as to continuously extend as the upper-part diffusion preventing wall wire 220 in an upper layer part of the fusing part (trimming region which is not shown in FIG. 35) of the fuse FU (M4). In correspondence with the fifth metal wires 263 and 261 shown in FIG. 33, sixth metal wires 274 and 272 continuously extending in the lateral direction are disposed, respectively. The sixth metal wires 272 and 274 are wide global power supply lines that transmit the power supply voltage VDD.

As the wire 220 of the cover part of the diffusion preventing wall structure of the sixth metal wiring layer, the wide solid wire 270 is disposed so as to cover the trimming region only in the region corresponding to the fusing part (trimming region) in the fuse FU (M4). Since the sixth metal wires 274, 270, and 272 configuring the power supply line are disposed in a plurality of fuse elements, also with respect to the fuse element FSn at the end in the fuse box, a similar wiring layout is disposed in the sixth metal wiring layer.

The sixth metal wire 270 is coupled to the sixth metal wires 274 and 272 via six metal wires 275*a*, 275*b*, 277*a*, and 277*b* on both sides of the fuse FU (M4). The groove-shaped fifth vias 218*a* and 218*b* shown in FIG. 33 are disposed below the sixth metal wires 275*a*, 275*b*, 277*a*, and 277*b* and are electrically coupled to the fifth metal wires 216*a* and 216*b* in the lower layer.

As shown in FIG. 35, the copper thermal diffusion paths of the fifth metal wires 275*a*, 275*b*, 277*a*, 277*b*, and 272 are blocked on both sides of the fuse FU (M4), and occurrence of thermal diffusion exceeding the region just above the fuse is reliably suppressed.

In the case of the planar layout, the preventing wall structure of the fuse FU (M4) is just formed by an intermediate metal wire and a via extending from the sixth metal wires 274, 270, and 277 configuring the power supply line toward the substrate to the third metal wiring layer M3. The preventing wall structure has a single side-wall structure. Thus, the layout area of the fuse element can be reduced.

As shown in FIG. 26, the side wall of the preventing wall structure is shared by adjacent fuse elements, so that the layout area of the fuse element can be further reduced.

In a manner similar to the foregoing second embodiment, it is sufficient to determine the width of the sixth metal wire 270 as a component of the preventing wall 220 in consideration of the design rule in CMP.

Also in the embodiment, the fuse element trimming region is covered by the sixth metal wire 270. In the case of cutting the fuse FU, there is a case where a crack occurs so as to be apart from the fuse to the upper side of the fuse FU using, as starting points, two points at corner parts of the fuse FU as a contact part between the fuse FU and the copper diffusion preventing film and the interlayer film, and the crack reaches the sixth metal wire 270. The copper metal enters the crack and it causes short circuit between the fuse FU and the sixth metal wire 270. At this time, the potential of the fuse FU becomes the power supply voltage VDD on the sixth metal wire 270. Accordingly, poor trimming can be detected by the cut determining circuit CJC, and the chip (semiconductor device) can be detected as a defective and eliminated before shipment of the product. In the embodiment of the invention, the metal wire disposed above the slim fuse FU and closest to the fuse FU is the sixth metal wire 270. In the layout structure, the power supply voltage VDD is supplied to the sixth metal wire 270.

Modification of Sixth Metal Wire

Figure 36:
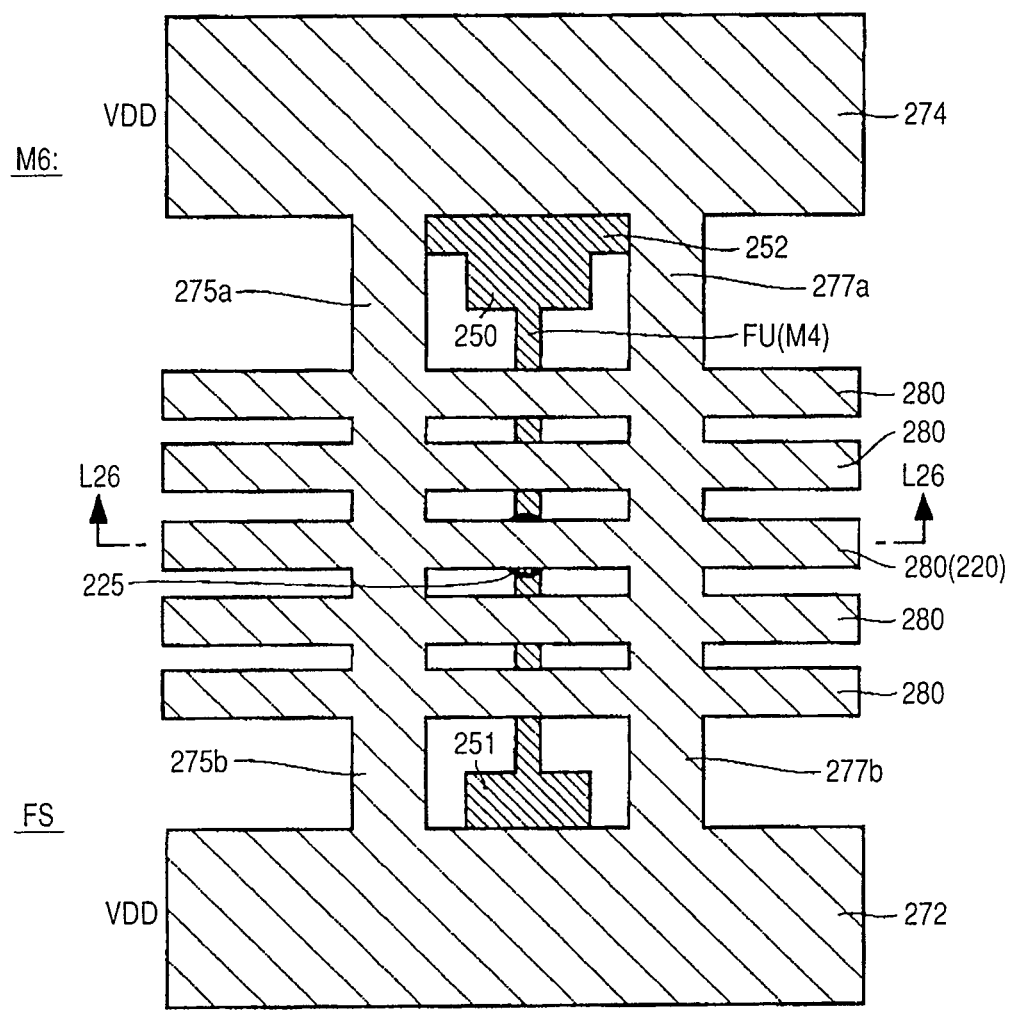
FIG. 36 is a diagram schematically showing planar layout of a modification of the planar layout illustrated in FIG. 35.

FIG. 36 is a diagram schematically showing a modification of wiring layout of the sixth metal wire of the fuse element illustrated in FIG. 26. In FIG. 36, as the sixth metal wire 220 covering the region just above the trimming region 225 in the fuse element FU (M4), a plurality of striped sixth metal wires 280 are disposed in parallel. The striped six metal wires 280 are coupled to the sixth metal wires 272 and 274 via the sixth metal wires 275*a*, 275*b*, 277*a*, and 277*b* disposed so as to extend in the vertical direction in a region outside of the fuse disposition region. The other layout in the planar layout of the sixth metal wiring layer M6 shown in FIG. 36 is the same as that of the six metal wiring layer M6 of the fuse element FS shown in FIG. 35, the same reference numerals are designated to corresponding parts, and their detailed description will not be repeated.

The sectional structure of the fuse element shown in FIG. 26 is taken along the line L26-L26 of the fuse element FS also in FIGS. 35 and 36.

Also in the case of using the striped sixth metal wires 280 as the upper-part diffusion preventing wall wire 220, when the striped wires 280 are disposed just above the trimming region 225 of the fuse FU (M4), the thermal diffusion blocking effect is the same as that in the case of the solid wire 270. It is sufficient to properly determine the width of the sixth metal wires 270 and 280 functioning as the cover of the preventing wall structure in accordance with dishing in the CMP process, wiring resistance, and the design rules.

Also in the embodiment, the fuse element trimming region is covered with the sixth metal wire 280. In the case of cutting the fuse FU, there is a case where a crack occurs so as to be apart from the fuse to the upper side of the fuse FU using, as start points, two points at corner parts of the fuse FU as a contact part between the fuse FU, the copper diffusion preventing film, and the interlayer film (interlayer insulating film) and the crack reaches the sixth metal wire 280. The copper metal enters the crack and it causes short circuit between the fuse FU and the sixth metal wire 280. At this time, the potential of the fuse FU becomes the power supply voltage VDD on the sixth metal wire 280. Accordingly, poor trimming can be detected by the cut determining circuit CJC, and a chip (semiconductor device) can be detected and eliminated as a defective before shipment of the product. In the embodiment of the invention, the metal wire disposed on the upper side of the fuse FU just above the slim fuse FU and closest to the fuse FU is the sixth metal wire 280, and the layout structure to which the power supply voltage VDD is supplied is obtained.

Modification of Fuse Element

Figure 37:
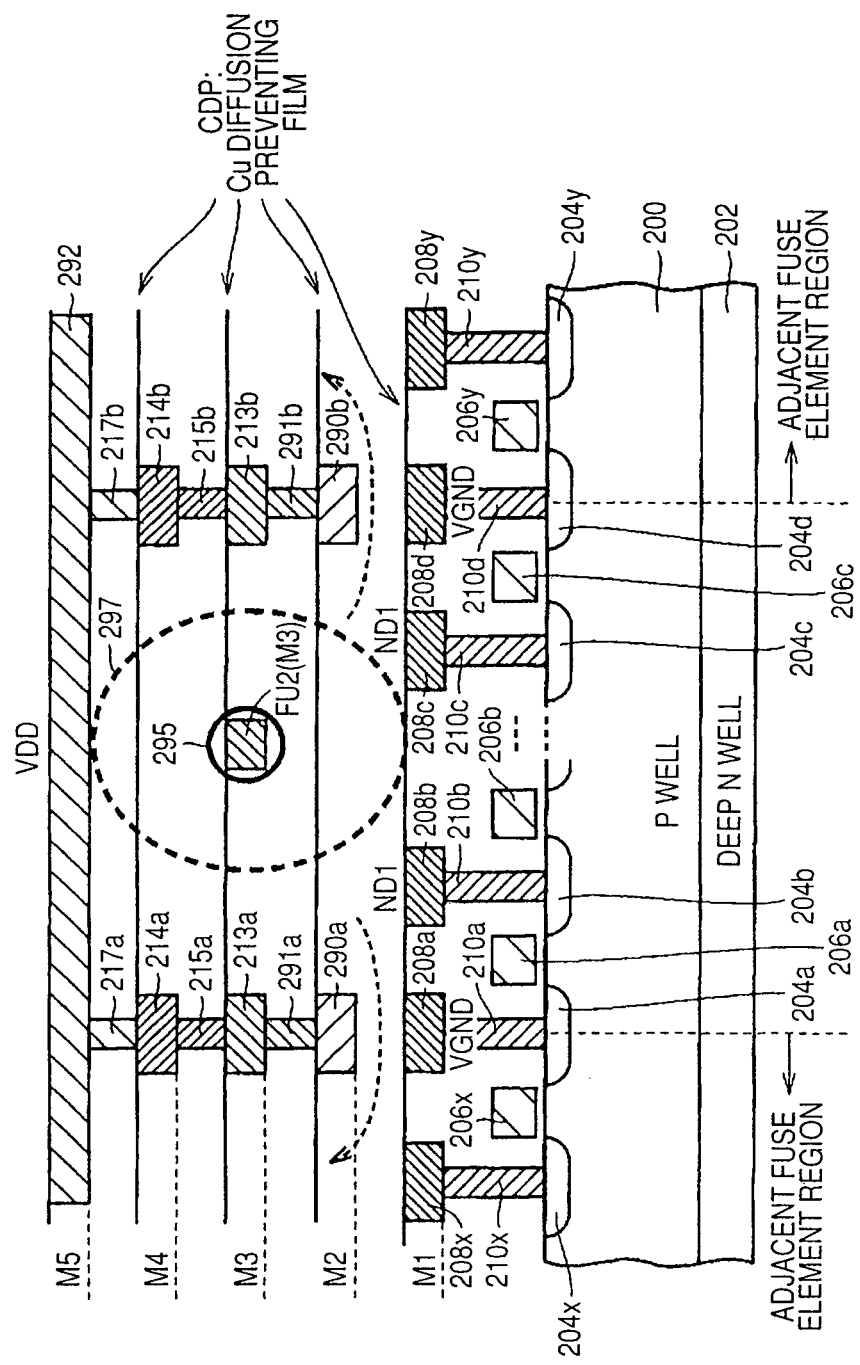
FIG. 37 is a diagram schematically showing a sectional structure of a fuse element of a modification of the third embodiment of the invention.

FIG. 37 is a diagram schematically showing a sectional structure of a modification of the fuse element according to the third embodiment of the invention. A sectional structure of a fuse element shown in FIG. 37 is different from that of the fuse element shown in FIG. 26 with respect to the following point. The first metal wires 208*a* and 208*d* in the first metal wiring layer M1 receive the virtual ground voltage VGND and function as virtual ground lines. In the second metal wiring layer M2, second metal wires 290*a* and 290*b* are disposed in correspondence with the first metal wires 208*a* and 208*d*. Except for the second metal wires 290*a* and 290*b*, no wires are disposed in the second metal wiring layer. The first metal wires 208*b* and 208*c* in the first metal wiring layer M1 are coupled to the nodes ND1.

The second metal wires 290*a* and 290*b* are electrically coupled to the third metal wires 213*a* and 213*b* disposed in the third metal wiring layer M3 via groove-shaped second vias 291*a* and 29*ab*, respectively. In the third metal wiring layer M3, a third metal wire forming the fuse FU2 (M3) above a region between the regions in which the first metal wires 208*b* and 208*c* are disposed.

The layout in the fourth metal wiring layer M4 is the same as that shown in FIG. 26. However, in the fifth metal wiring layer M5, the fourth vias 217*a* and 217*b* are electrically coupled to the fifth metal wire 292, and the fifth metal wire 292 transmits the power supply voltage VDD.

The other configuration shown in FIG. 37 is the same as that of the fuse element shown in FIG. 26, and the same reference numerals are designated to corresponding parts and their detailed description will not be repeated.

The fuse FU2 (M3) is formed by using the wires in the third metal wiring layer M3. In this case, a single preventing wall is formed from the second metal wire in the second metal wiring layer M2 to a fifth metal wire 292 in the fifth metal wiring layer M5 so as to surround a trimming region 295 of the fuse FU2 (M3) and a damage region 297. Since the damage region 297 of the fuse FU2 (M3) does not reach wires, deterioration in the insulating film and the wires caused by heat generated at the time of cutting the fuse is suppressed.

In this case, as described in the modification of the second embodiment, the first metal wires 208*a* and 208*b* are used to transmit the virtual ground voltage VGND, and the nodes ND1 are electrically coupled to the first metal wires 208*b* and 208*c*. Therefore, the electric characteristic of the metal wire in the first metal wiring layer M1 is inferior to that of the metal wire in the second metal wiring layer M2, and the electromigration tolerance is low. Therefore, in a manner similar to the case of the modification of the second embodiment, the electromigration tolerance of the first metal wire is evaluated, the length of each of the first metal wires 208*a* to 208*d* to the fuse FU2 (M3) is evaluated, and occurrence of a state where the first metal wires 208*a* to 208*d* are cut by the electromigration by large fusing current at the time of cutting the fuse FU2 (M3) is suppressed.

In the case of the structure shown in FIG. 37, the preventing wall structure of the fuse FU2 (M3) can be set to a state lower by an amount of one wiring layer, and the number of wiring layers can be further reduced.

With respect to wires and vias configuring the preventing wall, the grooved vias (261, 264, and the like) disposed for the metal wires disposed in correspondence with the power supply line or virtual ground line continuously extending to the outside of the fuse disposition region may be disposed so as to continuously extend along a plurality of fuse elements like a corresponding metal wire, or may be disposed separately for each of the fuse elements. The layout is similarly also applied to the second embodiment.

As described above, according to the third embodiment of the invention, a power supply wire that transmits the power supply voltage is disposed as a diffusion preventing wall just above the fuse, and the preventing wall structure is formed toward the semiconductor substrate region from the power supply line so as to surround the fuse. The preventing wall is shared by adjacent fuse elements. Therefore, the number of wiring layers of a fuse element can be reduced and the layout area can be also reduced.

Although not shown, also in the embodiment, the fuse element trimming region is covered with the fifth metal wire 292 in plan view. In the case of cutting the fuse FU, there is a case such that a crack occurs so as to be apart from the fuse to the upper side of the fuse FU using, as start points, two points at corner parts of the fuse FU as a contact part between the fuse FU and the copper diffusion preventing film, and the interlayer film (interlayer insulating film). The crack reaches the fifth metal wire 292. The copper metal enters the crack and it causes short circuit between the fuse FU and the fifth metal wire 292. At this time, the potential of the fuse FU becomes the power supply voltage VDD on the fifth metal wire 292. Accordingly, poor trimming can be detected by the cut determining circuit CJC, and a chip (semiconductor device) can be detected and eliminated as a defective before shipment of the product. The embodiment of the invention provides the layout structure such that the metal wire disposed above the slim fuse FU and closest to the fuse FU is the fifth metal wire 292, and the power supply voltage VDD is supplied.

Fourth Embodiment

Figure 38:
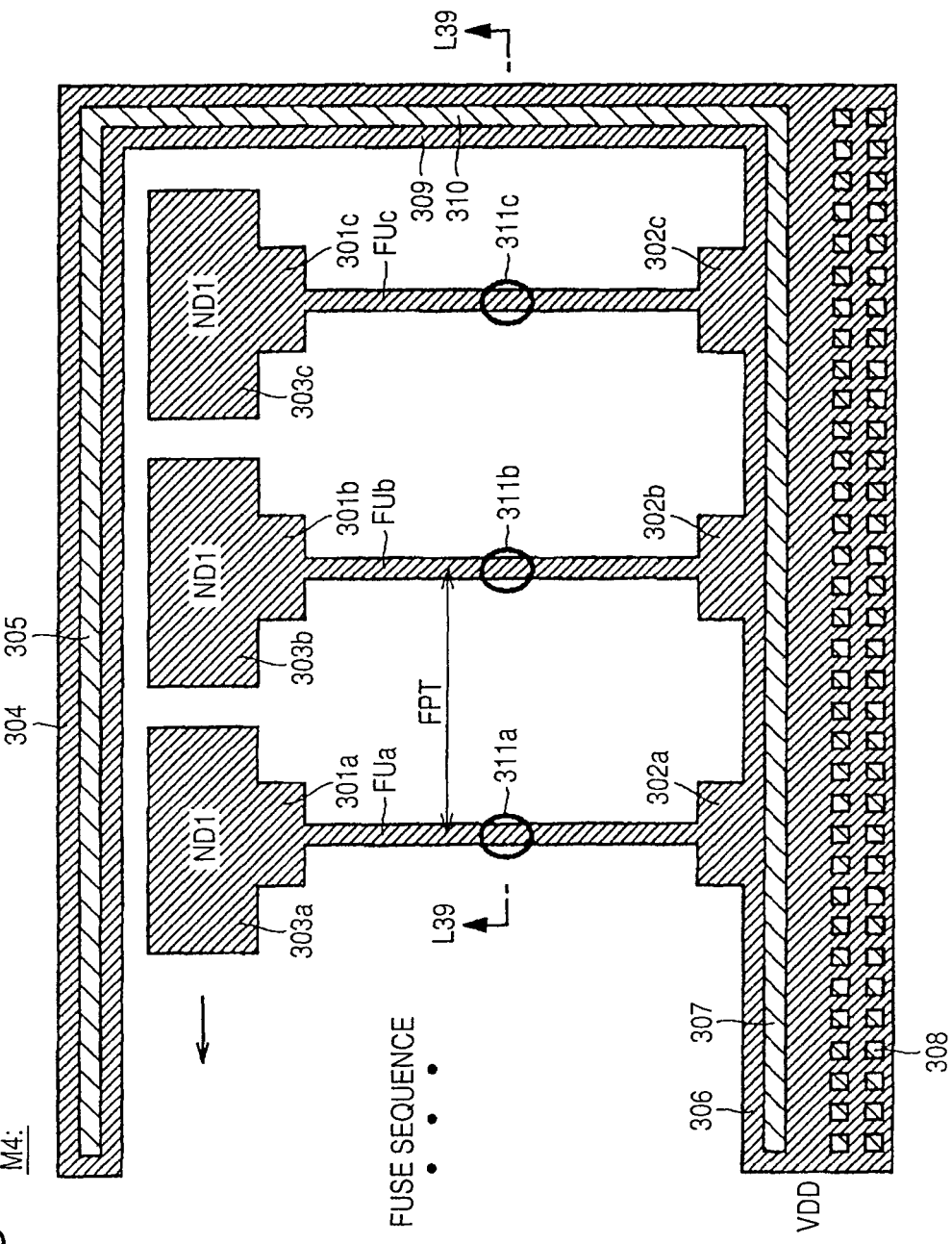
FIG. 38 is a diagram schematically showing planar layout of a fuse box according to a fourth embodiment of the invention.

FIG. 38 is a diagram schematically showing planar layout of a fuse element according to a fourth embodiment of the invention. FIG. 38 shows layout of wires in a fourth metal wiring layer M4 in a fuse box in which a plurality of fuse elements are disposed and an end portion of the fuse box of a fourth via.

In FIG. 38, fuses FUa, FUb, and FUc are formed by a wire in the fourth metal wiring layer M4 and disposed at intervals. The fuses FUa to FUc are aligned at pitches FPT.

One ends of the fuses FUa, FUb, and FUc are coupled to fourth metal pad wires 301a, 301b, and 301c, respectively, and the other ends are coupled to fourth metal pad wires 302a, 302b, and 302c, respectively. The fourth metal pad wires 302a to 302c are disposed so as to be apart from each other in correspondence with the fuses FUa to FUc. Fourth metal bed wires 303a, 303b, and 303c are coupled to the fourth metal pad wires 301a, 301b, and 301c, respectively, and each of the fourth metal bed wires 303a, 303b, and 303c forms as the node ND1. The fourth metal bed wires 303a, 303b, and 303c are disposed apart from each other in correspondence with the fuses FUa, FUb, and FUc, respectively.

On the other hand, a fourth metal wire 306 extending continuously in the lateral direction is disposed commonly for the fourth metal pad wires 302a to 302c, and the fourth pad wires 302a to 302c are coupled to the fourth metal wire 306. The fourth metal wire 306 configures a power supply line that transmits the power supply voltage VDD. In the periphery of the fourth metal wire 306, to obtain electric coupling to an upper-layer wire, a plurality of unit four vias 308 are aligned. To form a diffusion preventing wall, a groove-shaped fourth via 307 continuously extending along a plurality of fuse elements is disposed in the surface of the fourth metal wire 306.

A fourth metal wire 304 continuously extending in the lateral direction is also disposed in a region on the outside of the fourth metal bed wires 303a to 303c, and a groove-shaped fourth via 305 is continuously formed in the surface of the fourth metal wire 304. By the fourth via, a part of a diffusion preventing wall structure preventing thermal diffusion of copper atoms to the outside of the fuse box is formed.

At an end of the fuse box, a fourth metal wire 309 is disposed so as to couple the fourth metal wires 304 and 306. On the fourth metal wire 309, a fourth via 310 extends continuously so as to couple the groove-shaped fourth vias 305 and 307.

In a state other than fuse cutting and a voltage stress application test such as normal operations of a core circuit, the metal wires are maintained at the same voltage in the fuse box, that is, the voltage level of the node ND1 is maintained as the power supply voltage VDD level, voltages at both ends of the fuses FUa to FUc are set to the same voltage level (as an example, the power supply voltage VDD level), and the wires in the other wiring layers are set to the same voltage level. In this case, the thermal diffusion distance of copper atoms of a copper piece generated at the time of fuse cutting in trimming regions 311a, 311b, and 311c of the fuses FUa, FUb, and FUc can be made smaller than the fuse pitch FPT. Therefore, it is unnecessary to dispose the copper thermal diffusion preventing wall between adjacent fuse elements, and the occupation area of the fuse box can be further reduced.

Figure 39:
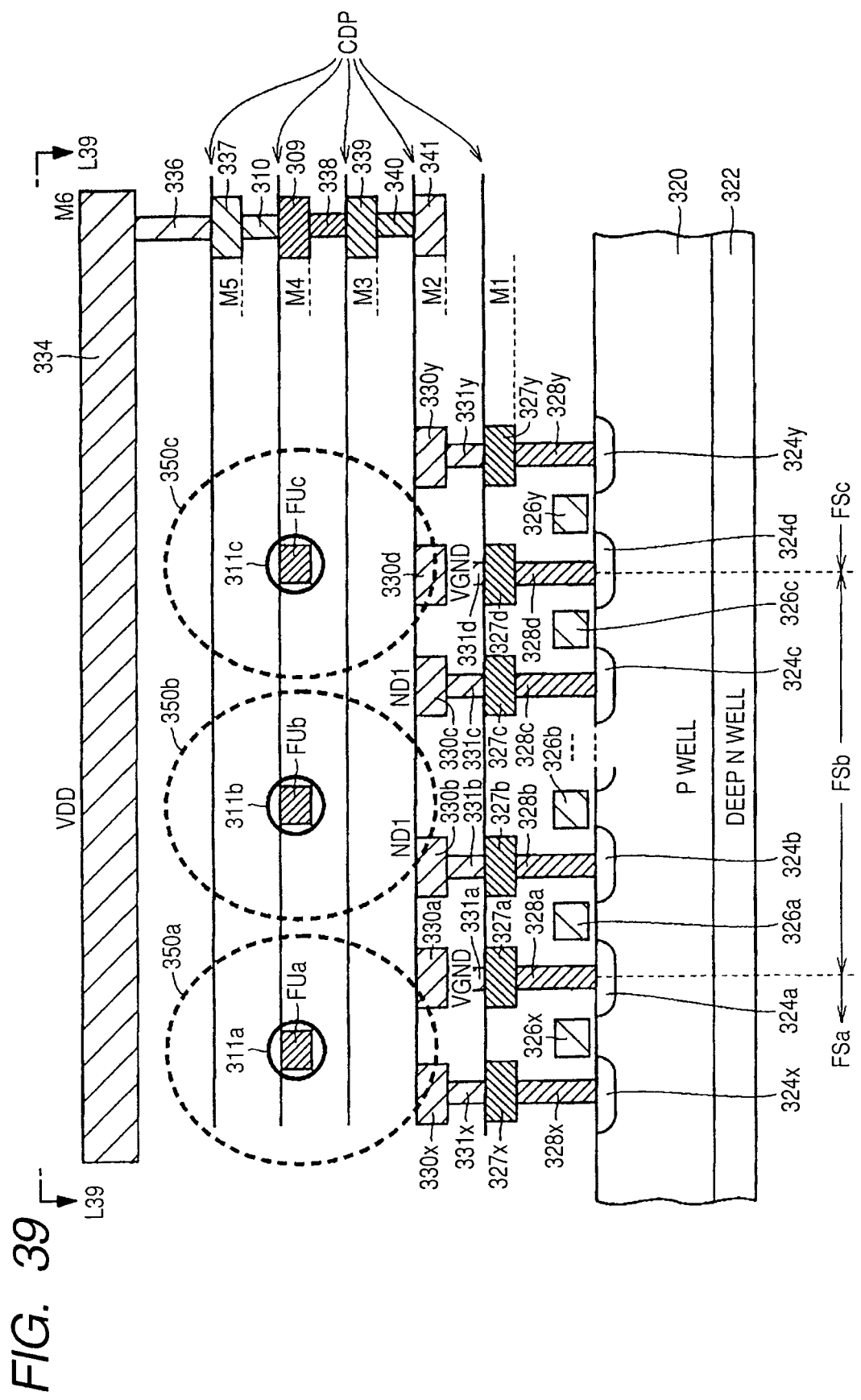
FIG. 39 is a diagram schematically showing a sectional structure taken along line L39-L39 illustrated in FIG. 38.

FIG. 39 is a diagram schematically showing a sectional structure taken along line L39-L39 illustrated in FIG. 38. FIG. 39 also shows wires in the fifth metal wiring layer M5 and the sixth metal wiring layer M6 as upper layers along the line L39-L39.

In FIG. 39, fusing current supply transistors of fuse circuits are formed in the surface of a P well 320. A deep N well 322 is disposed below the P well 320. The P well 320 and the deep N well 323 are disposed commonly to the fusing current supply transistors for a plurality of fuse elements, and element isolation regions for isolating the transistors are not disposed. However, element isolation regions may be disposed in the surface of the P well for the fusing current supply transistors CTr.

Impurity regions 324a to 324d are disposed in a region corresponding to one fuse element FSb at intervals in the surface of the P well 320. Impurity regions 324x and 324y are disposed in regions corresponding to the fuse elements FSa and FSc, respectively.

In FIG. 39, a large number of unit transistors of the fusing current supply transistor are shown for the fuse element FSb, and a small number of unit transistors of the fusing current supply transistors are shown for the fuse elements FSa and FSc. However, also in the fuse elements FSa and FSc, in a manner similar to the configuration of the fuse element FSb, a plurality of unit transistors configuring the fusing current supply transistor are disposed. The impurity region 324a is shared by the fusing current supply transistors for the fuse elements FSa and FSb, and the impurity region 324d is shared by the fusing current supply transistors for the adjacent fuse elements FSb and FSc.

Above the P well 320, a gate electrode 326x is provided between the impurity regions 324x and 324a, a gate electrode 326a is provided between the impurity regions 324a and 324b, a gate electrode 326b is provided between the impurity regions 324b and 324c, a gate electrode 326c is provided between the impurity regions 324c and 324d, and a gate electrode 326y is provided between the impurity regions 324d and 324y.

The impurity regions 324x, 324a to 324d, and 324y are coupled to first metal wires 327x, 327a to 327d, and 327y in the first metal wiring layer M1 via contacts 328x, 328a to 328d, and 328y, respectively.

In the second metal wiring layer M2, second metal wires 330x, 330a to 330d, and 330y are disposed in correspondence with the first metal wires 327x, 327a to 327d, and 327y, respectively and are coupled to the corresponding first metal wires 327x, 327a to 327d, and 327y via first vias 331x, 331a to 331d, and 331y, respectively. The second metal wires 330a and 330d are coupled to the virtual ground lines and receive the virtual ground voltage VGND, and the second metal wires 331b and 331c are coupled to the nodes ND1.

In each of the fuse elements FSa to FSc, the fuses FUa, FUb, and FUc are disposed by using the fourth metal wire in the fourth metal wiring layer M4 at predetermined fuse pitches FTP. A sixth metal wire 334 in the sixth metal wiring layer M6 continuously extends so as to cover the fuses FUa to FUc. The sixth metal wire 334 transmits the power supply voltage VDD.

In the disposition regions of the fuses FUa to FUc, no wires are disposed in the third metal wiring layer M3 and the fifth metal wiring layer M5, and no wires other than the wire forming the fuses FUa to FUc are disposed also in the fourth metal wiring layer M4.

At an end of the fuse box, the six metal wire 334 is coupled to a fifth metal wire 337 in the fifth metal wiring layer M5 via a fifth via 336. The fifth metal wire 337 is coupled to the fourth metal wire 309 in the fourth metal wiring layer M4 via the fourth via 310. In correspondence with the fourth metal wire 309, a third metal wire 339 and a second metal wire 341 are disposed in the third metal wiring layer M3 and the second metal wiring layer M2, respectively. The third metal wire 339 is coupled to the fourth metal wire 309 via the third via 338, and is coupled to the second metal wire 341 via the second via 340. The vias 336, 310, 338, and 340 are grooved vias continuously extending as shown in FIG. 38.

Between the metal wiring layers M1 to M5, copper diffusion preventing films CDP are disposed. The copper diffusion preventing film CDP is made of SiCN (silicon carbide nitride) or the like, has the function of preventing diffusion of copper atoms, and is formed on each of the interfaces of the interlayer insulating films.

As shown in FIG. 39, damage regions 350a, 350b, and 350c in which the interlayer insulating film is damaged by thermal diffusion from the trimming regions 311a, 311b, and 311c of the fuses FUa, FUb, and FUc are disposed so as not to be overlapped each other. The thermal diffusion distance of copper is made sufficiently shorter than the fuse pitch FTP by voltage control of the internal wire. A gap of two wiring layers is formed just above and just below the fuses FUa to FUc, so that short circuit or the like caused by copper thermal diffusion can be sufficiently prevented, and heat confinement can be suppressed.

At the end of the fuse box, by the wires in the second to sixth metal wiring layers M2 to M6 and the groove-shaped vias, the copper diffusion preventing wall structure is realized. Copper thermal diffusion to the outside of the fuse box can be suppressed.

In addition, as shown in FIG. 39, the wire coupled to the virtual ground line is shared by adjacent fuse elements, so that the layout area of the fuse elements can be further reduced. It is unnecessary to dispose the copper diffusion preventing wall structure between the fuse elements, so that the layout area of the fuse elements can be further reduced.

As conditions, in the configurations of FIGS. 38 and 39, the copper thermal diffusion distance is sufficiently shortened. Consequently, in the normal circuit operation, each of the wires, particularly, the node ND1 is requested to set the same voltage level as that of the voltage VDD of the sixth metal wire 334 (refer to the first embodiment or refer to an embodiment of fuse power supply from the outside which will be described later).

In the embodiment, although not shown, the fuse element trimming region is covered by the sixth metal wire 334 in plan view. In the case of cutting the fuse FU, there is a case such that a crack occurs so as to be apart from the fuse to the upper side of the fuse FU using, as start points, two points at corner parts of the fuse FU as a contact part between the fuse FU and the copper diffusion preventing film, and the interlayer film (interlayer insulating film). The crack reaches the sixth metal wire 334. The copper metal enters the crack and it causes short circuit between the fuse FU and the sixth metal wire 334. At this time, the potential of the fuse FU becomes the power supply voltage VDD on the sixth metal wire 334. Accordingly, poor trimming can be detected by the cut determining circuit CJC, and a chip (semiconductor device) can be detected and eliminated as a defective before shipment of the product. The embodiment of the invention provides the layout structure such that the metal wire disposed above the slim fuse FU and closest to the fuse FU is the sixth metal wire 334, and the power supply voltage VDD is supplied.

Modification

Figure 40:
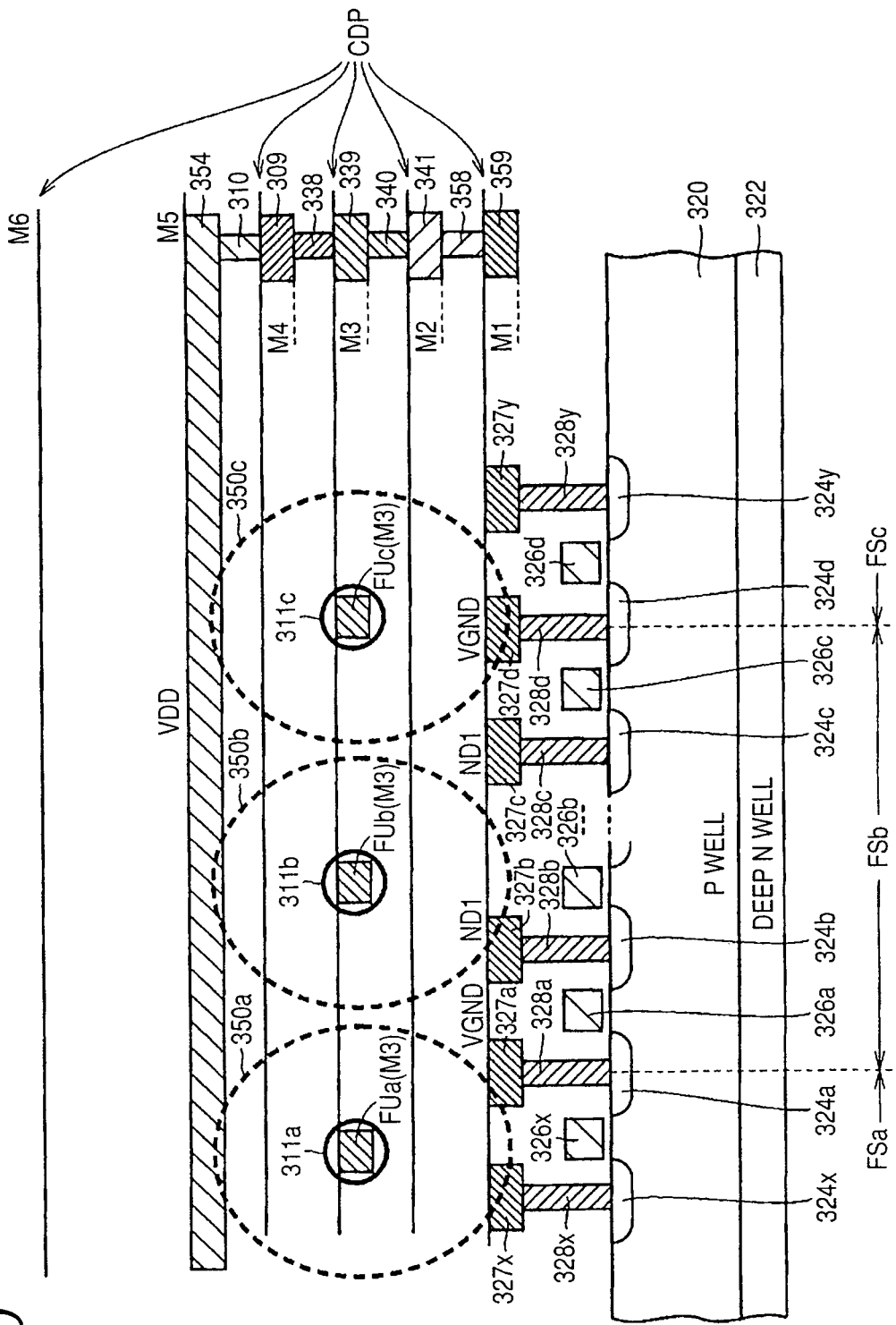
FIG. 40 is a diagram schematically showing a sectional structure of a modification of the sectional structure illustrated in FIG. 39.

FIG. 40 is a diagram schematically showing a sectional structure of a modification of the fuse element according to the fourth embodiment of the present invention. The structure of a fuse element shown in FIG. 40 is different from that of the fuse element shown in FIG. 39 with respect to the following points. In the first metal wiring layer M1, the first metal wires 327a and 327d are used as wires that transmitting the virtual ground voltage VGND, and the first metal wires 327b and 327c are used as wires coupled to the nodes ND1. In the second metal wiring layer M2, no metal wire is disposed just below the fuse. On the other hand, using the wire in the third metal wiring layer M3, the fuse elements FUa (M3) to FUc (M3) are formed. By disposing the metal wire 354 in the fifth metal wiring layer M5 above the fuse elements FUa (M3) and FUc (M3), it is used as an upper diffusion preventing wall wire. The fifth metal wire 354 transmits the power supply voltage VDD.

The fifth metal wire 354 is coupled to the metal wire 309 in the fourth metal wiring layer M4 via the groove-shaped fourth via 310 at the end of the fuse box. The second metal wire 341 in the second metal wiring layer M3 is coupled to the metal wire 359 in the first metal wiring layer M1 via the first via 358. By using the metal wires from the fifth metal wiring layer M5 to the first metal wiring layer M1 and the groove-shaped vias between them at the end of the fuse box, the copper thermal diffusion preventing wall is formed.

The other configuration of the fuse shown in FIG. 40 is the same as that of the fuse element shown in FIG. 39, the same reference numerals are designated to corresponding parts, and the detailed description will not be repeated.

In the case of the fuse element shown in FIG. 40, the virtual ground voltage VGND is transmitted via the first metal wires 327a and 327d in the first metal wiring layer M1. Therefore, in a manner similar to the configurations of the modifications of the foregoing second and third embodiments, the wiring length and wiring width have to be set in consideration of the electromigration tolerance when large current flows at the time of cutting a fuse. When the electromigration tolerance of metal wires in the first metal wiring layer is assured, the number of wiring layers used in the fuse box can be decreased by one.

In the configuration of the fuse elements FSa to FSc shown in FIG. 40, the damage regions 350a to 350c reach the fifth metal wire 354 in the upper layer and the first metal wire in the lower layer. However, since the damage regions 350a to 350c are regions having the possibility that the interlayer insulating film deteriorates due to high heat generated at the time of cutting the fuse, different from a region which is physically damaged, there is no problem even when the damage regions 350a to 350c extend to the wiring parts.

In addition, since all of the metal wires in the fuse box are maintained, for example, at the same voltage level as that of the power supply voltage VDD in normal use, the copper diffusion distance can be sufficiently made short, and deterioration in the insulating property caused by the copper atom diffusion of the interlayer insulating film and the copper diffusion preventing film CDP can be also sufficiently suppressed.

As described above, according to the fourth embodiment of the invention, fuses are disposed at equal intervals, and no copper thermal diffusion preventing wall is provided between adjacent fuses. Only at the end of the fuse box, the preventing wall structure which extends from the power supply line in an upper layer toward the substrate region is formed by the metal wires and the vias. Therefore, the layout area of the fuse element can be reduced.

As the shape of the power supply wire formed just above the fuse, like the configuration shown in the third embodiment, any of a solid wire and striped wires formed so as to cover the trimming regions 311a to 311c may be used.

Although not shown, also in the embodiment, the fuse element trimming region is covered by the fifth metal wire 354 in plan view. In the case of cutting the fuse FU, there is a case such that a crack occurs so as to be apart from the fuse to the upper side of the fuse FU using, as start points, two points at corner parts of the fuse FU as a contact part between the fuse FU and the copper diffusion preventing film, and the interlayer film (interlayer insulating film). The crack reaches the fifth metal wire 354. The copper metal enters the crack and it causes short circuit between the fuse FU and the fifth metal wire 354. At this time, the potential of the fuse FU becomes the power supply voltage VDD on the fifth metal wire 354. Accordingly, poor trimming can be detected by the cut determining circuit CJC, and a chip (semiconductor device) can be detected and eliminated as a defective before shipment of the product. The embodiment of the invention provides the layout structure such that the metal wire disposed above the slim fuse FU and closest to the fuse FU is the fifth metal wire 354, and the power supply voltage VDD is supplied.

Fifth Embodiment

Figure 41:
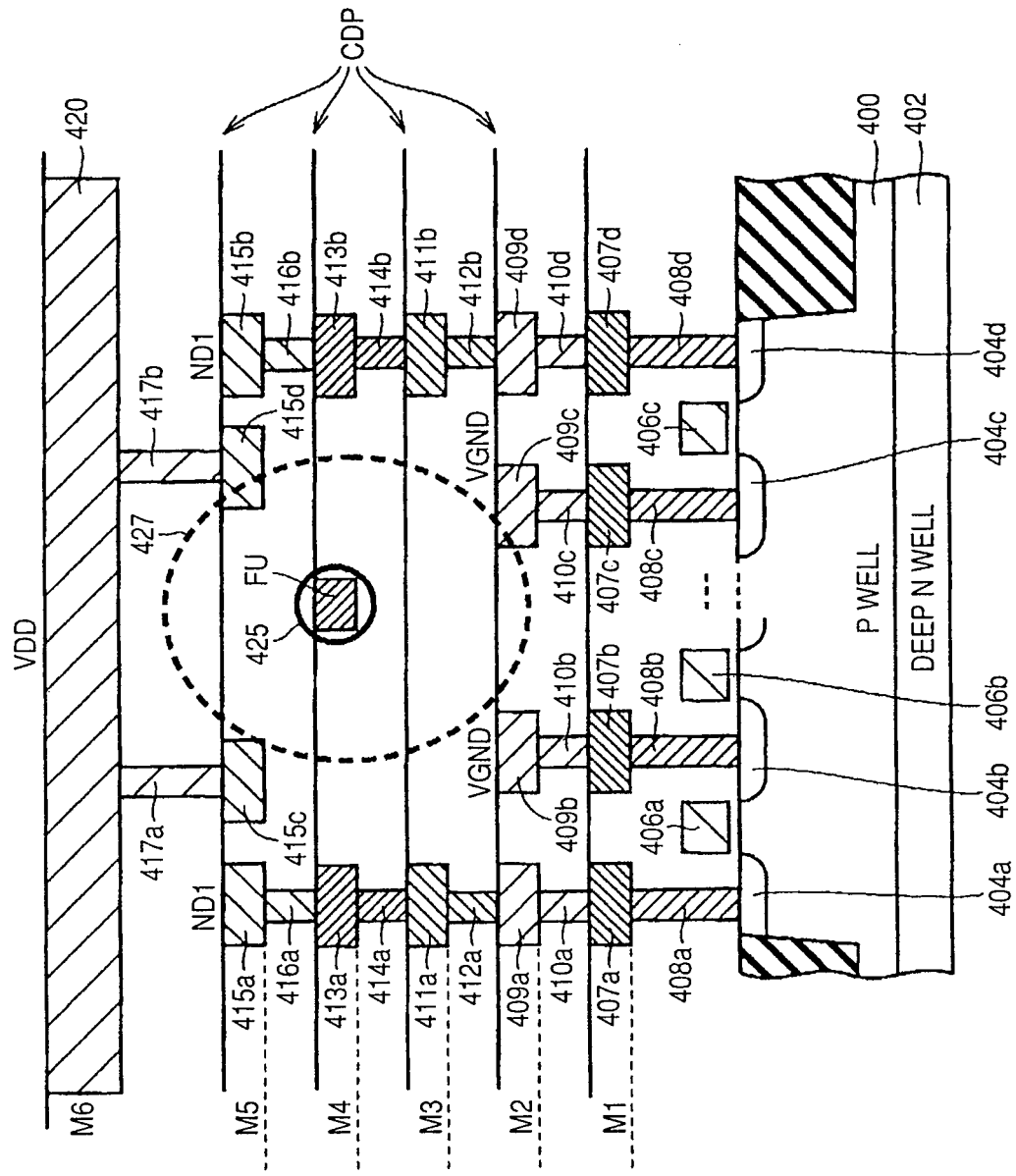
FIG. 41 is a diagram schematically showing a sectional structure of a fuse element according to a fifth embodiment of the invention.

FIG. 41 is a diagram schematically showing a sectional structure of a fuse element according to a fifth embodiment of the invention. In FIG. 41, a fuse element is formed above a P well 400. Below the P well (semiconductor substrate region) 400, a deep N well 402 for well isolation is formed. In the surface of the P well 400, impurity regions (active regions) 404a to 404d are formed at intervals. Gate electrodes 406a, 406b, and 406c are disposed via a not-shown gate insulating film above the substrate region between the impurity regions 404a and 404b, between the impurity regions 404b and 404c, and between the impurity regions 404c and 404d. By the impurity regions 404a to 404d and the gate electrodes 406a to 406c, fusing current supply transistors configured by a parallel body of a plurality of unit transistors are formed.

In the first metal wiring layer M1, first metal wires 407a to 407d are formed in correspondence with the impurity regions 404a to 404d, and are coupled to the corresponding impurity regions 404a to 404d via contacts 408a to 408d, respectively.

In the second metal wiring layer M2, second metal wires 409a to 409d are aligned in correspondence with the first metal wires 407a to 407d, respectively. The second metal wires 409a to 409d are coupled to the corresponding first metal wires 407a to 407d via groove-shaped first vias 410a to 410d, respectively. In the second metal wiring layer M2, the second metal wires 409b and 409c are coupled to the virtual ground line and transmit the virtual ground voltage VGND.

In the third metal wiring layer M3, third metal wires 411a and 411b are aligned in correspondence with the second metal wires 409a and 409d, respectively. The third metal wires 411a and 411b are electrically coupled to the corresponding second metal wires 409a and 409d via the groove-shaped second vias 412a and 412b, respectively.

In the fourth metal layer M4, fourth metal wires 413a and 413b are disposed in correspondence with the third metal wires 411a and 411b, respectively. Between the fourth metal wires 413a and 413b, a fuse FU is formed by using the fourth metal wire. The fourth metal wires 413a and 413b are coupled to the corresponding third metal wires 411a and 411b via groove-shaped third vias 414a and 414b, respectively. In the third metal wiring layer M3, no wire is disposed just below the fuse FU.

In the fifth metal wiring layer M5, fifth metal wires 415a and 415b are aligned in correspondence with the fourth metal wires 413a and 413b, respectively. Between the fifth metal wires 415a and 415b, fifth metal wires 415c and 415d are disposed. The fifth metal wires 415a and 415b are coupled to the fourth metal wires 413a and 413b via the groove-shaped fourth vias 416a and 416b, respectively. The fifth metal wires 415c and 415d are coupled to a wire 420 in the sixth metal wiring layer M6 via groove-shaped fifth vias 417a and 417b, respectively. The sixth metal wire 420 transmits the power supply voltage VDD and is formed so as to cover the top of a trimming region 425 in the fuse FU. The sixth metal wire 420 serving as the power supply line may be a solid wire or striped wires. The fifth metal wires 415a and 415b form the node ND1.

As shown in FIG. 41, by disposing the fifth metal wire to which the power supply voltage VDD is transmitted on the inside of the metal wires forming the node ND1 as a diffusion preventing wall structure that interrupts the copper diffusion paths of the fuse FU, the layout area of the preventing wall structure can be reduced. In addition, in the fifth metal wiring layer, the copper diffusion path can be reliably blocked.

Also in FIG. 41, the copper diffusion preventing films CDP are disposed in the borders of the metal wiring layers to suppress copper diffusion in a damage region 427 at the time of cutting the fuse FU. The damage region 427 is a region having the possibility that the interlayer insulating film deteriorates due to heat generated at the time of cutting a fuse.

Figure 42:
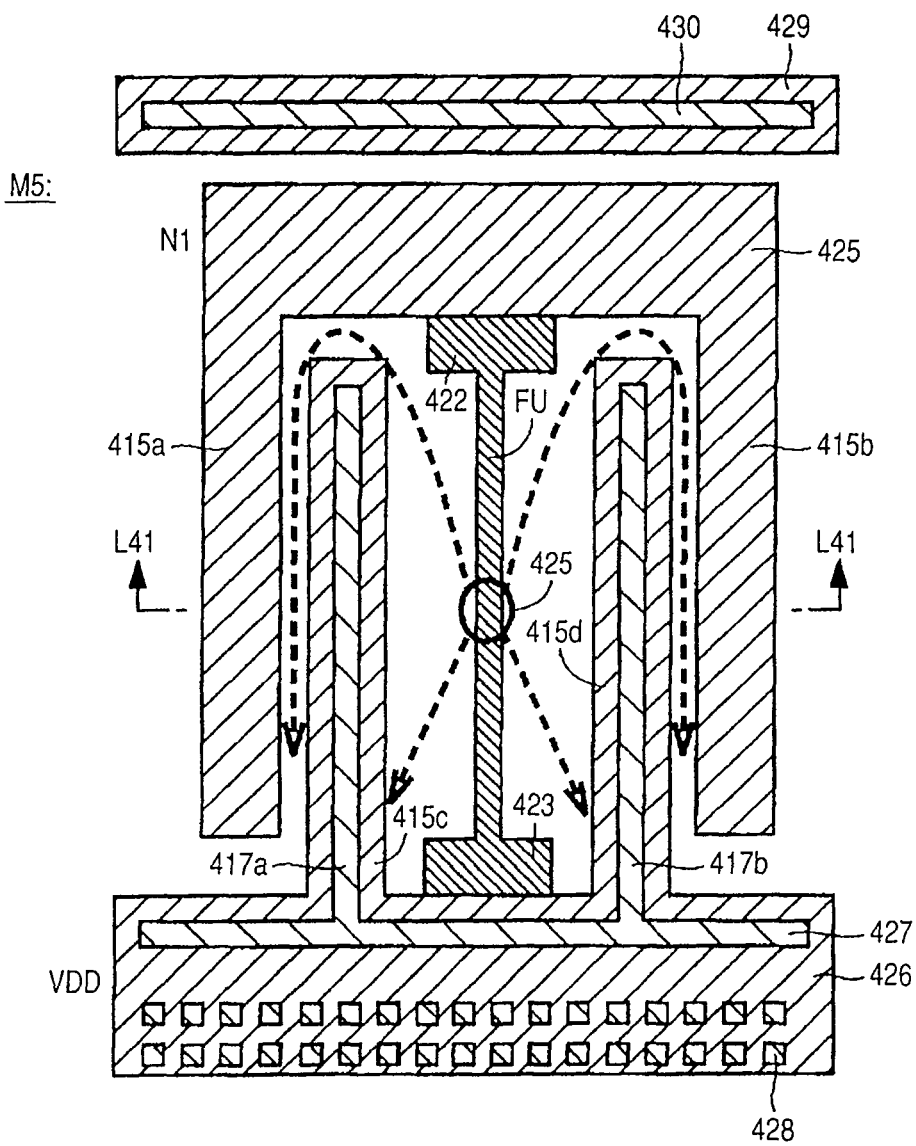
FIG. 42 is a diagram schematically showing layout of the fifth metal wiring layer of the fuse element illustrated in FIG. 41.

FIG. 42 is a diagram schematically showing wiring layout of the fifth metal wiring layer of the fuse element illustrated in FIG. 41. In FIG. 42, disposition of parts related to the fuse FU is also shown. A sectional structure taken along line L41 and L41 shown in FIG. 42 corresponds to the sectional structure shown in FIG. 41.

In FIG. 42, fourth metal node bed wires 422 and 423 facing each other at both ends of the fuse FU are coupled to the fuse FU. In correspondence with the fourth metal bed wire 422, a fifth metal wire 425 having a rectangular shape is disposed. The fifth metal wire 425 is coupled to fifth metal wires 415a and 415b disposed on both sides of the fuse FU.

A fifth metal wire 426 extending continuously in the lateral direction is disposed in correspondence with the fifth metal wires 415c and 415d. In the surface of the fifth metal wires 415c and 415d, groove-shaped fourth vias 417a and 417b continuously extending are formed. The fifth metal wires 415c and 415d are coupled to the fifth metal wire 426, and the fifth vias 417a and 417b are coupled to a fifth via 427 formed in the surface of the fifth metal wire 426. The fifth metal wire 426 forms a power supply line that transmits the power supply voltage VDD. In the surface of the fifth metal wire 426, a plurality of unit fifth vias 428 are aligned to be coupled to a global power supply line formed in an upper layer.

As shown in FIG. 42, the copper thermal fusion paths (indicated by dashed arrows) from the fuse trimming region 425 can be completely interrupted toward the fifth metal wire 426. On the other hand, there is the possibility that copper thermal diffusion occurs via a gap region between the fifth metal wires 415a and 415c and a gap region between the fifth metal wires 415*d* and 415*b*. However, the path is sufficiently longer than the copper diffusion distance, and copper thermal diffusion to adjacent fuses can be almost suppressed. In particular, by maintaining both of the node ND1 and the power supply line (fifth metal wire) 426 at the power supply voltage VDD level in normal operation, the copper thermal diffusion distance can be sufficiently shortened, and copper diffusion to adjacent fuse elements can be sufficiently suppressed.

As shown in FIGS. 41 and 42, the diffusion preventing wall is formed by using the wire and the groove-shaped via coupled to the node N1. By disposing the fifth metal wire and the groove-shaped via on the inside of the diffusion preventing wall and coupling them to the sixth metal wire in an upper layer, a part just above the trimming region 425 is closed, and copper thermal diffusion can be suppressed with reliability.

The planar layout of the other wiring layers in the fuse element shown in FIGS. 41 and 42 is the same as those shown in FIGS. 27 to 32 and FIGS. 35 and 36.

As described above, according to the fifth embodiment of the invention, as the copper diffusion preventing wall structure of a fuse, a metal wire coupled to the power supply line in an upper part is disposed in the preventing wall coupled to the node N1. Therefore, the layout area of the preventing wall structure can be reduced, and the layout area of the fuse element can be reduced.

Also in the configuration of the fuse shown in FIG. 41, when the electromigration tolerance of a metal wire in the first metal wiring layer M1 is sufficiently high, the fuse FU can be formed by using the metal wire in the third metal wiring layer M3, and the wires can be disposed in a wiring layer lower by one layer.

Also in the embodiment, although not shown, the fuse element trimming region is covered by the sixth metal wire 475 in plan view. In the case of cutting the fuse FU, there is a case that a crack occurs so as to be apart from the fuse to the upper side of the fuse FU using, as starting points, two points at corner parts of the fuse FU as a contact part between the fuse FU and the copper diffusion preventing film and the interlayer film (interlayer insulating film), and the crack reaches the sixth metal wire 475. The copper metal enters the crack and it causes short circuit between the fuse FU and the sixth metal wire 475. At this time, the potential of the fuse FU becomes the power supply voltage VDD on the sixth metal wire 475. Accordingly, poor trimming can be detected by the cut determining circuit CJC, and the chip (semiconductor device) can be detected as a defective and eliminated before shipment of the product. In the embodiment of the invention, the metal wire disposed above the slim fuse FU and closest to the fuse FU is the sixth metal wire 475. In the layout structure, the power supply voltage VDD is supplied to the sixth metal wire 475.

Sixth Embodiment

Figure 43:
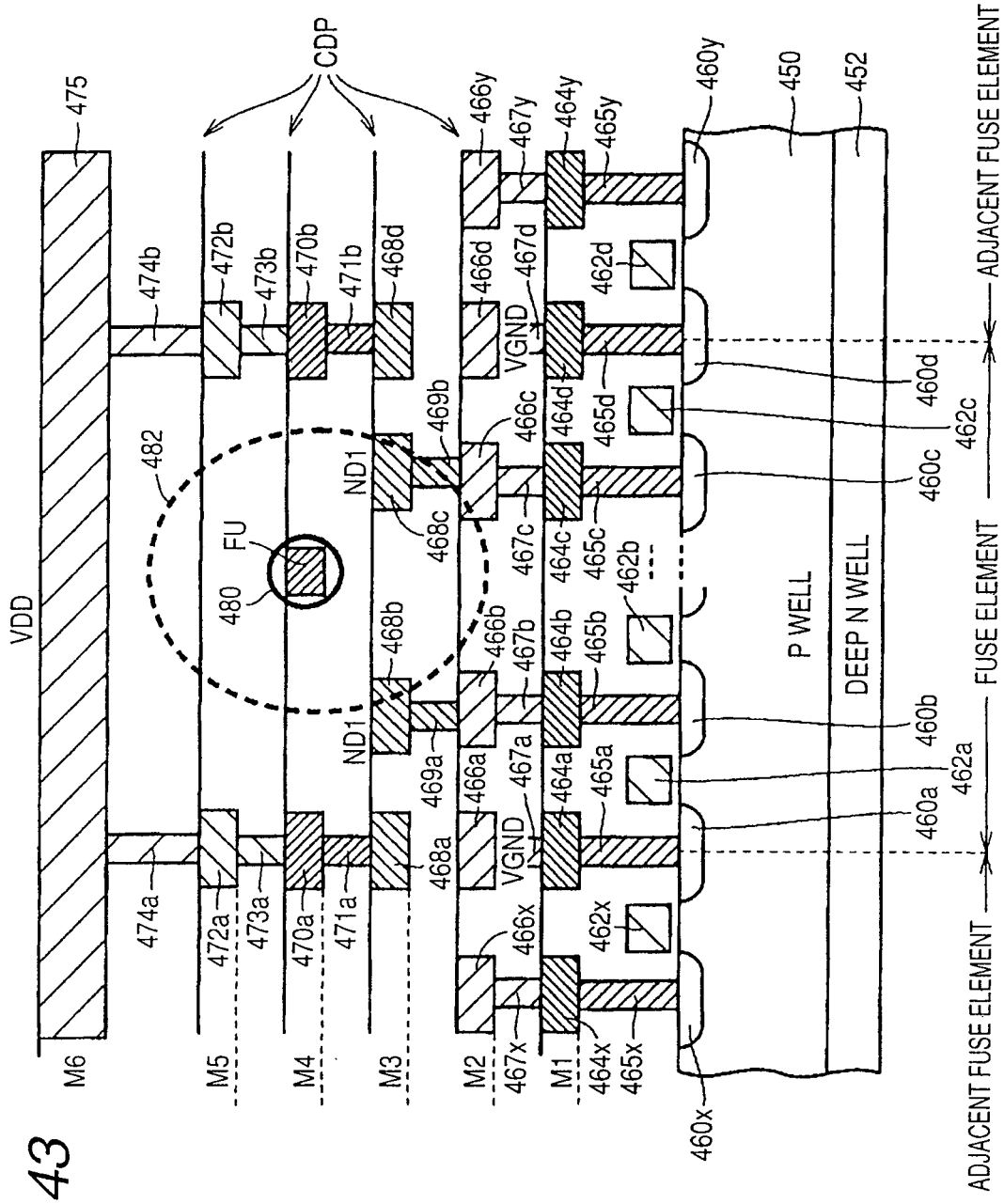
FIG. 43 is a diagram schematically showing a sectional structure of a fuse element according to a sixth embodiment of the invention.

FIG. 43 is a diagram schematically showing a sectional structure of a fuse element according to a sixth embodiment of the invention. In FIG. 43, a fuse element is formed above a P well 450. Below the P well 450, a deep N well 452 is formed in a manner similar to the foregoing embodiments. By the deep N well 452, the voltage VGND of the virtual ground line is set to a desired voltage level without exerting an adverse influence on other circuits.

In the P well 450, a device isolation region for isolating a fusing current supply transistor between adjacent fuse elements is not provided. In the surface of the P well 450, impurity regions 460*a* to 460*d*, 460*x*, and 460*y* are provided at intervals. The impurity regions 460*a* and 460*d* are shared by adjacent fuse element regions. In FIG. 43, the impurity regions 460*x* and 460*y* in the adjacent fuse element regions are also shown.

Gate electrode wires 460*x* and 462*a* to 462*d* are disposed via a not-shown gate insulating film on the surface of the P well (substrate region) 450.

In the first metal wiring layer M1, first metal wires 464*x*, 464*a* to 464*d*, and 464*y* are disposed in correspondence with the impurity regions 460*x*, 460*a* to 464*d*, and 464*y*, respectively, and are coupled to the corresponding impurity regions 460*x*, 460*a* to 460*d*, and 460*y* via contacts 465*x*, 465*a* to 465*d*, and 465*y*, respectively.

In the second metal wiring layer M2, second metal wires 466*x*, 466*a* to 466*d*, and 466*y* are aligned in correspondence with the first metal wires 464*x*, 464*a* to 464*d*, and 464*y*, respectively. The second metal wires 466*x*, 466*a* to 466*d*, and 466*y* are coupled to the corresponding first metal wires 464*x*, 464*a* to 464*d*, and 464*y* via groove-shaped first vias 467*x*, 467*a* to 467*d*, and 467*y*, respectively.

In the third metal wiring layer M3, third metal wires 468*a* to 468*d* are aligned in correspondence with the second metal wires 466*a* and 466*d*, respectively. The third metal wires 468*b* and 468*c* are coupled to the corresponding second metal wires 466*b* and 466*c* via the groove-shaped second vias 469*a* and 469*b*, respectively. The third metal wires 468*b* and 468*c* are coupled to the node ND1. On the other hand, the third metal wires 468*a* and 468*d* are isolated from the corresponding second metal wires 466*a* and 466*d* in a lower layer. The second metal wires 466*a* and 466*d* are coupled to the virtual ground line and transmit the virtual ground voltage VGND.

In the fourth metal layer M4, fourth metal wires 470*a* and 470*b* are aligned in correspondence with the third metal wires 468*a* and 468*d*, respectively. By using the fourth metal wire between the fourth metal wires 470*a* and 470*b*, a fuse FU is formed. The fourth metal wires 470*a* and 470*b* are coupled to the corresponding third metal wires 468*a* and 468*d* via groove-shaped third vias 471*a* and 471*b*, respectively.

In the fifth metal wiring layer M5, fifth metal wires 472*a* and 472*b* are disposed in correspondence with the fourth metal wires 470*a* and 470*b*, respectively. The fifth metal wires 472*a* and 472*b* are coupled to the corresponding fourth metal wires 470*a* and 470*b* in a lower layer aligned via the groove-shaped fourth vias 473*a* and 473*b*, respectively.

The fifth metal wires 472*a* and 472*b* are coupled to a metal wire 475 in the sixth metal wiring layer M6 via groove-shaped fifth vias 474*a* and 474*b*, respectively. The metal wire 475 is a power supply line that transmits the power supply voltage VDD and is disposed so as to cover a fuse trimming region 480. The wiring structure of the metal wire 475 may be a solid wire or striped wires.

Also in the structure of the fuse element shown in FIG. 43, the copper diffusion preventing films CDP are disposed in the borders of the metal wiring layers. The fuse FU is cut in the trimming region 480. By heat generated at the time of cutting a fuse, high temperature at the time of cutting is transmitted to the damage region 482, and there is the possibility that the interlayer insulating film is damaged. However, since no wire is disposed just above and just below the fuse FU, no adverse influence is exerted on the wires.

By disposing the third metal wiring layers 468*b* and 468*c* coupled to the nodes ND1 on the inside of the third metal wires 468*a* and 468*b* that transmit the power supply voltage VDD, the diffusion preventing wall structure without a gap is realized, and thermal diffusion paths of copper at the time of cutting the fuse FU can be reliably interrupted, and thermal diffusion paths of copper to adjacent fuses can be reliably interrupted. The diffusion preventing wall is shared by adjacent fuse elements.

Figure 44:
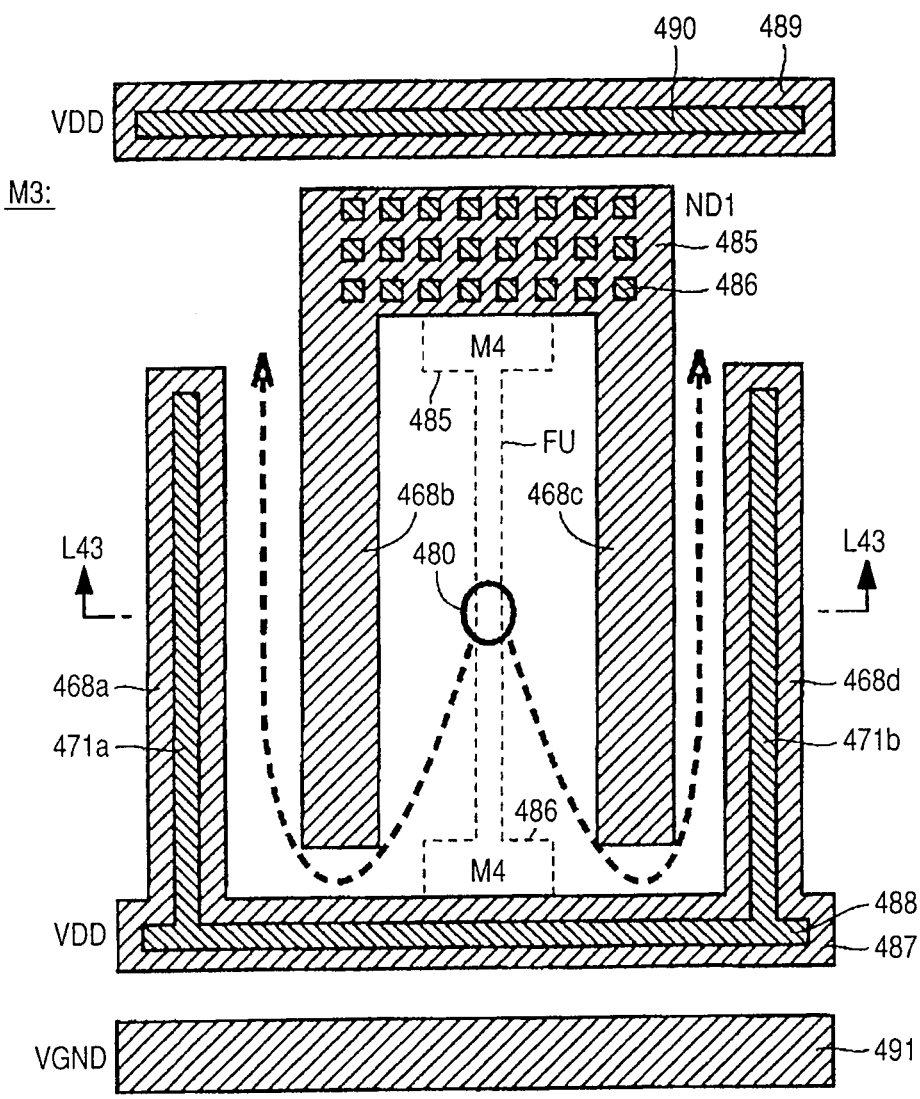
FIG. 44 is a diagram showing wiring layout of a third metal wiring layer of the fuse element illustrated in FIG. 43 together with layout of a fuse.

FIG. 44 is a diagram showing wiring layout of the third metal wiring layer M3 of the fuse element illustrated in FIG. 43. In FIG. 44, the disposition of the fuse FU formed by the wire in the fourth metal wiring layer M4 is also shown by broken lines. A sectional structure taken along line L43-L43 shown in FIG. 44 corresponds to the sectional structure shown in FIG. 43.

In FIG. 44, the third metal wires 468b and 468c extend long in the vertical direction and are coupled to the fourth metal bed wire 485 which is disposed in correspondence with the fourth metal bed wire of the fuse FU. In the surface of the third metal bed wire 485, a plurality of unit third vias 486 are aligned, and are electrically coupled to a bed wire in an upper layer. For the third metal wires 468b and 468c, no groove-shaped vias are provided.

The third metal wires 468a and 468d disposed on the outside regions of the third metal wires 468b and 468c are formed so as to extend long in the vertical direction into the fuse device formation region, and are coupled to the third metal wire 487 continuously extending in the lateral direction. On the third metal wire 487, a continuously-extending groove-shaped third vias 488 is formed. The groove-shaped third vias 471a and 471b formed in the third metal wires 468a and 468d are coupled to the groove-shaped third via 487. The third metal wire 487 transmits the power supply voltage VDD and finally is coupled to the power supply line disposed in the sixth metal wiring layer M6 via an intermediate wire and a via.

A third metal wire 489 continuously extending in the lateral direction is disposed in a region on the outside of the third metal bed wire 485. A groove-shaped third via 490 is formed in the surface of the third metal wire 489 to transmit the power supply voltage VDD.

In a region on the outside of the third metal wire 487, a third metal wire 491 continuously extends in the lateral direction and transmits the virtual ground voltage VGND. In the surface of the third metal wire 491, no groove-shaped via is formed. Through a second via formed in a lower part of the third metal wire 491, the third metal wire 491 is electrically coupled to a second metal wire in a lower layer.

At both ends of the fuse FU, the fourth metal pad wires 485 and 486 are formed. The third metal pad wire 485 is electrically coupled to a corresponding fourth metal bed wire disposed, and the pad wire 486 is coupled to a power supply line via a fourth metal bed wire disposed in an upper layer in correspondence with the third metal wire 487.

As shown in FIGS. 43 and 44, by disposing the third metal wires 468b and 468c coupled to the node ND1 so as to surround the trimming region 480 in the fuse FU, even in the case where a gap is created between the third metal wires 468a and 468d and the second metal wires 466a and 466d, thermal diffusion of copper via the gap can be prevented. The copper thermal diffusion paths from the trimming region 480 are a region between the third metal wires 468a and 468b and a region between the third metal wires 468c and 468d as shown by dashed arrows in FIG. 44. The path length is sufficiently longer than the thermal diffusion distance of copper. Thermal diffusion of copper to an adjacent fuse element via the path is suppressed reliably.

Therefore, as shown in FIGS. 43 and 44, in the case where the copper diffusion preventing wall is shared by adjacent fuse elements, by disposing the preventing wall which is coupled to the node N1 in the outer preventing wall structure, thermal diffusion of copper can be reliably suppressed without increasing the fuse element area.

By disposing an intermediate wire and a via coupled to the lower-layer ground line VGND and an intermediate wire and a via coupled to the power supply voltage VDD so as to be aligned in the vertical direction, the layout area of the fuse element preventing wall structure can be reduced.

Also in the structure of the fuse element shown in FIG. 43, in the case where the wire in the first metal wiring layer M1 has high electromigration tolerance, the fuse FU may be formed by the wire in the third metal wiring layer, the wires shown in FIG. 43 may be shifted downward by one wiring layer, and the power supply line formed in the fifth metal wiring layer M5 covers the fuse trimming region from above.

Also in the embodiment, although not shown, the fuse element trimming region is covered by the sixth metal wire 475 in plan view. In the case of cutting the fuse FU, there is a case that a crack occurs so as to be apart from the fuse to the upper side of the fuse FU using, as starting points, two points at corner parts of the fuse FU as a contact part between the fuse FU and the copper diffusion preventing film and the interlayer film (interlayer insulating film), and the crack reaches the sixth metal wire 475. The copper metal enters the crack and it causes short circuit between the fuse FU and the sixth metal wire 475. At this time, the potential of the fuse FU becomes the power supply voltage VDD on the sixth metal wire 475. Accordingly, poor trimming can be detected by the cut determining circuit CJC, and the chip (semiconductor device) can be detected as a defective and eliminated before shipment of the product. In the embodiment of the invention, the metal wire disposed above the slim fuse FU and closest to the fuse FU is the sixth metal wire 475. In the layout structure, the power supply voltage VDD is supplied to the sixth metal wire 475.

Seventh Embodiment

Figure 45:
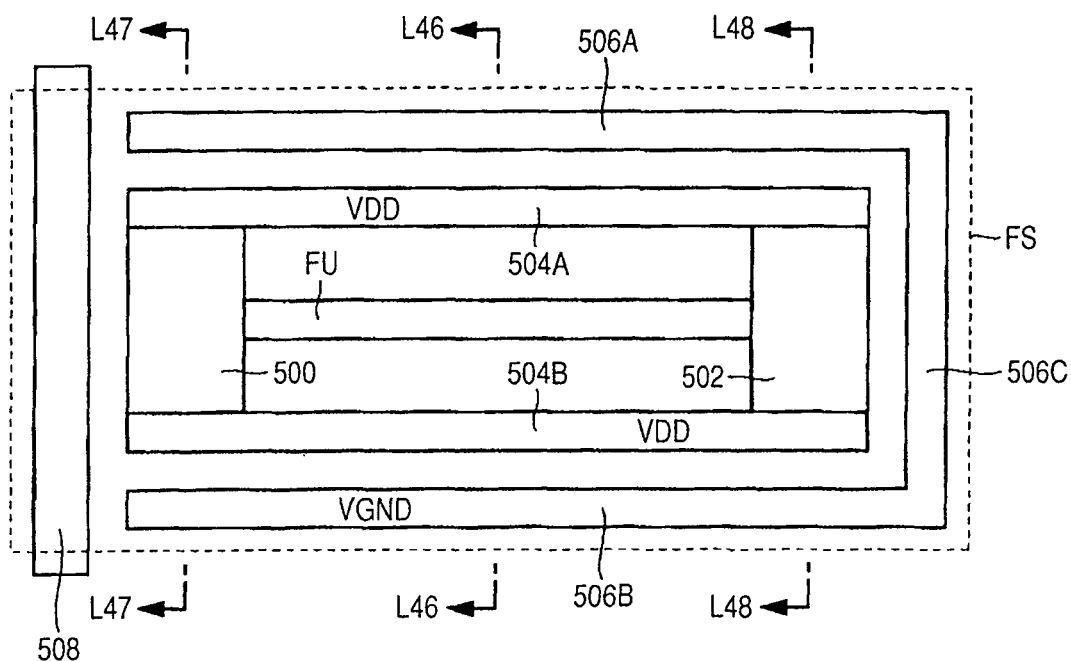
FIG. 45 is a diagram schematically showing planar layout of an entire fuse according to a seventh embodiment of the invention.

FIG. 45 is a diagram schematically showing planar layout of a fuse element according to a seventh embodiment of the invention. In FIG. 45, the formation region of the fuse element FS includes a fuse FU and pad/bed wiring regions 500 and 502 disposed on both sides of the fuse FU. One of the pad/bed wiring regions 500 and 502 is coupled to the node ND1 and the other is coupled to the power supply line that supplies power supply voltage.

On both sides of the fuse FU, first sub preventing wall structures 504A and 504B forming a first preventing wall structure are disposed. On the outside of the first preventing wall structure, second sub preventing wall structures 506A, 506B, and 506C forming a second preventing wall structure continuously extend in a U shape. The first preventing wall structures 504A and 504B are coupled to the power supply line that supplies the power supply voltage VDD, and are coupled to the virtual ground line that transmits the virtual ground voltage VGND forming the second preventing wall structure. By the preventing wall structures 504A, 504B, and 506A to 506C, paths of thermal diffusion of copper (Cu) atoms generated at the time of cutting the fuse FU are blocked.

On the outside of the pad/bed wiring region 500, further, a global wiring region 508 is disposed. The global wiring region 508 is provided commonly for a plurality of fuse elements, and a preventing wall structure that prevents thermal diffusion of copper atoms to the outside of the fuse box in cooperation with the groove-shaped via is realized.

Although not clearly shown in FIG. 45, a copper diffusion preventing wall is formed by using the power supply wire above the fuse FU (above the fuse trimming region).

Figure 46:
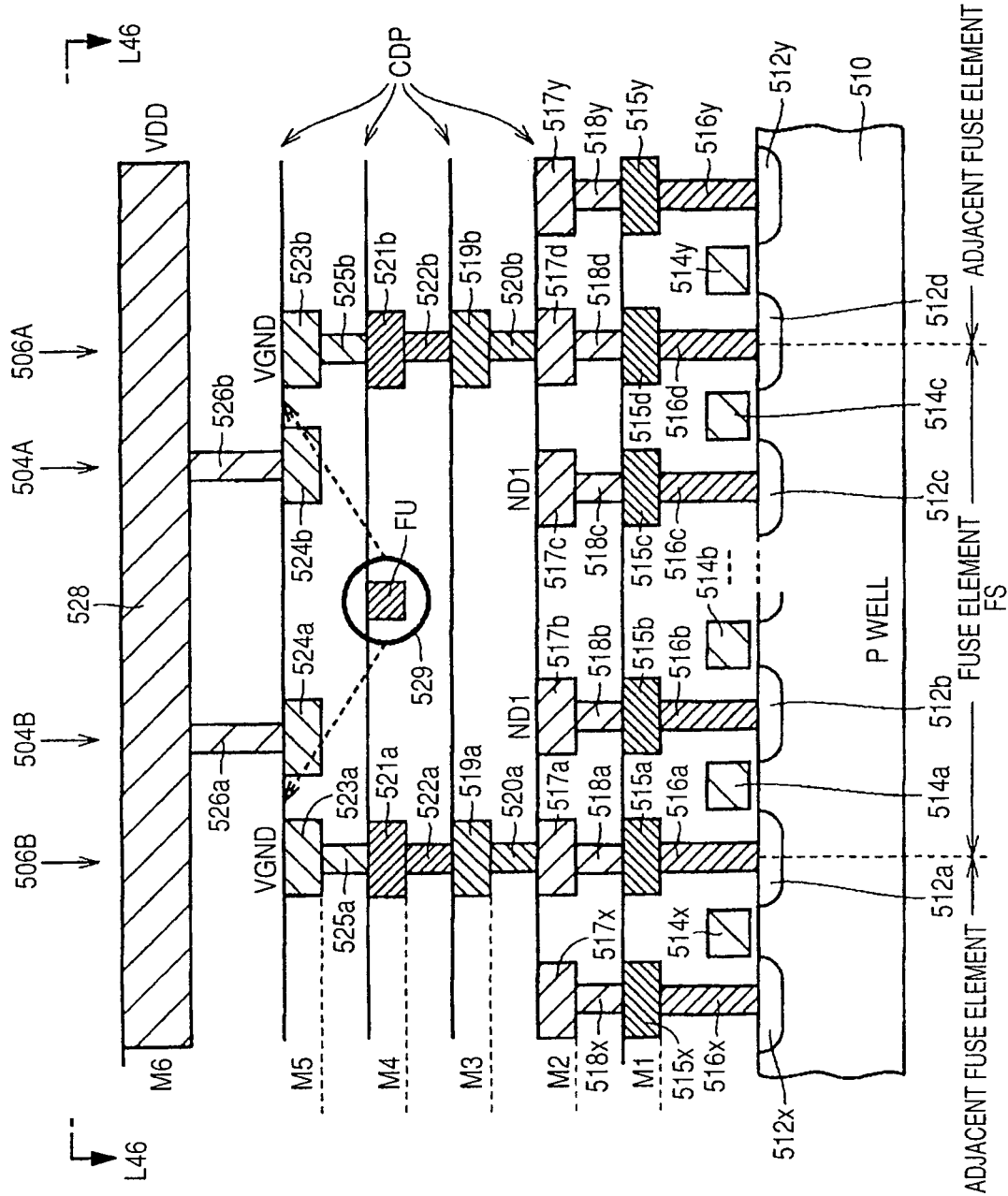
FIG. 46 is a diagram schematically showing a sectional structure taken along line L46-L46 illustrated in FIG. 45.

FIG. 46 is a diagram schematically showing a sectional structure taken along line L46-L46 illustrated in FIG. 45. In FIG. 46, a fuse element is formed above the surface of a P well (semiconductor substrate region). In the surface of the P well 510, impurity regions 512x, 512a to 512d, and 512y are formed at intervals. The impurity regions 512a and 512d are shared by adjacent fuse elements. By the impurity regions 512a to 512d, source/drain impurity regions of a unit transistor of the fusing current supply transistor for one fuse are formed. The impurity regions 512x and 512y in the adjacent fuse elements are also used for forming the drain regions of the corresponding fusing current supply transistors.

Above the substrate regions between the impurity regions 512x, 512a to 512d, and 512y, gate electrode wires 514x, 514a to 514c, and 514y are disposed. By the impurity regions and the gate electrode wires, the fusing current supply unit transistor is realized.

In the first metal wiring layer M1, first metal wires 515x, 515a to 515d, and 515y are disposed in correspondence with the impurity regions 512x, 512a to 512d, and 512y, respectively. Those wires are coupled to the corresponding impurity regions via contacts 516x, 516a to 516d, and 516y, respectively.

In the second metal wiring layer M2, second metal wires 517x, 517a to 517d, and 517y are aligned in correspondence with the first metal wires 515x, 515a to 515d, and 515y, respectively. The second metal wires 517x, 517a to 517d, and 517y are coupled to the first metal wires 515x, 515a to 515d, and 515y via groove-shaped first vias 518x, 518a to 518d, and 518y, respectively. The second metal wires 517b and 517c are coupled to the nodes ND1, and coupled to the drain impurity regions 512b and 512c in the fusing current supply transistor. Also in adjacent fuse elements, similarly, the second metal wires 517x and 517y serve as components of the nodes ND1 with which ends of corresponding fuses comes into contact, and are coupled to the drain impurity regions 512x and 512y.

In the third metal wiring layer M3, third metal wires 519a to 519b are aligned in correspondence with the second metal wires 517a and 517d, respectively. No third metal wires are disposed on the second metal wires 517b and 517c. The third metal wires 519a and 519b are coupled to the second metal wires 517a and 517d in a lower layer via the groove-shaped second vias 520a and 520b, respectively.

In the fourth metal wiring layer M4, fourth metal wires 521a and 521b are aligned in correspondence with the third metal wires 519a and 519b, respectively. By using the fourth metal wire between the fourth metal wires 521a and 521b, a fuse FU is formed.

The fourth metal wires 521a and 521b are coupled to the third metal wires 519a and 519b in a lower layer via groove-shaped third vias 522a and 522b, respectively.

In the fifth metal wiring layer M5, fifth metal wires 523a and 523b are aligned in correspondence with the fourth metal wires 521a and 521b, respectively. The fifth metal wires 524a and 524b are disposed on the inside of the fifth metal wires 523a and 523b. The fifth metal wires 523a and 523b are coupled to the fourth metal wires 521a and 521b via the groove-shaped fourth vias 525a and 525b, respectively. The fifth metal wires 524a and 524b are coupled to a sixth metal wire 528 formed in the sixth metal wiring layer M6 via groove-shaped fifth vias 526a and 526b, respectively.

The fifth metal wires 523a and 523b are coupled to the virtual ground line and transmit the virtual ground voltage VGND. The sixth metal wire 528 is coupled to the power supply line and transmits the power supply voltage VDD. The sixth metal wire 528 is disposed so as to cover a trimming region 529 in the fuse FU and serves as an upper diffusion preventing wall wire. The sixth metal wire 535 serves as a global power supply line and transmits the power supply voltage VDD. The shape of the sixth metal wire 528 (refer to FIG. 46) formed just above the fuse FU may be a solid wire or striped wires like in the foregoing embodiments.

The metal wires from the fifth metal wire 523a to the first metal wire 515a and the metal wires from the fifth metal wire 523b to the first metal wire 515d are disposed continuously in the vertical direction, thereby configuring the second preventing wall structures 506B and 506A shown in FIG. 45. By the fifth metal wires 524a and 524b and the fifth vias 526a and 526b, the first preventing wall structures 504B and 504A shown in FIG. 45 are formed.

As shown in FIG. 46, the copper diffusion paths indicated by the dashed arrows from the trimming region 529 in the fuse FU are interrupted by the fifth metal wires 524a and 524b formed in an upper layer. Therefore, propagation of copper atoms from the copper pieces of the fuse FU to adjacent fuses by thermal diffusion can be reliably suppressed.

Also in FIG. 46, in the border region between the wiring layers, the copper diffusion preventing films CDP are disposed between the interlayer insulating films, and thermal diffusion of copper via the interlayer insulting film is suppressed. The preventing wall structures 506A and 506B are shared by adjacent fuse elements, so that the layout area of the fuse element can be reduced.

Figure 47:
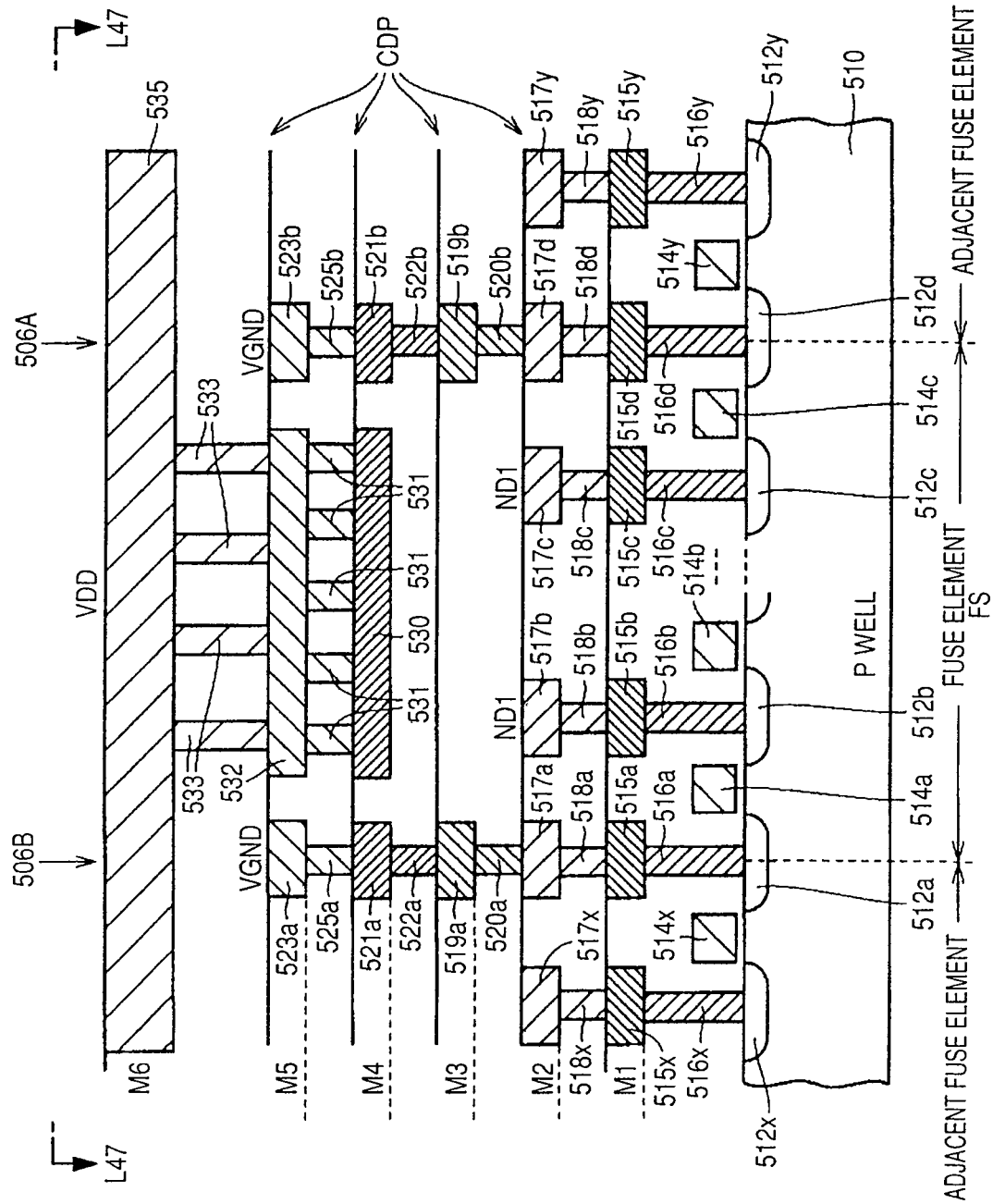
FIG. 47 is a diagram schematically showing a sectional structure taken along line L47-L47 illustrated in FIG. 45.

FIG. 47 is a diagram schematically showing a sectional structure taken along line L47-L47 illustrated in FIG. 45. In the sectional structure shown in FIG. 47, the same reference numerals are designated to components (metals, wires, vias, impurity regions, and the like) corresponding to those of the sectional structure shown in FIG. 46, and the detailed description will not be repeated.

In the structure shown in FIG. 47, in the pad/bed wire region 500 shown in FIG. 45, a fourth metal pad/bed wire 530 is disposed in the fourth metal wiring layer M4. The fourth metal pad/bed wire 530 is coupled to a pad/bed wire 532 formed in the fifth metal wiring layer M5 via a plurality of unit vias 531. The fifth metal bad/bed wire 532 is coupled to a metal wire 535 in the sixth metal wiring layer M6 formed in an upper layer via unit fifth vias 533.

The sixth metal wire 535 serves as a global power supply line and transmits the power supply voltage VDD. Since it is sufficient for the sixth metal wire 528 (refer to FIG. 46) formed just above the fuse FU to have a structure covering the trimming region 529 in the fuse FU, although different reference numbers are designated to the sixth metal wires 535 and 528 in FIG. 47, the wires 535 and 528 are electrically coupled by a not-shown sixth metal wire.

Also at ends of the fuse element FS, in the fourth metal wiring layer M4, the fourth metal wire 521a, the pad/bed wire 530, and the fifth metal wire 521b are disposed, and a thermal diffusion path of copper atoms to the outside of the fuse element is interrupted (in the region shown in FIG. 47, the fuse FU is not provided for a reason that the pad/bed wire 530 is disposed in the metal wiring layer M4 in which the fuse FU is also disposed).

Figure 48:
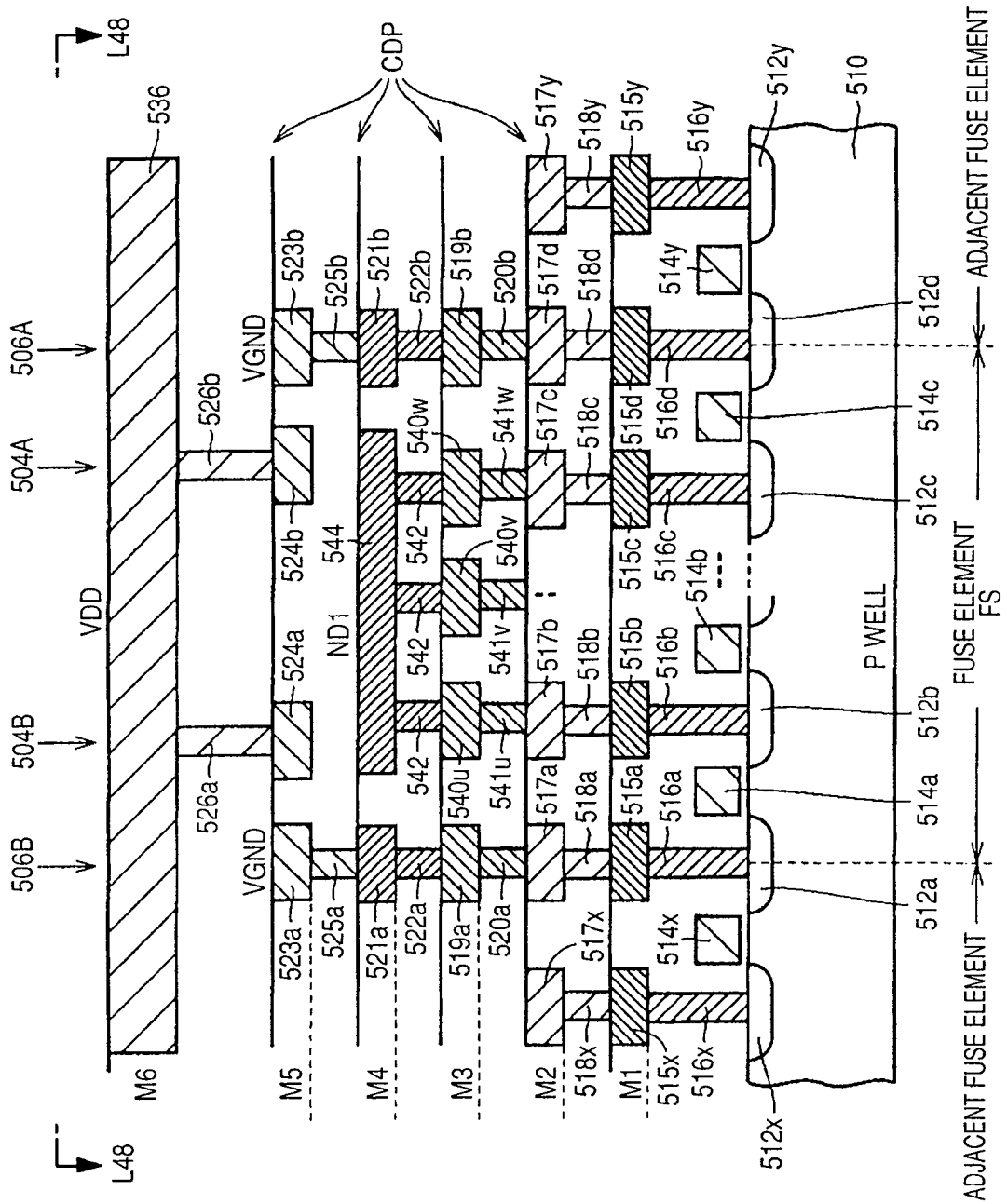
FIG. 48 is a diagram schematically showing a sectional structure taken along line L48-L48 illustrated in FIG. 45.

FIG. 48 is a diagram schematically showing a sectional structure taken along line L48-L48 illustrated in FIG. 46. The sectional structure shown in FIG. 48 is different from that of the fuse element shown in FIG. 46. That is, no fuse is disposed in the pad/bed wire region 502 shown in FIG. 45 and, instead, the pad/bed wire 544 as a component of the node ND1 is disposed in the fourth metal wiring layer M4. The pad/bed wire 544 is coupled to fourth intermediate wires 540u to 540w via the unit vias 542. The fourth metal intermediate lines 540u to 540W are disposed in correspondence with second metal wires 517b to 517c disposed in the second metal wiring layer M2, and are coupled to corresponding second metal wires via the unit vias 541u to 540w. In the fuse device FC formation region, a fusing current supply transistor is formed by a plurality of unit transistors, and the third metal intermediate wires 540 (540u to 540w) are disposed in correspondence with drain electrodes of the unit transistors. In FIG. 48, to show that a number of unit transistors are formed, the fourth metal intermediate wires 540 of the number larger than the second metal wires 517b and 517c in the second metal wiring layer M2 are disposed.

The other structure in the sectional structure of the fuse element shown in FIG. 48 is the same as the sectional structure of the fuse element shown in FIG. 46, the same reference numerals are designated to corresponding parts, and the detailed description will not be repeated.

Also in the structure of the fuse element FS shown in FIG. 48, the pad/bed wire 544 is formed in the fourth metal wiring layer M4 in which the fuse is also formed. Above it, the fifth metal wires 523a, 523b, 524a, and 524b are disposed. Also at terminating ends of the fuse, the preventing wall structure without a gap is formed by the groove-shaped vias 525a, 525b, 526a, and 526b, and copper thermal diffusion paths to the outside of the fuse box can be blocked.

As shown in FIGS. 46 to 48, a first preventing wall structure is shared by adjacent fuse elements, and a second preventing wall is formed in the fifth metal wiring layer. Therefore, paths of copper thermal diffusion to the adjacent fuse elements can be interrupted and, in addition, the occupation area of the fuse elements can be reduced.

Figure 49:
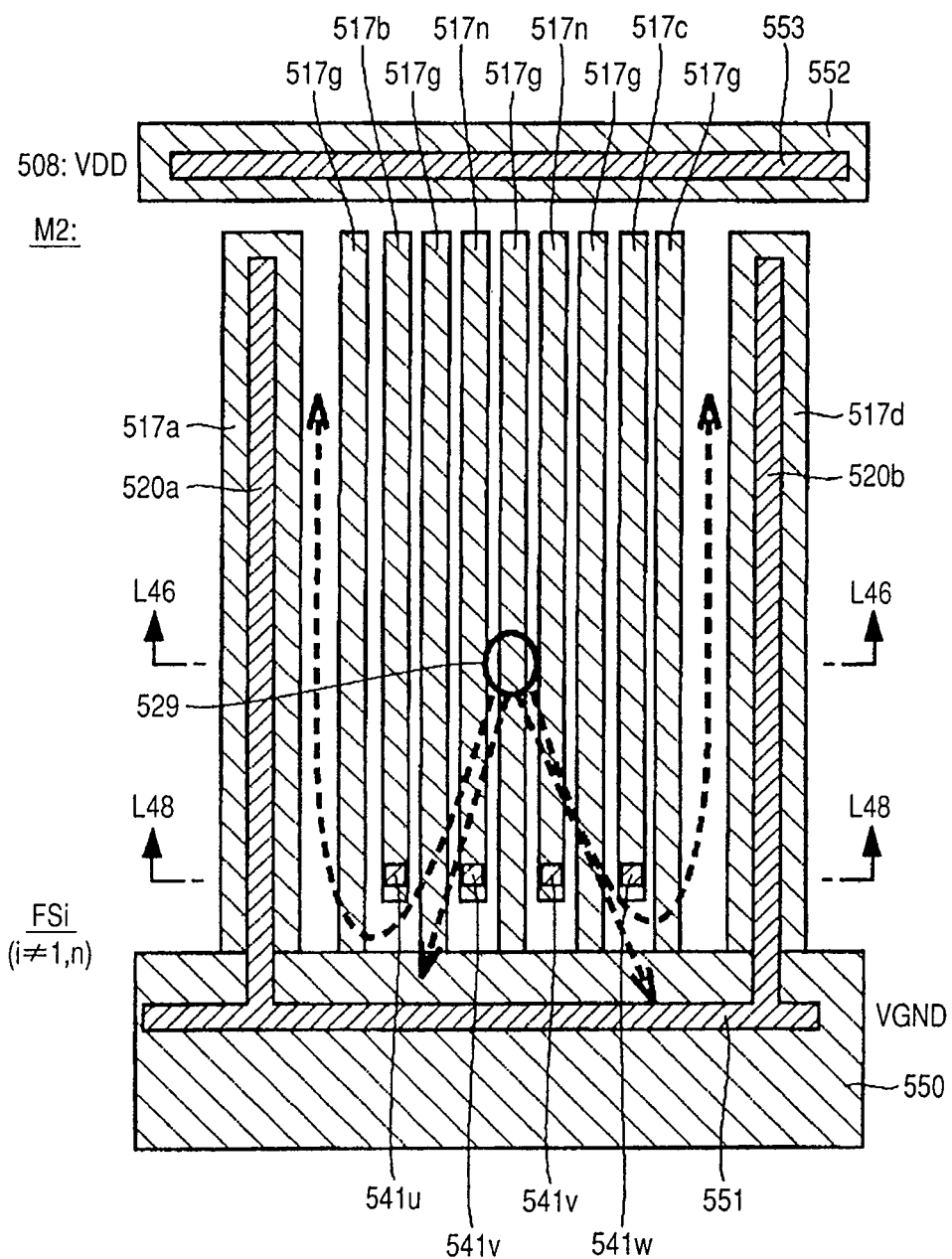
FIG. 49 is a diagram schematically showing planar layout of a second metal wiring layer and a second via of the fuse element illustrated in FIG. 45.

FIG. 49 is a diagram schematically showing wiring layout of the second metal wiring layer of the fuse element shown in FIGS. 45 to 48. A section taken along line L46-L 46 of FIG. 49 shows the layout of the second metal wiring layer in the sectional structure of FIG. 46. A section taken along line L48-L48 shows a sectional structure below the second metal wiring layer shown in FIG. 48. The fuse element FSi is disposed in a position other than the ends in the fuse box.

Since the number of unit transistors configuring the fusing current supply transistor is determined according to the current drive force of the fusing current supply transistor, the number of wirings of the second metal wiring layer configuring the source and drain nodes of the fusing current supply transistor shown in FIGS. 46 to 48 is different from that of the second metal wires of the source/drain node shown in FIG. 49. Therefore, with respect to the second metal wires which are not shown in the sectional structures of FIGS. 46 to 48, the second metal wire coupled to the virtual ground line is indicated by reference numeral 517g, and a second metal wire coupled to the node ND1 is indicated by reference numeral 517n.

In FIG. 49, the second metal wirings 517a and 517d extend continuously in the vertical direction and are disposed in the fuse element formation region. Above the second metal wires 517a and 517d, the second vias 520a and 520b having a rectangular shape continuously extend in the vertical direction. For the second metal wires 517a and 517d, a second metal wire 550 continuously extending in the lateral direction is formed, and a groove-shaped second via 551 extending in the lateral direction is formed in the surface of the second metal wire 550. The groove-shaped second vias 520a and 520b are coupled to the groove-shaped second via 551, and the second metal wires 517a, 517d, and 517g are coupled to the second metal wire 550. The second metal wire 517g forms the source electrode of the unit transistor in the fusing current supply transistor, so that no via is formed above the second metal wire 517g. The second metal wire 550 is coupled to the virtual ground line, and transmits the virtual ground voltage VGND.

The second metal wires 517b and 517c extend in the vertical direction, and vias 541u and 541w are formed at ends. Similarly, a unit second via 541v is formed at an end of the second metal wire 517n. The second metal wires 517b, 517c, and 517n and the second metal wire 517g are disposed alternately.

In the global wiring region 508 on the outside of the second metal wiring disposition region, a second metal wire 552 continuously extending in the lateral direction is formed. A groove-shaped second via 553 is formed in the surface of the second metal wire 552. The wire 552 and the via 553 transmit the power supply voltage VDD.

Figure 50:
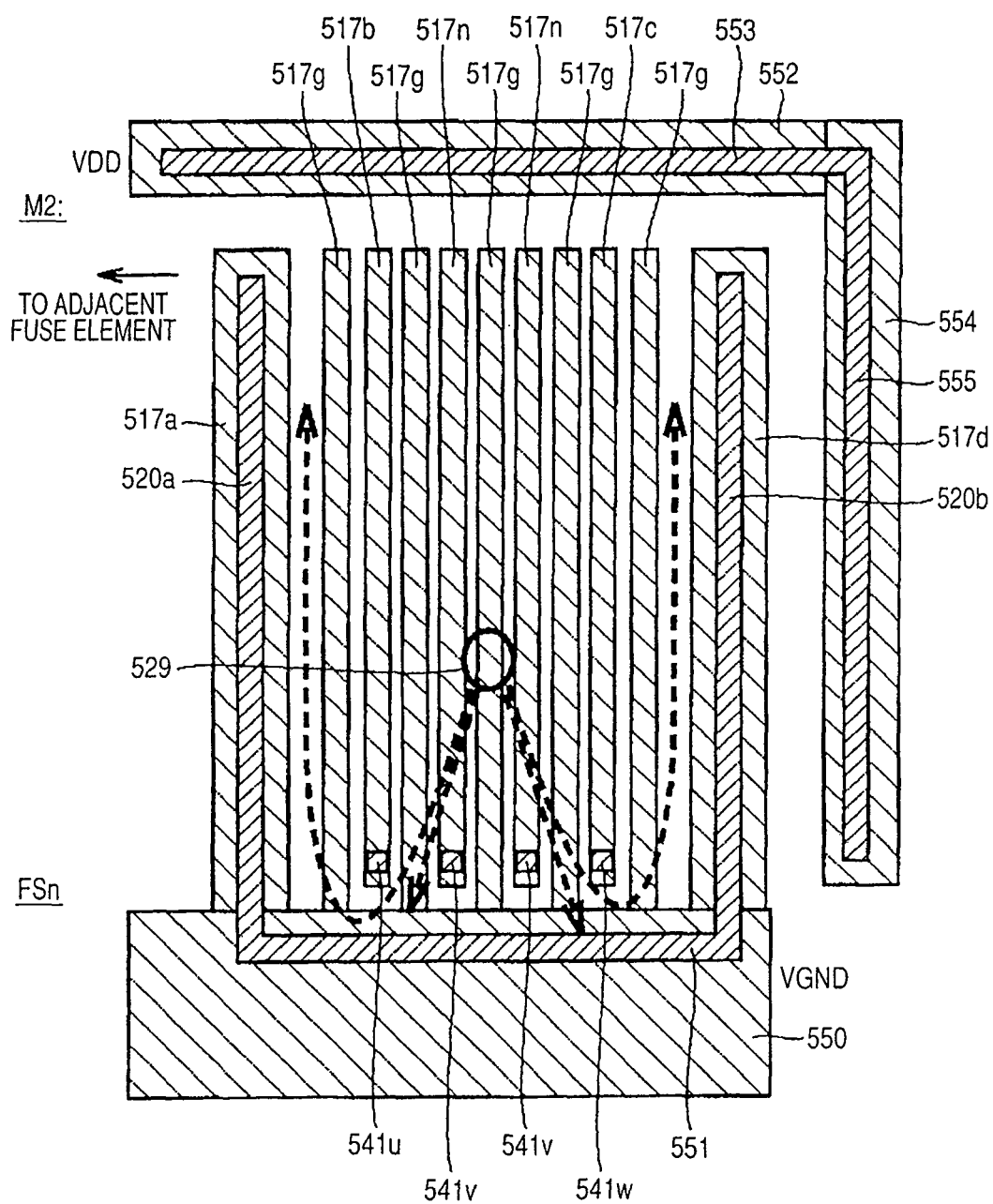
FIG. 50 is a diagram schematically showing planar layout of a second metal wiring layer and a second via at an end of a fuse box of a fuse element according to the seventh embodiment of the invention.

FIG. 50 is a diagram schematically showing planar layout of the fuse element FSn at an end of the fuse box in which the fuse elements FSi are arranged. In FIG. 50, at the end of the fuse box, a second metal wire 554 and a groove-shaped second via 555 extend in the vertical direction. The second metal wire 554 is coupled to the second metal wire 552, and the groove-shaped second via 555 is coupled to the second via 553. The other configuration of the fuse element FSn shown in FIG. 50 is the same as that of the fuse element FSi shown in FIG. 49, the same reference numerals are designated to corresponding parts, and their detailed description will not be repeated.

As shown in FIGS. 49 and 50, in the second metal wiring layer M2, all of the copper thermal propagation paths from the trimming region 529 are blocked as shown by dashed arrows. In particular, the copper thermal diffusion paths to the outside of the fuse box are blocked with reliability. Although the copper thermal diffusion paths exist as shown by the dashed arrows along the groove-shaped second vias 520a and 520b in the second metal wiring layer, the path length is sufficiently longer than the copper thermal diffusion distance. Therefore, thermal diffusion of copper to adjacent fuse elements is reliably suppressed.

Figure 51:
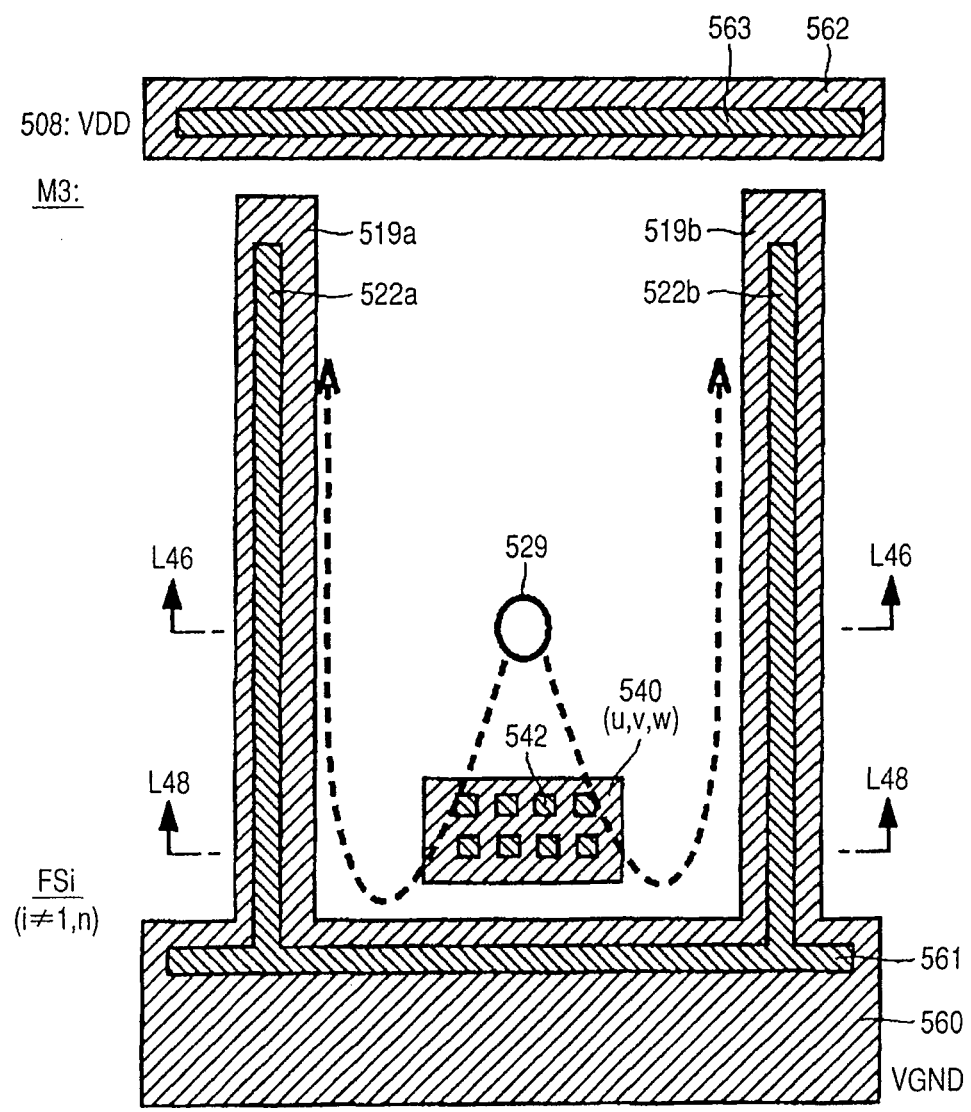
FIG. 51 is a diagram schematically showing planar layout of a third metal wiring layer and a third via in an upper layer of the planar layout illustrated in FIG. 49.

FIG. 51 is a diagram schematically showing wiring layout of the third metal wiring layer M3 of the fuse element illustrated in FIGS. 45 to 48. Also in FIG. 51, the cut lines L46-L46 and L48-L48 of the sectional structures shown in FIGS. 46 and 48 are also illustrated.

In FIG. 51, third metal wires 519a and 519b extend in the vertical direction, and groove-shaped third vias 522a and 522b continuously extend in the vertical direction in the surface of the metal wires 519a and 519b. A third metal intermediate wire 540 having a rectangular shape is disposed between the third metal wires 519a and 519b. The third metal intermediate wire 540 corresponds to the third metal intermediate wires 540u, 540v, and 540w shown in FIG. 48, each of which is provided with a third via 542. The third metal intermediate wire 540 is coupled to the second metal wires 517b, 517c, and 517n shown in FIG. 49 via the vias 541v, 541u, and 541w, respectively. The third metal intermediate wire may be disposed so as to be separate in correspondence with each of the second metal wires in a lower layer (may be disposed for each of the wires 540u, 540v, and 540w.) To simplify the drawing, the intermediate wire 540 having a rectangular shape is shown.

A third metal wire 560 is formed so as to continuously extend in the lateral direction in correspondence with the third metal wires 519a and 519b. In the surface of the third metal wire 560, a groove-shaped third via 561 is formed. The third metal wires 519a and 519b are coupled to the third metal wire 560, and the third vias 522*a* and 522*b* are coupled to the third via 561. The third metal wire 560 is coupled to the virtual ground line and transmits the virtual ground voltage VGND.

In the global wiring region 508, a third metal wire 562 continuously extending in the lateral direction is provided. A groove-shaped third via 563 continuously extending in the lateral direction is provided in the surface of the third metal wire 562. The third metal wire 560 transmits the power supply voltage VDD.

Figure 52:
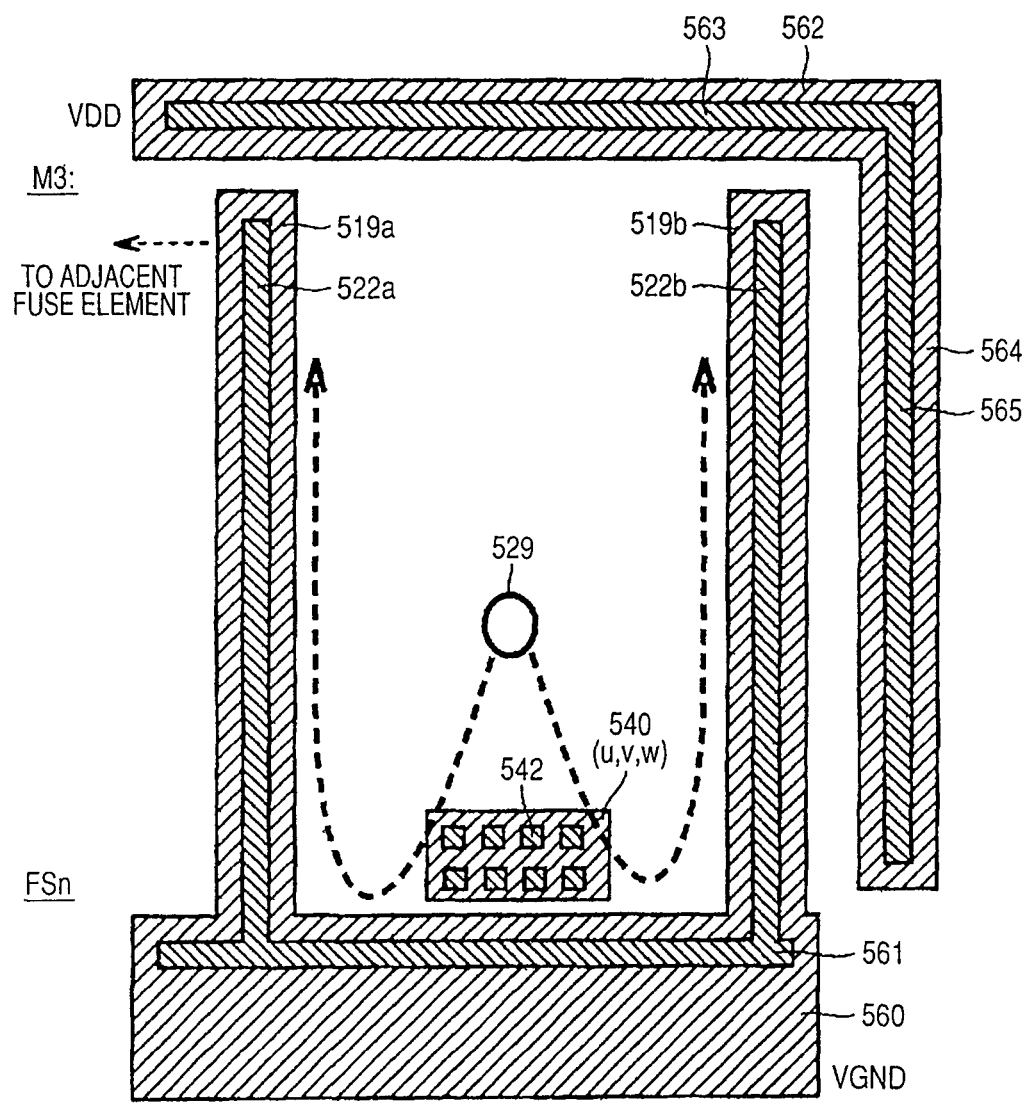
FIG. 52 is a diagram schematically showing planar layout of the third metal wiring layer and the third via in an upper layer of the planar layout illustrated in FIG. 50.

FIG. 52 is a diagram schematically showing the layout of the third metal wiring layer in the fuse FSn disposed at an end of the fuse box. In the fuse element FSn, at an end of the fuse box, further, a third metal wire 564 extend in the vertical direction, and a groove-shaped third via 565 is formed in the surface of the third metal wire 564. The third metal wire 564 is coupled to the third metal wire 563 continuously extending in the fuse box for a fuse element sequence, and the third via 565 is coupled to the groove-shaped third via 563 formed in the third metal wire 562.

The third metal wire 560 is coupled to the second metal wire 550 shown in FIGS. 49 and 50 via a groove-shaped second via, and the third metal wire 562 is coupled to the second metal wire 552 shown in FIGS. 49 and 50 via the second via 553.

As shown by dashed arrows in FIGS. 51 and 52, also in the third metal wiring layer M3, the thermal diffusion paths of copper (Cu) from the fuse trimming region 529 are reliably blocked by the third metal wires 519*a*, 519*b*, and 560 and the third vias 522*a*, 522*b*, and 561. Thermal diffusion of copper to the outside of the fuse box is reliably suppressed.

Figure 53:
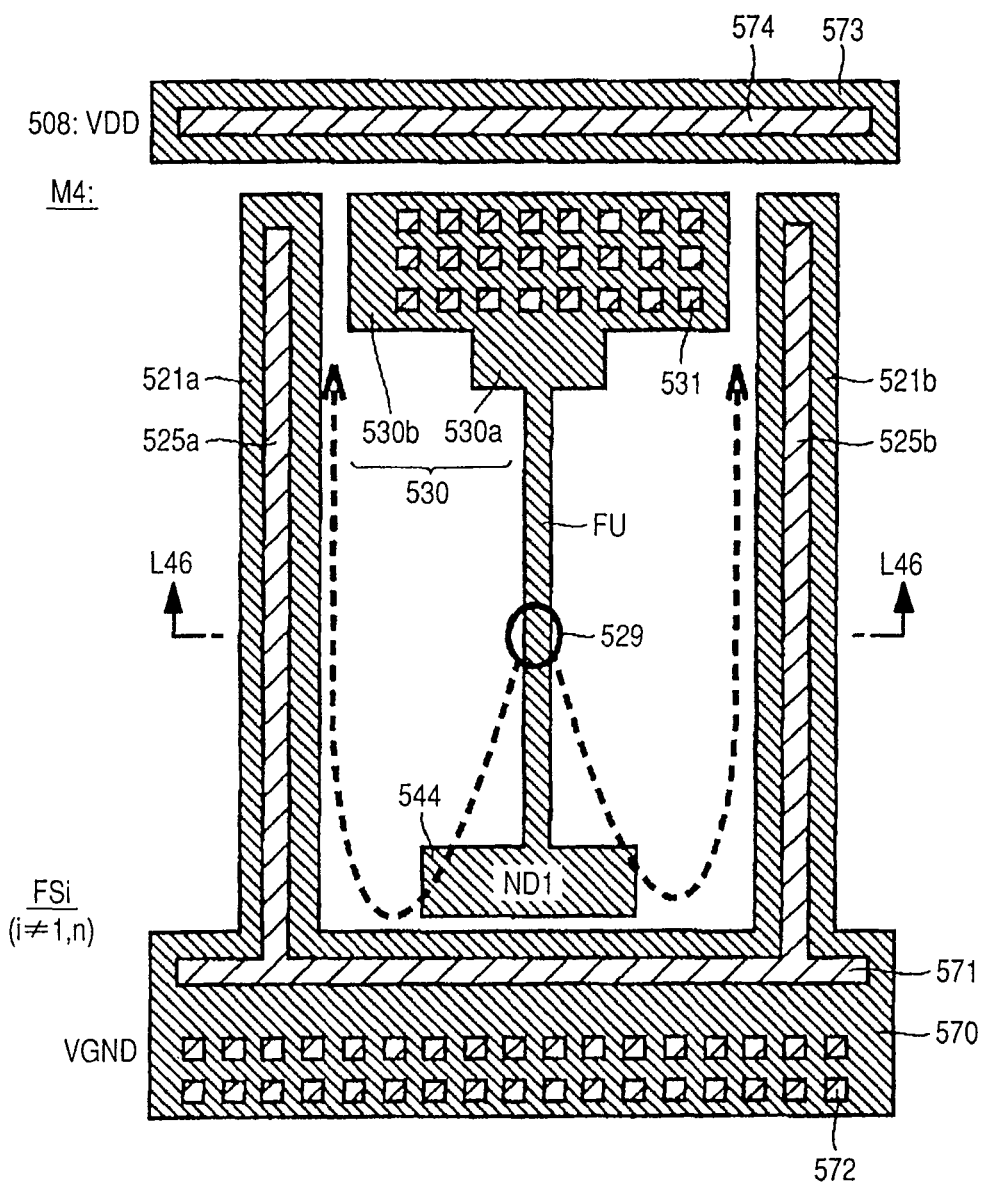
FIG. 53 is a diagram schematically showing planar layout of a fourth metal wiring layer and a fourth via in an upper layer of the wiring layout illustrated in FIG. 51.

FIG. 53 is a diagram schematically showing wiring layout of the fourth metal wiring layer M4 of the fuse element FSi shown in FIGS. 45 to 48. In FIG. 53, a cut line L46-L46 to obtain the sectional structure shown in FIG. 46 is also shown.

In FIG. 53, the fourth metal wires 521*a* and 521*b* extend in the vertical direction, and groove-shaped fourth vias 525*a* and 525*b* are disposed in the surface of the fourth metal wires 521*a* and 521*b*, respectively. The fuse FU is formed by using the metal wire in the fourth metal wiring layer M4. The pad/bed wire 530 and the bed wire 544 are disposed at both ends. The pad/bed wire 530 includes a pad wire 530*a* and a bed wire 530*b* which are coupled to each other. The pad wire 530*a* is coupled at one end of the fuse FU, and a plurality of unit vias 531 are aligned in the surface of the bed wire 530*b*. The bed wire 544 is coupled to the third metal intermediate wire 540 shown in FIG. 51 via the via 542, thereby forming the node ND1.

A fourth metal wire 570 continuously extends in the lateral direction in a region outside of the bed wire 544, and a groove-shaped fourth via 571 is formed in the surface of the fourth metal wire 570. The fourth metal wire 570 is coupled to the fourth metal wires 521*a* and 521*b*, and the groove-shaped fourth via 571 is coupled to the groove-shaped fourth vias 525*a* and 525*b*. In the fourth metal wire 570, a plurality of fourth vias 572 for obtaining coupling to an upper wire are aligned. The fourth metal wire 570 is coupled to the third metal wire 560 shown in FIG. 51 via the via 561.

In the global wiring region 508 on the outside of the pad/bed wire 530, a fourth metal wire 573 extending in the lateral direction is formed. A groove-shaped fourth via 574 is formed in the fourth metal wire 573. The fourth metal wire 573 is electrically coupled to the third metal wire 562 shown in FIG. 51 via the third via 563. The fourth metal wire 570 is coupled to the virtual ground line and transmits the virtual ground voltage VGND. The fourth metal wire 573 is coupled to the power supply line and transmits the power supply voltage.

Figure 54:
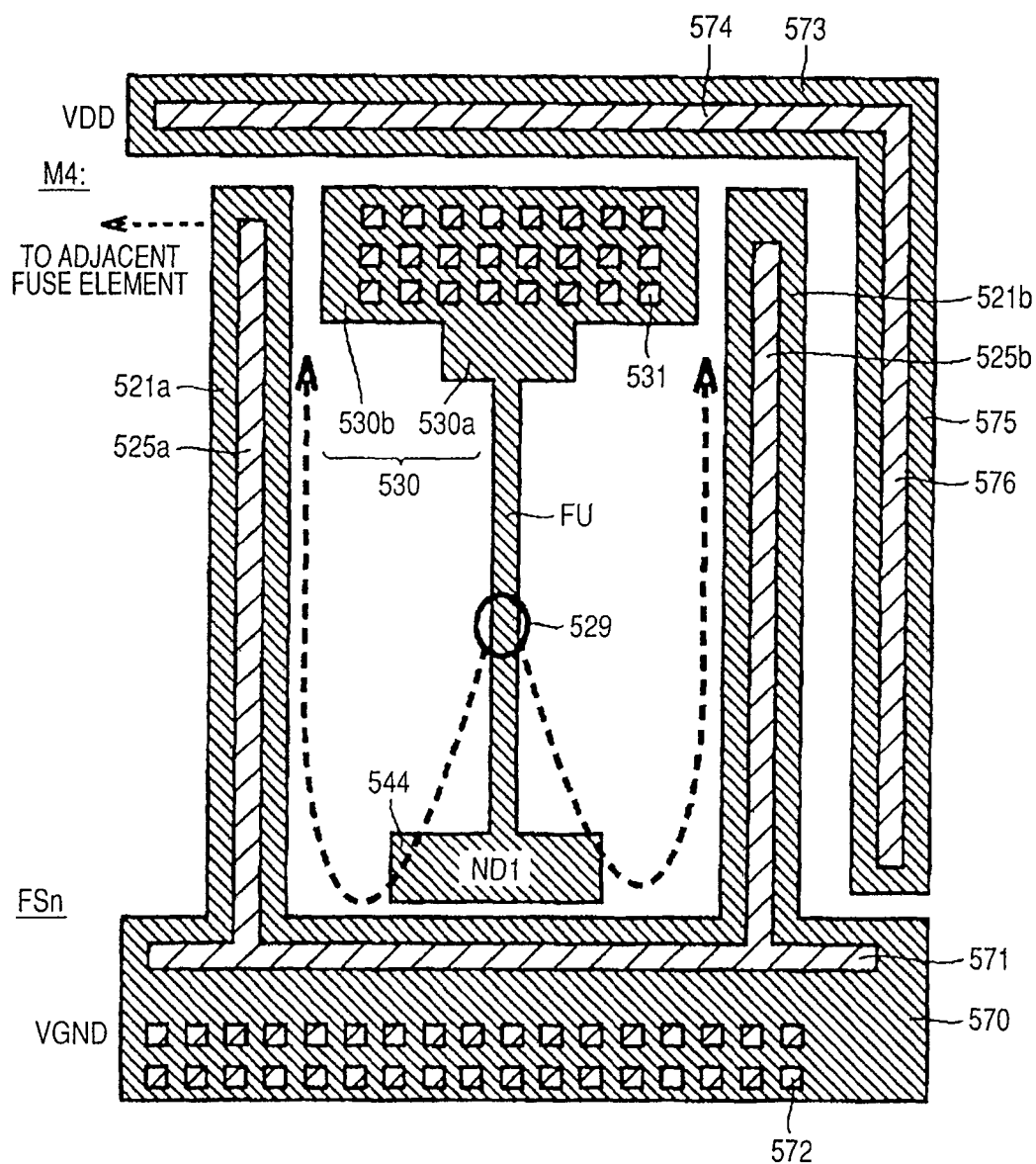
FIG. 54 is a diagram schematically showing planar layout of the fourth metal wiring layer and the fourth via in an upper layer of the planar layout illustrated in FIG. 52.

FIG. 54 is a diagram schematically showing layout of the fourth metal wiring layer of the fuse element FSn which is disposed at the end of the fuse box. In the fuse element FSn shown in FIG. 54, at the end of the fuse box, a fourth metal wire 575 extending in the vertical direction is disposed, and groove-shaped fourth via 576 is disposed in the surface of the fourth metal. The fourth metal wire 575 is coupled to the fourth metal wire 573, and the fourth via 576 is coupled to the fourth via 570. The other configuration of the fuse element FSn shown in FIG. 54 is the same as the fuse element shown in FIG. 53, the same reference numerals are designated to corresponding parts, and its detailed description will not be repeated.

As shown in FIGS. 53 and 54, also in the fourth metal wiring layer M4, the copper thermal diffusion paths indicated by the dashed arrows from the fuse trimming region 529 are reliably interrupted, and thermal diffusion of copper to the outside of the fuse box is suppressed. Although the thermal diffusion paths of copper to adjacent fuse elements exist, the length of the path is sufficiently longer than the thermal diffusion distance of copper, and thermal diffusion of the copper atoms to adjacent fuses is reliably suppressed.

Figure 55:
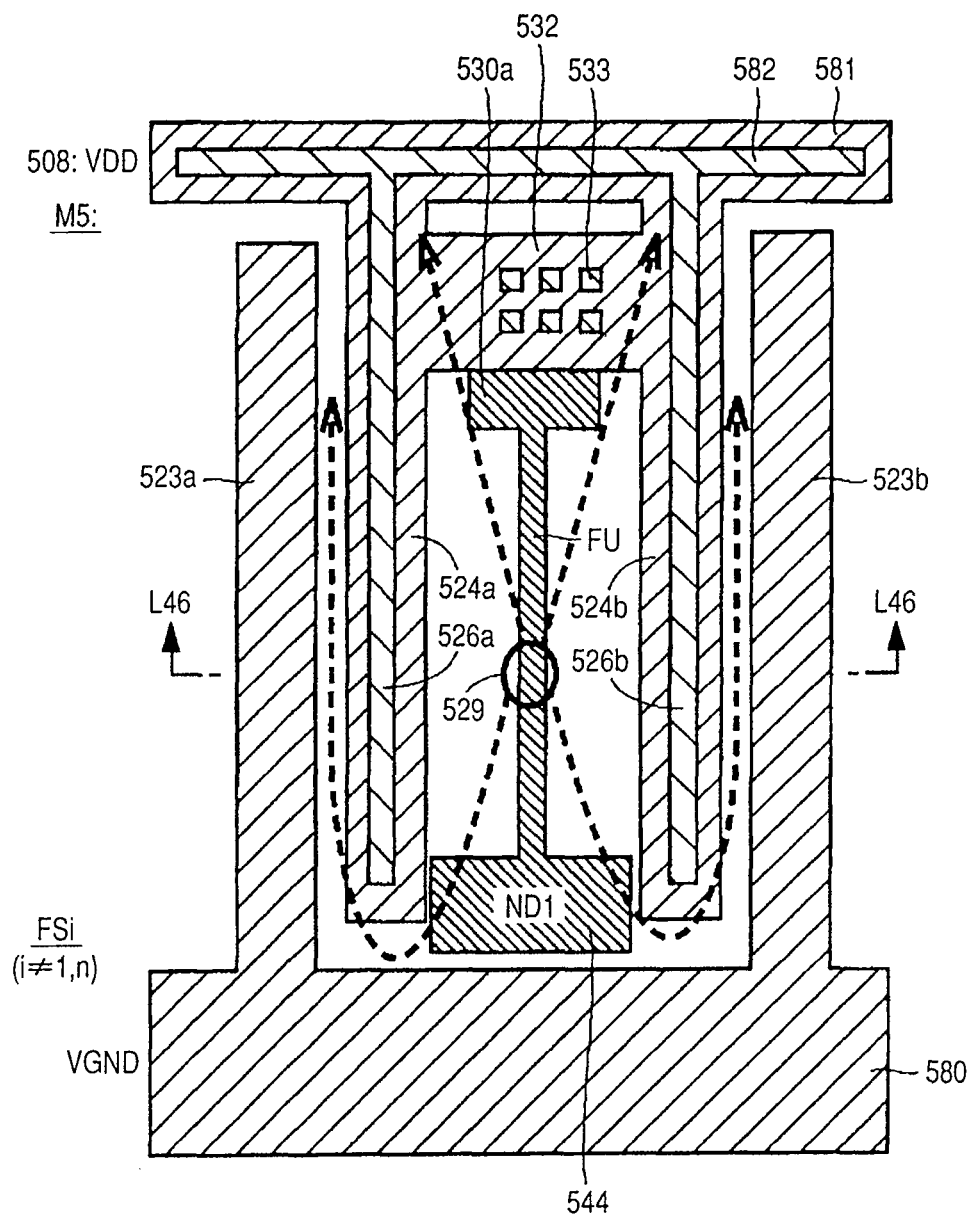
FIG. 55 is a diagram schematically showing layout of a fifth metal wiring layer and a fifth via in an upper layer of the planar layout illustrated in FIG. 53.

FIG. 55 is a diagram schematically showing wiring layout of the fifth metal wiring layer M5 of the fuse element shown in FIGS. 45 to 48. In FIG. 55, in the fuse element FSi, the fifth metal wires 523*a* and 523*b* continuously extend in the vertical direction in the fuse element formation region. On the inside of the fifth metal wires 523*a* and 523*b*, the fifth metal wires 524*a* and 524*b* continuously extending in the fuse formation region are disposed. In the surface of the fifth metal wires 524*a* and 524*b*, the groove-shaped fifth vias 526*a* and 526*b* continuously extend in the vertical direction. No vias are formed in the surface of the fifth metal wires 523*a* and 523*b*.

In correspondence with the bed wire 530*b* shown in FIG. 53, the fifth metal bed wire 532 is disposed. The fifth metal wires 524*a* and 524*b* are mutually coupled by the fifth metal bed wire 532. The fifth metal bed wire 532 is coupled to the pad/bed wire of the fuse FU in a lower layer. In FIG. 55, a pad wire 530*a* disposed for the fuse FU is shown. The fourth metal pad wire 544 of the fuse FU is also shown in order to display the disposition of the fifth metal wiring layer for the fuse. In the surface of the fifth metal bed wire 532, to obtain electric contact with the upper-layer wire, a plurality of unit fourth vias are aligned.

Both of the fifth metal wires 523*a* and 523*b* are coupled to a fifth metal wire 580 which continuously extends in the lateral direction. The fifth metal wire 580 serves as a global virtual ground line and transmits the virtual ground voltage VGND commonly to fuse elements in the fuse box. Since a power supply line that transmits the power supply voltage is disposed in an upper layer in the six metal wire 580 serving as the global virtual ground line, a groove-shaped via is not formed. Similarly, the power supply line is disposed in an upper layer also for the fifth metal wires 523*a* and 523*b*, no vias are disposed.

On the other hand, in the global wiring region 508 on the outside of the bed wire 532, a sixth metal wire 581 continuously extending in the lateral direction is formed. In the surface of the fifth metal wire 581, a groove-shaped fifth via 582 is formed. The groove-shaped fifth via 582 is coupled to the groove-shaped fifth vias 526*a* and 526*b*, and the fifth metal wires 524*a* and 524*b* and the bed wire 532 are coupled to the fifth metal wire 581. The fifth metal wire 581 is coupled to the fourth metal wire 573 shown in FIG. 53 via the groove-shaped fourth via 574.

Figure 56:
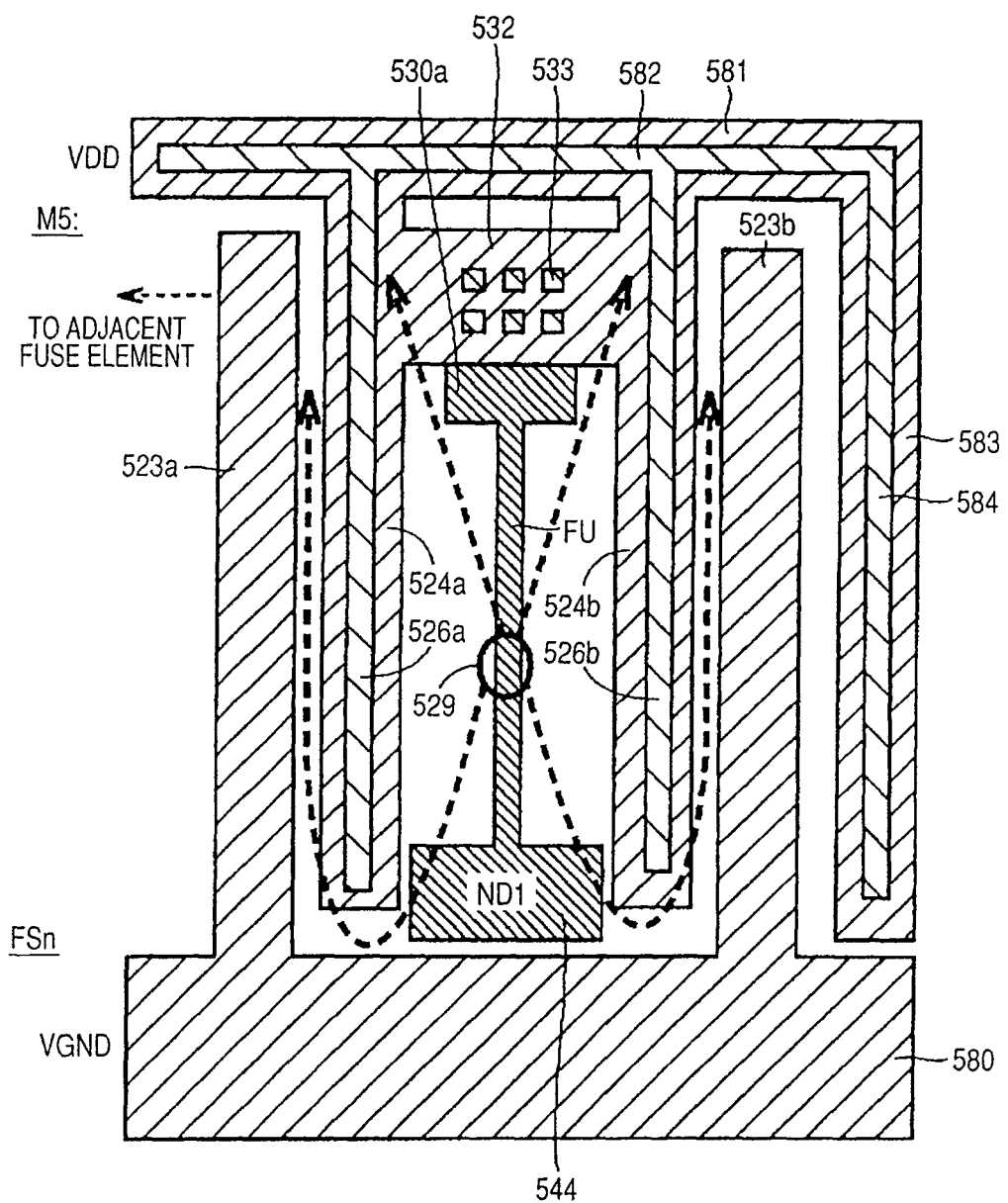
FIG. 56 is a diagram schematically showing planar layout of the fifth metal wiring layer and the fifth via in an upper layer of the planar layout illustrated in FIG. 54.

FIG. 56 is a diagram schematically showing layout of the fifth metal wiring layer of the fuse element FSn disposed at an end of the fuse box. In the fuse element FSn at the end of the fuse box, a fifth metal wire 583 continuously extending in the vertical direction close to the fifth metal wire 580 is formed, and a groove-shaped fifth via 584 is formed in the surface of the fifth metal wire 583. The fifth metal wire 583 is coupled to the fifth metal wire 581, and the fifth via 584 is coupled to the fifth via 582. The other layout of the fuse element FSn shown in FIG. 56 is the same as that of the fuse element FSi shown in FIG. 55, the same reference numerals are designated to corresponding parts, and their detailed description will not be repeated.

Also in the configuration shown in FIGS. 55 and 56, also in the fifth metal wiring layer M5, by the fifth metal wire and the groove-shaped via, the thermal diffusion paths of copper from the trimming region 529 indicated by the dashed arrows are reliably blocked, thermal diffusion of copper atoms to adjacent fuses is reliably suppressed, and thermal diffusion of copper to the outside of the fuse box is also prevented.

Figure 57:
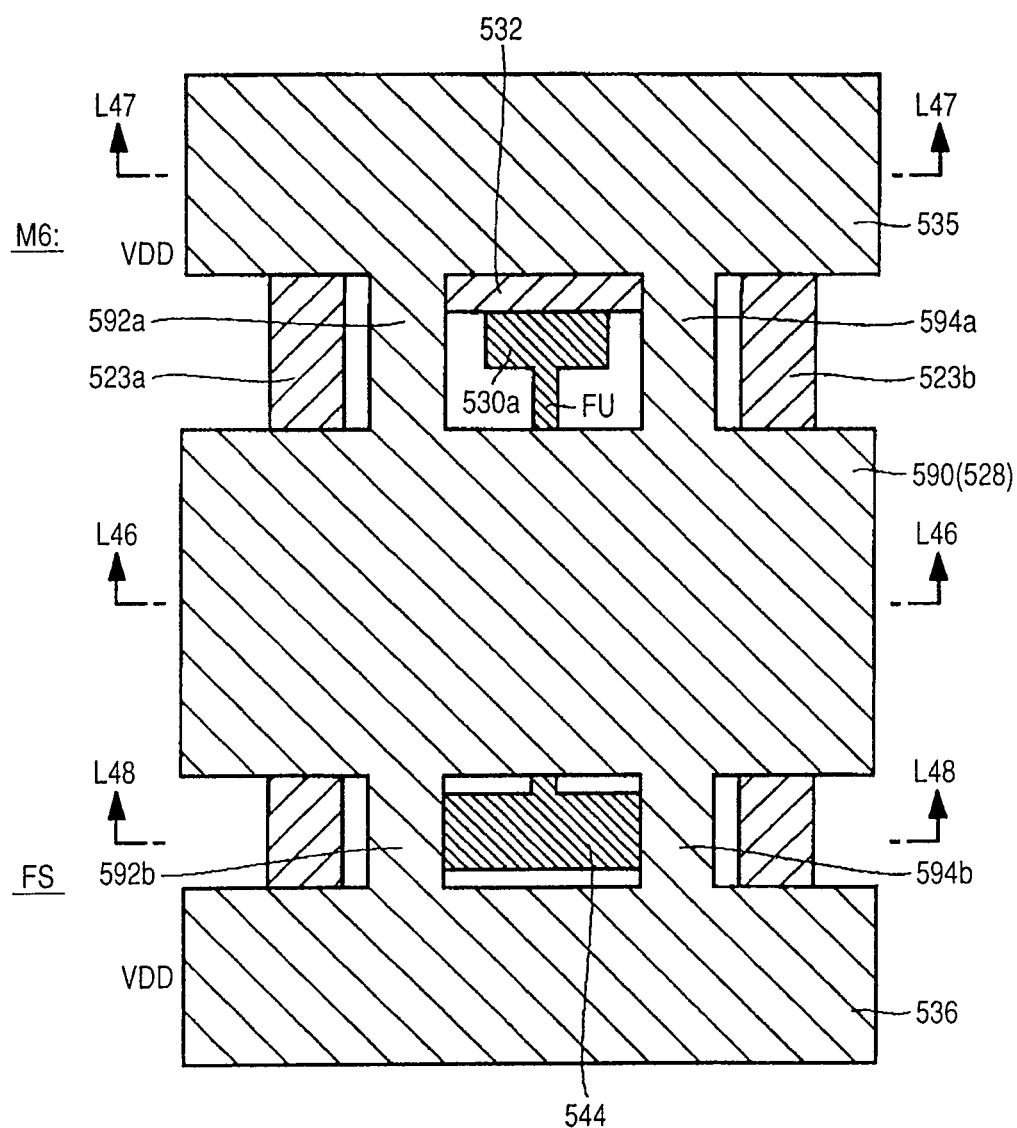
FIG. 57 is a diagram schematically showing planar layout of a sixth metal wiring layer in an upper layer of the planar layout illustrated in FIGS. 55 and 56.

FIG. 57 is a diagram schematically showing wiring layout of the sixth metal wiring layer M6 of the fuse element shown in FIGS. 45 to 48. In FIG. 57, the wiring part for the fuse FU in a lower layer and the layout of the fifth metal wires 523a and 523b are also shown.

The lines L46-L46, L47-L47, and L48-L48 shown in FIG. 57 are cut lines for obtaining the sectional structures shown in FIGS. 46, 47, and 48, respectively.

The wiring layout of the sixth metal wiring layer M6 shown in FIG. 57 is commonly used for the fuses in the fuse box, and the same layout is used also for the fuse element FSn at the end. Therefore, in FIG. 57, the fuse element is indicated by reference characters FS.

In FIG. 57, a sixth metal wire 535 continuously extends in the lateral direction and is disposed over the bed wire 532. The sixth metal wire 535 is provided commonly for a plurality of fuse elements, transmits the power supply voltage VDD, and is electrically coupled to the bed wire 532 in a lower layer via a via 533 shown in FIG. 55. Similarly, also in a lower-side region of the fuse element, the sixth metal wire 536 is disposed above the fifth metal wire 580 shown in FIG. 55 and transmits the power supply voltage VDD commonly to a plurality of fuse elements.

Above the fusing region (trimming region) 529 of the fuse FU in the center portion, a metal wire 590 corresponding to the sixth metal wire 528 shown in FIG. 46 is disposed. The sixth metal wire is a solid wire and is coupled to the sixth metal wires 535 and 536 via the sixth metal wires 592a, 592b, 594a, and 594b. The sixth metal wires 592a and 592b are coupled to the fifth metal wire 524a shown in FIG. 55 via the via 526a. The sixth metal wires 594a and 594b are coupled to the fifth metal wire 524b shown in FIG. 55 via the fifth via 526b.

As shown in FIG. 57, by disposing the sixth metal wire 590 that transmits the power supply voltage just above the fusing region (trimming region) of the fuse FU, copper thermal diffusion from a portion around the fuse cutting part can be suppressed. In addition, the wire serving as a component of the node ND1 is not used as a diffusion preventing wire above the fuse, so that the number of wiring layers necessary to prevent thermal diffusion of is can be reduced.

Figure 58:
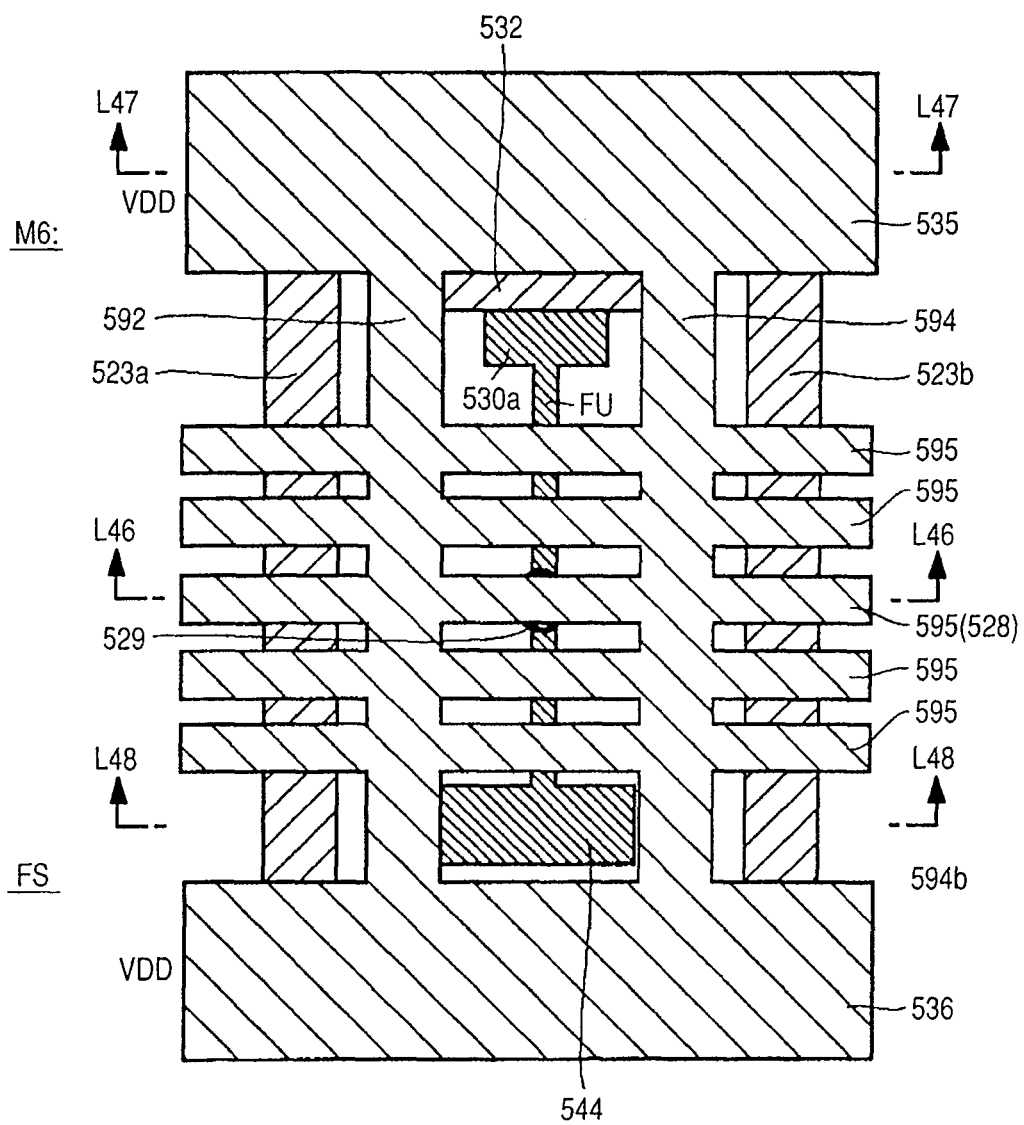
FIG. 58 is a diagram schematically showing layout of a sixth metal wiring layer as a modification of the planar layout illustrated in FIG. 50.

FIG. 58 is a diagram showing a modification of wiring layout of the sixth metal wiring layer M6. In FIG. 58, as the upper diffusion preventing wire 528, stripped sixth metal wires 595 are disposed in parallel with intervals. The stripped sixth metal wires 595 are coupled to the sixth metal wires 535 and 536 via the sixth metal wires 592 and 594, respectively. Except for the configuration of the stripped wires 595, the layout of the sixth metal wiring layer M6 shown in FIG. 58 is the same as that shown in FIG. 57, the same reference numerals are designated to corresponding parts, and their detailed description will not be repeated.

By covering the fusing region 529 in the fuse FU by using the striped wires, effects similar to those of the configuration of preventing thermal diffusion of copper by using the metal solid wire 591 can be obtained. In a manner similar to the case of the modification of the second embodiment, it is sufficient to determine wiring width in consideration of dishing, wiring resistance, and the like in the process of the wire.

Also in the sixth embodiment, in the case where electromigration tolerance of the first metal wire in the first metal wiring layer M1 is sufficiently high, by shifting each of the wiring layers downward by one layer, the diffusion preventing wall structure can be realized by using the wires up to the fifth metal wiring layer M5, and similar effects can be obtained.

As described above, according to the seventh embodiment, the preventing wall structure is formed on both sides of the fuse. In the uppermost part, a preventing wall which trails in multiple directions from the power supply line is provided internally. At least a part of the preventing wall has a double structure. Thus, thermal diffusion of copper to adjacent fuses can be reliably prevented. In addition, the preventing wall for preventing diffusion from above is formed on the inside of the first preventing wall, so that the layout area of the fuse element can be reduced.

It is avoided to use the wiring structure that forms the node ND1 as the preventing wall structure, and the structure for preventing copper thermal diffusion of the fuse can be simplified (in the case of using a node as the preventing wall, a wiring circuit for disposing the node to a lower layer part becomes complicated).

In plan view, the trimming region of a fuse element is covered by the sixth metal wire 536. In the case of cutting the fuse FU, there is a case such that a crack occurs so as to be apart from the fuse to the upper side of the fuse FU using, as start points, two points at corner parts of the fuse FU as a contact part between the fuse FU and the copper diffusion preventing film, and the interlayer film (interlayer insulating film). The crack reaches the sixth metal wire 536. The copper metal enters the crack and it causes short circuit between the fuse FU and the sixth metal wire 536. At this time, the potential of the fuse FU becomes the power supply voltage VDD on the sixth metal wire 536. Accordingly, poor trimming can be detected by the cut determining circuit CJC, and a chip (semiconductor device) can be detected and eliminated as a defective before shipment of the product. The embodiment of the invention provides the layout structure such that the metal wire disposed above the slim fuse FU and closest to the fuse FU is the sixth metal wire 536, and the power supply voltage VDD is supplied.

The diffusion preventing wall structure is shared by adjacent fuse elements, and the layout area of the fuse element can be reduced.

Eighth Embodiment

Figure 59:
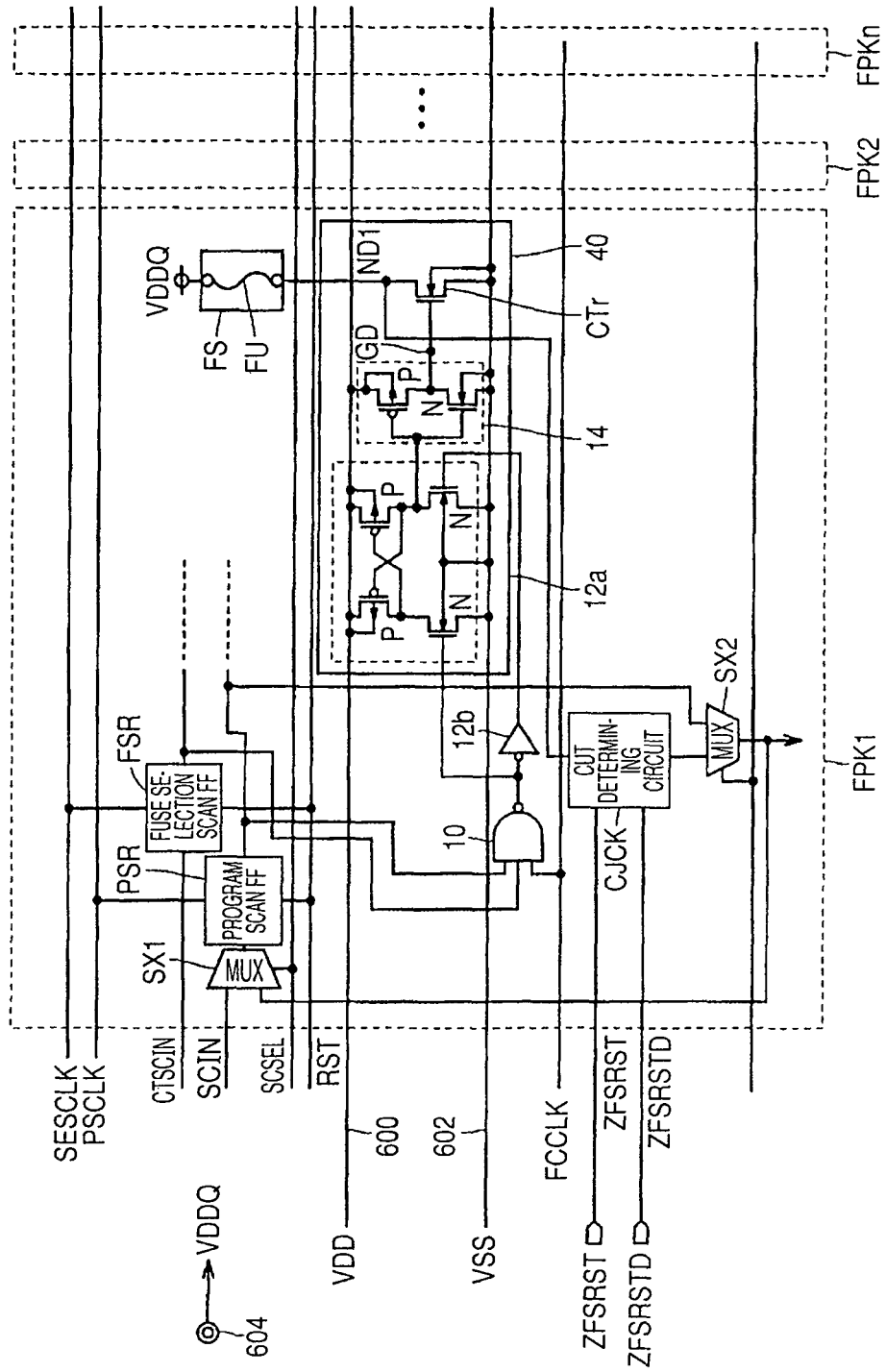
FIG. 59 is a diagram schematically showing the configuration of a fuse program circuit according to an eight embodiment of the invention.

FIG. 59 is a diagram showing the configuration of a main part of a semiconductor device according to an eighth embodiment of the invention. The configuration of the semiconductor device shown in FIG. 59 is different from that of the semiconductor device shown in FIG. 8 with respect to the following points. A fuse gate power supply line 600 is provided commonly to fuse program circuits FPK1 to FPKn, and the power supply voltage VDD is supplied to the fuse gate power supply line 600. A fuse gate ground line 602 is provided commonly for the fuse program circuits FPK1 to FPKn, and the ground voltage VSS (GND) is applied to the fuse gate ground line 602. To the power supply node of the fuse element FS, fuse power supply voltage VDDQ is applied from the outside via a power supply node 604. Control signals ZFSRST and ZFSRSTD are given to a cut determining circuit CJCK. The control signals ZFSRST and ZFSRSTD are control signals complementary to the control signals FSRST and FSRSTD shown in FIG. 8. The other configuration of the fuse program circuits FPK1 to FPKn is the same as that of the fuse program circuit shown in FIG. 8, the same reference numerals are designated to corresponding parts, and their detailed description will not be repeated.

By supplying dedicated fuse power supply voltage VDDQ from the outside to the fuse element FS, the following effects are obtained. By maintaining the fuse power supply voltage VDDQ to the ground voltage level except for the time of cutting a fuse element, leak current via the fuse element can be reduced. It is unnecessary to adjust the voltage of the fuse power supply line 600 and the fuse gate ground line 602 to the inside of the fuse circuit block 40 in accordance with an operation mode such as fuse state determination, a control circuit for the power switching becomes unnecessary, and the circuit configuration can be simplified.

Figure 60:
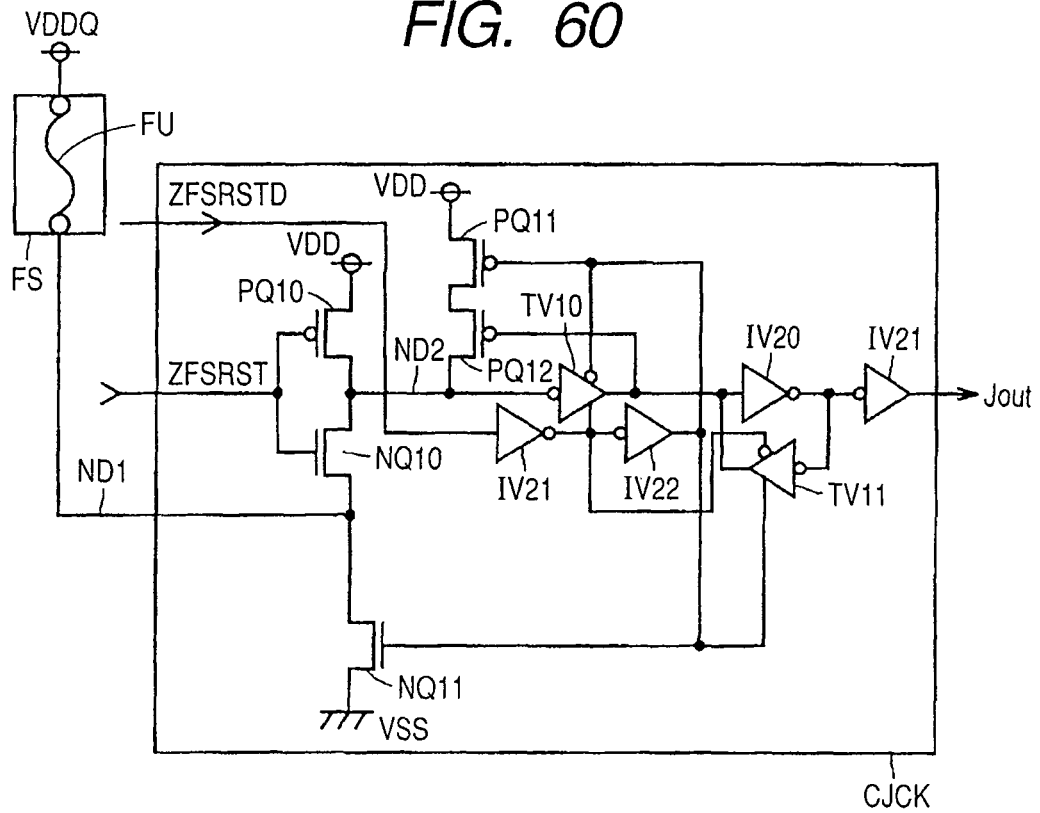
FIG. 60 is a diagram showing an example of the configuration of a cut determining circuit illustrated in FIG. 59.

FIG. 60 is a diagram showing an example of the configuration of the cut determining circuit CJCK illustrated in FIG. 59. In FIG. 60, the cut determining circuit CJCK includes: a P-channel MOS transistor PQ10 and an N-channel MOS transistor NQ10 coupled in series between the power supply node (VDD) and the internal node ND1; P-channel MOS transistors PQ11 and PQ12 coupled in series between the power supply node and an internal node ND2; and an N-channel MOS transistor NQ11 coupled between the internal node ND1 and the ground node VSS.

The P-channel MOS transistor PQ10 is conducted when a reset signal ZFSRST is at the L level and transmits the power supply voltage VDD to the internal node ND2. The N-channel MOS transistor NQ10 is conducted when a reset signal ZFSRST is at the H level to mutually couple the internal nodes ND1 and ND2. The N-channel MOS transistor NQ11, when conducted, couples the internal node ND1 to the ground node. The P-channel MOS transistors PQ11 and PQ12, when they are in the conduction state, transmit the power supply voltage VDD to the internal node ND2.

The cut determining circuit CJCK further includes: a tristate inverter TV10 for inverting a signal of the internal node ND2; inverters IV20 and IV21 which are cascaded and generate a determination result signal Jout; inverters IV21 and IV22 which are cascaded and receives a reset delay signal ZFSRSTD; and a tristate inverter TV11 coupled to the inverter IV20 in a nonparallel manner.

When the reset delay signal ZFSRSTD is at the L level, the tristate inverter TV10 is activated in accordance with complementary signals from the inverters IV21 and IV22. An output signal of the tristate inverter TV10 is given to the gate of the P-channel MOS transistor PQ12. An output signal of the inverter IV22 is given to the gates of the P-channel MOS transistor PQ11 and the N-channel MOS transistor NQ11. When the reset delay signal ZFSRSTD is at the H level, the tristate inverter TV11 is activated in accordance with output signals of the inverters IV21 and IV22. The tristate inverter TV11 and the inverter IV20 configure a latch circuit.

Figure 61:
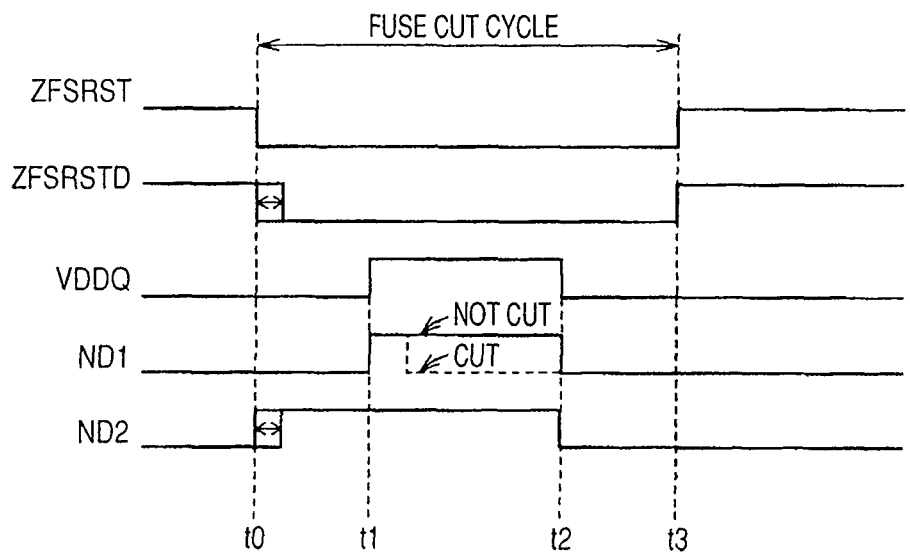
FIG. 61 is a timing chart showing fuse cutting operation of the cut determining circuit illustrated in FIG. 60.

FIG. 61 is a timing chart showing operation at the time of cutting a fuse, of the cut determining circuit CJCK illustrated in FIG. 60. Referring to FIG. 61, the operation at the time of cutting a fuse, of the cut determining circuit CJCK shown in FIG. 60 will be described below.

In the initial state before time t0, the reset signal ZFSRST and the reset delay signal ZFSRSTD are at the H level. Accordingly, the N-channel MOS transistors NQ10 and NQ11 are in the on state, and the P-channel MOS transistors PQ10 and PQ11 are in the off state. Therefore, both of the internal nodes ND1 and ND2 are maintained at the ground voltage VSS level by the MOS transistors NQ10 and NQ11. At this time, the voltage VDDQ of the fuse power supply node is at the ground voltage level.

At time t0, a fuse cut cycle of cutting the fuse element FS starts. In response to start of the fuse cut cycle, the fuse reset signal ZFSRST becomes the L level. Concurrently or behind it, the fuse reset delay signal ZFSRSTD becomes the L level. Accordingly, the N-channel MOS transistor NQ10 is turned off, and the internal nodes ND1 and ND2 are electrically isolated. The MOS transistor PQ10 is turned on, and the internal node ND2 is charged to the power supply voltage VDD level.

At this time, output signals of the inverters IV21 and IV22 become the H level and the L level, respectively, and the tristate inverter TV10 enters an active state to invert the signal of the internal node ND2 and output the resultant signal. In response to the signal, the P-channel MOS transistors PQ11 and PQ12 are turned on, a latch circuit is formed by the tristate inverter TV10 and the MOS transistors PQ11 and PQ12, the internal node ND2 is maintained at the power supply voltage VDD level, and the output signal of the tristate inverter TV is maintained at the L level. Even when the tristate inverter TV11 is made inactive, the tristate inverter TV11 does not exert any influence on the determination result signal Jout.

The state is maintained and, at time t1, the fuse power supply voltage VDDQ is set to a predetermined voltage level. At this time, the fusing current supply transistor CTr shown in FIG. 59 is selectively turned on in accordance with the fuse cut clock signal FGCLK and corresponding signals from the program scan flip flop (FF) PSR and the FS selection scan flip flop (FF) FSR. In the fuse element FS, at the time of cutting the fuse FU, the fusing current supply transistor CTr is turned on, the fusing current flows to the node ND1, and the voltage level rises once. However, after cutting of the fuse FU, the voltage level drops to the L level (by the fusing current supply transistor). On the other hand, when the fuse FU is not cut, the fusing current supply transistor CTr is maintained in the off state, so that the node ND1 is maintained at the voltage level of the fuse power supply voltage VDDQ via the fuse FU.

At the time of cutting the fuse, the MOS transistors NQ10 and NQ11 are in the off state, a charge/discharge current path of the cut determining circuit CJCK to the internal node ND1 is interrupted. Therefore, the cut determining circuit CJCK does not exert any influence on the fuse cutting process.

After completion of the fuse cutting period at time t2, the fuse power supply voltage VDDQ is set to the L level. Therefore, after cutting the fuse FU, both of voltages at end of the fuse are maintained at the ground voltage level. Also in the not-cut fuse, due to drop of the voltage level of the fuse power supply voltage VDDQ, the voltages at both ends are maintained at the same voltage level.

When the fuse cut cycle completes at time t3, the reset signal ZFSRST and the reset delay signal ZFSRSTD become the H level, the MOS transistors PQ10 and PQ11 are turned off, the MOS transistors NQ10 and NQ11 are turned on, and both of the internal nodes ND1 and ND2 are maintained at the ground voltage level.

The tristate inverter TV10 is made inactive, the tristate inverter TV11 is made active, and the gate potential of the MOS transistor PQ12 is maintained at the immediately-preceding L level. Even if the P-channel MOS transistor PQ12 is in the on state, the P-channel MOS transistor PQ11 is in the off state, the internal node ND2 is isolated from the power supply node, and the internal node ND2 is maintained at the ground voltage VSS level by the N-channel MOS transistor NQ11.

Figure 62:
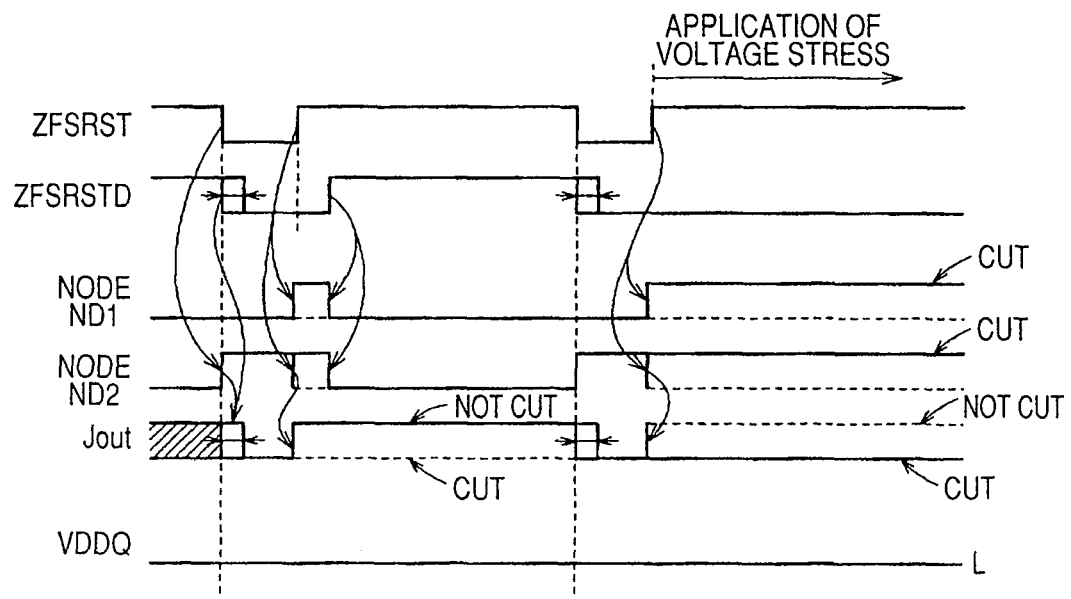
FIG. 62 is a timing chart showing the cut determining operation of the cut determining circuit illustrated in FIG. 60 and operation performed when voltage stress is applied.

FIG. 62 is a timing chart showing the cut determining operation of the cut determining circuit illustrated in FIG. 60 and operation performed when voltage stress of a fuse is applied. In the following, referring to FIG. 62, the operation of determining a state of a fuse of the cut determining circuit shown in FIG. 60 and the operation when the fuse voltage stress is applied will be described.

First, at the time other then the fuse cutting operation (after system reset or at power-on in the test mode or the normal operation), the fuse power supply voltage VDDQ is maintained at the ground voltage level which is the L level. Before the determining operation, both of the reset signal ZFSRST and the reset delay signal ZFSRSTD are at the H level. In the cut determining circuit CJCK, the N-channel MOS transistors NQ10 and NQ11 are in the on state, the P-channel MOS transistors PQ10 and PQ11 are in the off state, and both of the internal nodes ND1 and ND2 are at the ground voltage VSS level. The fusing current supply transistor CTr is maintained at the off state.

At the time of determining the state of the fuse element, the fuse reset signal NFSTR is set to the L level and, concurrently or slightly behind the time, the fuse reset delay signal ZFSRSTD is driven to the L level. Accordingly, the MOS transistors NQ10 and NQ11 are set to the off state. On the other hand, the MOS transistor PQ10 is set to the on state, and the internal node ND2 is precharged to the power supply voltage VDD level. Since the reset delay signal ZFSRSTD is at the L level, the tristate inverter TV10 is active and outputs a signal of the L level in accordance with the voltage level of the internal node ND2. Accordingly, the P-channel MOS transistor PQ12 is turned on, and the internal node ND2 is maintained at the power supply voltage VDD level. At this time, the tristate inverter TV11 is in an output high-impedance state. In this state, the determination result signal Jout becomes the L level according to an output signal of the tristate inverter TV10.

Subsequently, in a state where the reset delay signal ZFSRSTD is maintained at the L level, the reset signal ZFSRST is set to the H level. Accordingly, the MOS transistor PQ10 is turned off, the MOS transistor NQ10 is turned on, and the internal nodes ND2 and ND1 are electrically coupled. In a state where the fuse FU in the fuse element FS is cut, the power supply voltage from the internal node ND2 is transmitted to the internal node ND1. The voltage levels of the internal nodes ND1 and ND2 are maintained at the power supply voltage VDD level, and an output signal of the tristate inverter TV10 is maintained at the L level. Accordingly, the determination result signal Jout is also maintained at the L level.

On the other hand, when the fuse FU is in a not-cut state, the internal node ND1 is coupled to the fuse power supply node (VDDQ) of the ground voltage level, the internal nodes ND1 and ND2 are discharged to the fuse power supply node of the ground voltage level via the fuse FU, and the voltage levels of the internal nodes ND1 and ND2 decrease to the L level. Since the tristate inverter TV10 is in an active state, it outputs a signal according to the voltage level of the internal node ND2, and the voltage level of the result determination output signal Jout changes according to whether the fuse is cut or not.

Subsequently, the reset delay signal ZFSRSTD is set to the H level, and the tristate inverter TV10 is set to the output high-impedance state. At this state, the tristate inverter TV11 is made active, a latch circuit is formed by the inverter IV20 and the tristate inverter TV11, the voltage level of the internal node ND2 is held, and the determination result signal Jout is maintained at a voltage level according to the cut or not-cut state of the fuse FU.

By seeing the voltage level of the determination result output signal Jout from the outside, whether the fuse element FS is cut or not can be discriminated. In the normal operation, at the time of initialization, the output signal Jout of the cut determining circuit CJCK is supplied to a target circuit, and the internal state of the fuse information use circuit is set.

Next, the operation in the case of applying voltage stress to the fuse FU in the fuse element FS and measuring the life of the fuse will be described. Also at the time of applying voltage stress, the fuse power supply voltage VDDQ is maintained at the L level. The reset signal ZFSRST is lowered from the H level to the L level or the reset delay signal ZFSRSTD is set to the L level concurrently with or behind the reset signal ZFSRST. The MOS transistor PQ10 is turned on, the MOS transistor NQ10 is turned off, and the internal nodes ND1 and ND2 are isolated from each other. The internal node ND2 is charged by the MOS transistor PQ10 to the power supply voltage VDD level. At this time, the internal node ND1 is at the ground voltage level of the initial state. The MOS transistor NQ10 is turned off, and the tristate inverter TV10 enters an active state to invert the voltage level of the internal node ND2. Accordingly, an output signal of the tristate inverter TV10 and an output signal of the inverter IV22 decrease to the L level, both of the MOS transistors PQ11 and PQ12 are turned on, and the internal node ND2 is maintained at the power supply voltage VDD level.

In a state where the reset delay signal ZFSRSTD is maintained at the L level, the reset signal ZFSRST is set to the H level. Accordingly, the MOS transistor PQ10 is turned off, the MOS transistor NQ10 is turned on, and the internal nodes ND1 and ND2 are electrically coupled to each other. At this time, the MOS transistor PQ11 is in the on state. When the fuse FU is in a low-resistance state, the fuse power supply voltage VDDQ is at the ground voltage level, so that the voltage level of the internal node ND2 decreases, an output signal of the tristate inverter TV10 becomes the H level, the MOS transistor PQ12 is turned off, and the voltage level of the internal node ND2 becomes the L level. When the fuse FU is in a high-resistance state (cut state), the internal nodes ND1 and ND2 are maintained at the H level. An output signal of the tristate inverter TV10 becomes the L level, the internal node ND2 is charged by the MOS transistors PQ11 and PQ12, and the H level is maintained as the voltage level.

According to the voltage level of the internal node ND2, the voltage level of the determination result output signal Jout is the H level when the fuse FU is not cut (in the low-resistance state), and is L level when the fuse FU is cut (in the high-resistance state).

In this case, when the fuse FU is in the high-resistance state, voltage of the power supply voltage VDD level is applied across the fuse FU. In the case where the resistance value decreases due to migration of copper atoms of copper pieces, the voltage level of the result determination output signal Jout changes. Therefore, by measuring time until the fuse FU in the high resistance state changes to the low resistance state, the life of the fuse FU can be measured. The level at both ends of the fuse FU in the low resistance state is set to the ground voltage level, and application of unnecessary voltage stress is avoided.

On completion of the voltage stress application period, both of the reset signal ZFSRST and the reset delay signal ZFSRSTD are maintained at the H level, the tristate inverter TV10 enters the output high-impedance state, the tristate inverter TV11 enters the active state, and the internal nodes ND2 and ND1 are maintained at the ground voltage VSS level by the MOS transistors NQ10 and NQ11.

By setting the fuse gate power supply voltage VDDQ to a predetermined voltage level (fusing voltage equal to or higher than the power supply voltage VDD) only at the time of cutting a fuse and by maintaining the fuse gate power supply voltage VDDQ at the ground voltage level at the time of the other operations, the following advantages are obtained. In the case of adjusting the voltage levels of the fuse gate power supply voltage FGVDD1 and the virtual ground voltage VGND by using the virtual ground line and the fuse gate power supply line, adjustment of the change timing is complicated, and the circuit configuration for switching the voltage is necessary. However, when the fuse gate power supply voltage VDDQ is separately supplied, it is sufficient to set the voltage level to a predetermined fusing voltage level (equal to the power supply voltage level or a proper voltage level lower than the power supply voltage level) only at the time of cutting a fuse element. The circuit configuration for switching the voltage is unnecessary, and adjustment of the switching timing is also unnecessary. Since the fuse gate power supply voltage VDDQ is maintained at the ground voltage level in the normal operation mode, leak current via the fuse FU at the time of starting the power supply or the like is sufficiently suppressed. In particular, when the fuse gate power supply voltage is set to a predetermined voltage different from the ground voltage, such as the power supply voltage VDD in the normal operation at the time of cutting a fuse, copper atoms of the cut fuse are diffused by the voltage and an adverse influence is exerted on the peripheral circuits. Since the fuse gate power supply voltage VDDQ is set to a predetermined voltage (fusing voltage equal to or higher than the power supply voltage) only at the time of cutting a fuse and is maintained at the ground voltage level at the time of the other operations, such an inconvenience does not occur.

In the case of using the fuse gate power supply voltage VDDQ, in the copper diffusion preventing wall structure as described in the foregoing second to seventh embodiments, both of the internal node ND1 and the fuse power supply voltage VDDQ are maintained at the ground voltage VSS level in the normal operation mode. Consequently, all of electrode wires of fusing current supply transistors in a layer below a fuse element on the inside and metal wires and groove-shaped vias configuring a preventing wall structure are maintained at the same voltage level as the ground voltage level. Therefore, as diffusion of copper atoms, it is sufficient to consider only the thermal diffusion. Only by disposing a wire for transmitting the fuse gate power supply voltage VDDQ in place of the power supply voltage VDD in the preventing wall structure of a fuse element described in the foregoing second to seventh embodiments and by disposing the ground line (VSS line) in place of the virtual ground line, similar effects can be obtained.

The fuse gate power supply voltage VDDQ is supplied from an external tester at the time of a test. Other control signals may be also supplied from a tester. To maintain the fuse power supply voltage VDDQ at the ground voltage in the normal operation mode, it is sufficient to couple a fuse power supply pad to a ground pin terminal at the time of package sealing.

Figure 63:
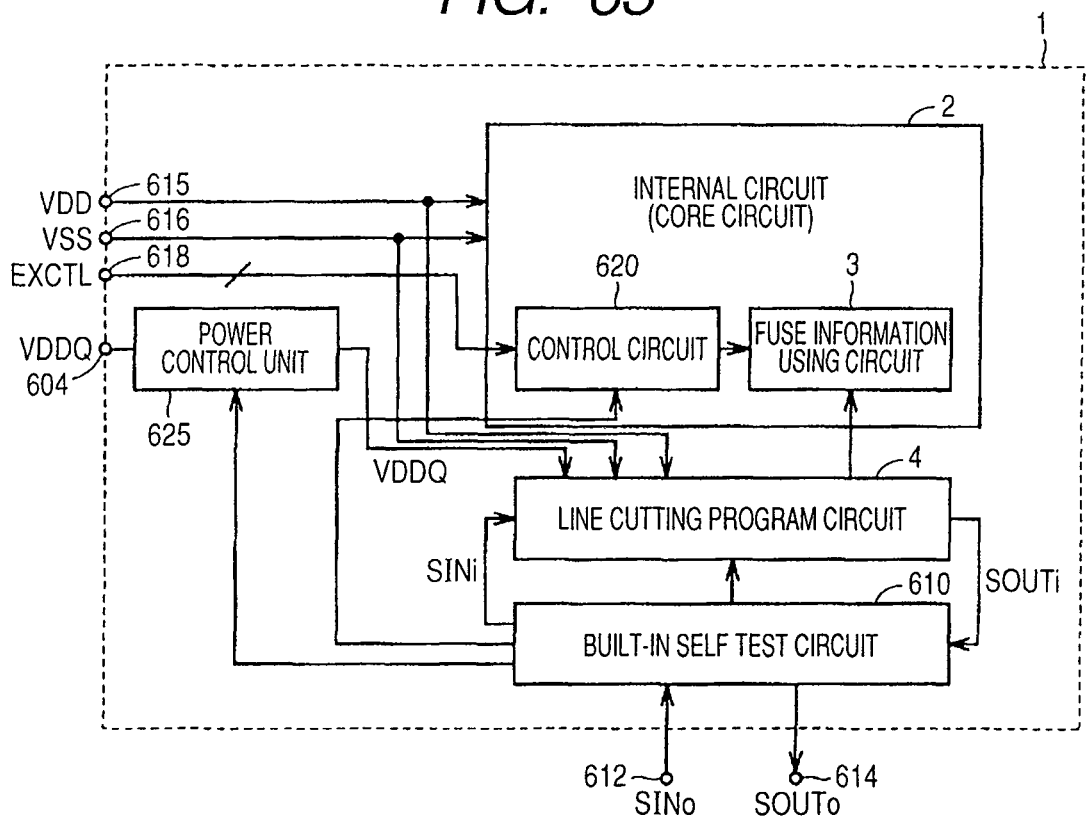
FIG. 63 is a diagram schematically the configuration of an entire semiconductor device according to the eighth embodiment of the invention.

FIG. 63 is a diagram schematically the configuration of an entire semiconductor device (semiconductor integrated circuit device) according to the eighth embodiment of the invention. The semiconductor device includes a built-in self test circuit (BIST) and executes an internal test by the BIST. In FIG. 63, a built-in self test circuit 610 disposed in the semiconductor device 1 transmits/receives test data SINo and SOUTo to/from the outside via terminals 612 and 614, controls operation of a line cutting program circuit 4 and controls operation of a control circuit 620 included in an internal circuit (core circuit) 2. The power supply voltage VDD and the ground voltage VSS from power supply terminals 615 and 616 are supplied to the internal circuit (core circuit) 2 and the line cutting program circuit 4, and a fuse power supply voltage VDDQ from a fuse power supply node 604 is supplied to the line cutting program circuit 4 via a power control unit 625. Under control of the built-in self test circuit 610, the power control unit 625 sets the fuse gate power supply voltage VDDQ as a high voltage (power supply voltage VDD or higher) necessary for cutting a fuse at a predetermined timing at the time of cutting a fuse.

The power control unit 625 maintains the fuse gate power supply voltage VDDQ at the ground voltage (VSS) level by the built-in self test circuit 610 except for the time of cutting a fuse. At the time of sealing a package of the semiconductor device 1, the fuse gate power supply node (pad) is coupled to a ground pin by bonding wire.

An external control signal EXCTL is given via a terminal (pad) 618 to the control circuit 620 of the internal circuit 2, and an operation mode of the internal circuit 2 is designated. When a test mode is designated by the control signal EXCTL, the internal control circuit 620 starts the built-in self test circuit 610 and executes a test.

At the time of cutting a fuse and in the test mode, the built-in self test circuit 610 operates to test the operation of the control circuit 620, supply a clock signal and a control signal necessary for the line cutting program circuit 4, supply program data SINi in accordance with the test data SINo from the outside, and generate test data SOUTo for outside in accordance with serial output SOUTi from the line cutting program circuit 4.

Therefore, also in the case where the built-in self test circuit 610 is provided in the semiconductor device 1, by providing the power control unit 625, the fuse power supply voltage VDDQ is set to predetermined voltage level only when a fuse is cut. At the time of other operation and in normal operation in which the internal circuit operates (control by the control circuit 620 is performed), the power supply voltage VDDQ is maintained at the ground voltage level.

As described above, according to the eighth embodiment of the invention, a fuse power supply voltage which is different from the power supply voltage is supplied via a specific pad and supplied to a fuse element. Therefore, after and during cutting a fuse element, without requiring complicated control, a fuse can be cut, and leak current in a fuse element can be decreased in the normal operation.

Modification

Figure 64:
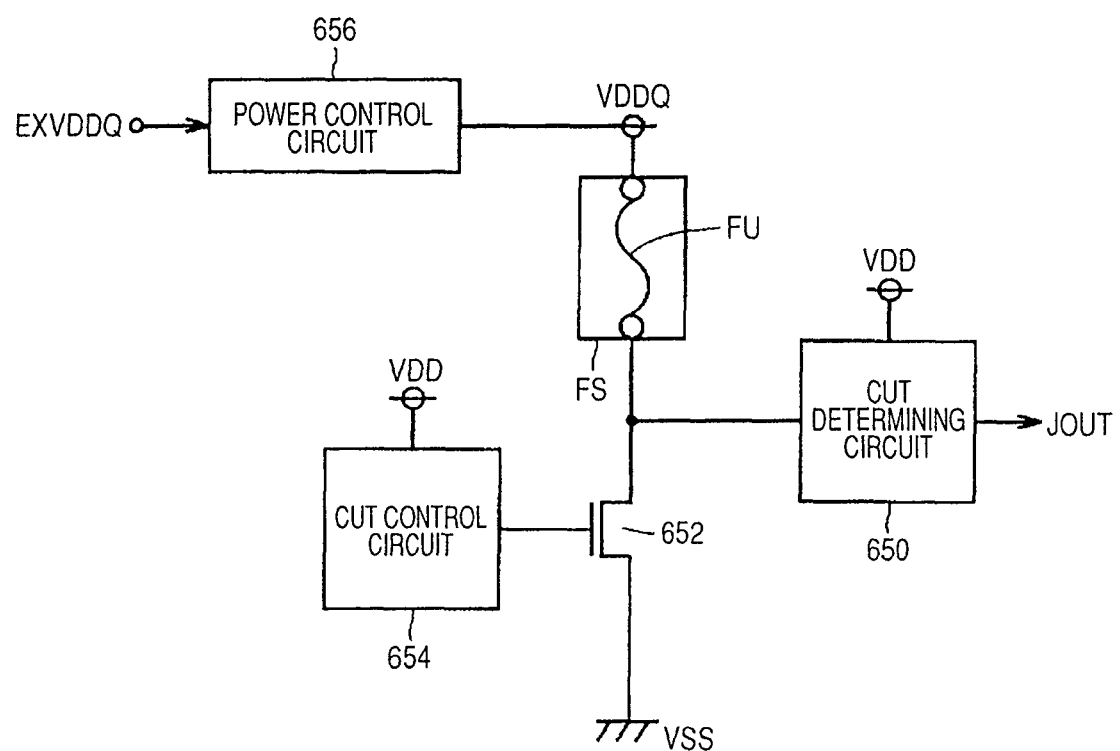
FIG. 64 is a diagram schematically showing the configuration of a fuse program circuit as a modification of the seventh embodiment of the invention.

FIG. 64 is a diagram schematically showing the configuration of a line cutting program circuit as a modification of the eighth embodiment of the invention. In FIG. 64, the configuration of a part related to one fuse element FS is shown. The fuse element FS is provided with a cut determining circuit 650 for determining whether the fuse element FS is cut or not. A fusing current supply transistor 652 is provided between the fuse element FS and a ground node. The on/off state of the fusing current supply transistor 652 is controlled by the corresponding cut control circuit 654.

To the power supply node of the fuse element FS, the fuse power supply voltage VDDQ is supplied via the power control circuit 656. At the time of cutting a fuse, the power control circuit 656 sets the fuse power supply voltage VDDQ to a fusing voltage level equal to or higher than the power supply voltage VDD in accordance with an external fuse power supply voltage EXVDDQ from an external fuse power supply node (pad). In the other time, the external power supply voltage EXVDDQ is maintained at the ground voltage level, and the power control circuit 656 maintains the fuse power supply voltage VDDQ at the ground voltage level. To the cut determining circuit 650 and the cut control circuit 654, the power supply voltage VDD is supplied as the operation power supply voltage.

The cut determining circuit 650 may have any circuit configuration as long as it generates an output signal JOUT according to whether the fuse FU is cut or not at the time of a node of transmitting a signal according to whether the fuse FU of the fuse element FS is cut or not. The cut control circuit 654 can use any configuration as long as it sets the fusing current supply transistor 652 into an on state at the time of cutting the fuse FU of the fuse element FS.

Therefore, also in such a configuration of a general fuse program circuit, by supplying the power supply voltages VDD and EXVDDQ from the above-described external power supply nodes (pads)) to the fuse element FS and the cut determining circuit 650 and the cut control circuit 654 in the periphery of the fuse element FS, leak current via the fuse FU can be suppressed, and the operation control in the cut control circuit 654 can be simplified.

The present invention can be generally applied to a semiconductor integrated circuit device having a configuration including a fuse program circuit that sets an operation mode and an operation condition of an internal circuit by using a fuse element.

What is claimed is:

1. A semiconductor device comprising:
   a semiconductor element in a semiconductor substrate;
   first wires formed over the semiconductor element and formed at a first wiring layer;
   second wires electrically connected to the first wires and formed at a second wiring layer which is one level upper than the first wiring layer;
   third wires electrically connected to the second wires and formed at a third wiring layer which is one level upper than the second wiring layer;
   fourth wires electrically connected to the third wires and formed at a fourth wiring layer which is one level upper than the third wiring layer;
   a power supply wire formed at a fifth wiring layer which is one level upper than the fourth wiring layer; and
   a fuse formed at the third wiring layer, wherein the fuse includes a copper film,
   the power supply wire overlaps the fuse in a planar view,
   a diffusion preventing film having the first, second, third and fourth wires does not overlap the fuse in a planar view and surrounds the fuse in a planar view, and
   in regions which overlap the fuse in a planar view, no wire is formed in the second and fourth wiring layers.

2. The semiconductor device according to claim 1, wherein the power supply wire is formed in a stripe shape crossing the fuse above the fuse.

3. The semiconductor device according to claim 1, wherein the power supply wire includes a solid wire disposed so as to cross the fuse above the fuse.

4. The semiconductor device according to claim 1,
   wherein a state of an internal circuit is set according to whether the fuse element is cut or not,
   wherein a power supply voltage supplied from a pad different from a pad that supplies an operation power supply voltage to the internal circuit is supplied to the power supply wire.

5. The semiconductor device according to claim 4, wherein the voltage of the power supply wire is set to a ground voltage level in a normal operation mode of the internal circuit and is set to a voltage level necessary for cutting the fuse in a fuse cutting period of cutting the fuse, the voltage level being different from the power supply voltage of the internal circuit.

6. The semiconductor device according to claim 1, wherein the diffusion preventing film has a first diffusion preventing portion and a second diffusion preventing portion, and in a planar view, the first diffusion preventing portion is nearer the fuse than the second diffusion preventing portion.

7. The semiconductor device according to claim 6, wherein the second diffusion preventing portion is electrically connected to the power supply wire.

8. The semiconductor device according to claim 6, wherein the first diffusion preventing portion is electrically connected to the semiconductor element.

9. The semiconductor device according to claim 1, wherein, in a region which overlaps the fuse in a planar view, no wire is formed at the first wiring layer.

10. The semiconductor device according to claim 1, wherein each of the first, second, third and fourth wires includes a copper film.

* * * * *